US011870242B2

(12) United States Patent
Bickel et al.

(10) Patent No.: US 11,870,242 B2
(45) Date of Patent: Jan. 9, 2024

(54) SUPPLEMENTAL TECHNIQUES FOR CHARACTERIZING POWER QUALITY EVENTS IN AN ELECTRICAL SYSTEM

(71) Applicant: Schneider Electric USA, Inc., Andover, MA (US)

(72) Inventors: Jon A. Bickel, Murfreesboro, TN (US); Theresa K. Wall, Murfreesboro, TN (US)

(73) Assignee: Schneider Electric USA, Inc., Andover, MA (US)

( * ) Notice: Subject to any disclaimer, the term of this patent is extended or adjusted under 35 U.S.C. 154(b) by 0 days.

(21) Appl. No.: 17/521,540

(22) Filed: Nov. 8, 2021

(65) Prior Publication Data
US 2022/0069578 A1 Mar. 3, 2022

Related U.S. Application Data

(63) Continuation of application No. 16/233,241, filed on Dec. 27, 2018, now Pat. No. 11,211,792.
(Continued)

(51) Int. Cl.
*H02H 7/26* (2006.01)
*H02J 3/00* (2006.01)
(Continued)

(52) U.S. Cl.
CPC .......... *H02H 7/261* (2013.01); *G01R 31/086* (2013.01); *H02J 3/001* (2020.01); *H02J 3/0073* (2020.01);
(Continued)

(58) Field of Classification Search
CPC .......... H02H 7/261; H02H 3/006; H02H 7/26; H02H 1/0061; H02H 3/207; G01R 31/086;
(Continued)

(56) References Cited

U.S. PATENT DOCUMENTS 8,706,650 B2 * 4/2014 Ozog ..................... H02J 3/008
705/400
2007/0055889 A1 3/2007 Henneberry
(Continued)

FOREIGN PATENT DOCUMENTS

CN 102435868 A 5/2012
CN 103487682 A 1/2014
(Continued)

OTHER PUBLICATIONS

Chinese Office Action dated Dec. 17, 2021 for Chinese Patent Application No. 201910609851.9, 9 pages.
(Continued)

*Primary Examiner* — Mohammad K Islam
(74) *Attorney, Agent, or Firm* — Locke Lord LLP

(57) ABSTRACT

A method for characterizing power quality events in an electrical system includes deriving electrical measurement data for at least one first virtual meter in an electrical system from (a) electrical measurement data from or derived from energy-related signals captured by at least one first IED in the electrical system, and (b) electrical measurement data from or derived from energy-related signals captured by at least one second IED in the electrical system. In embodiments, the at least one first IED is installed at a first metering point in the electrical system, the at least one second IED is installed at a second metering point in the electrical system, and the at least one first virtual meter is derived or located at a third metering point in the electrical system. The derived electrical measurement data may be used to generate or update a dynamic tolerance curve associated with the third metering point.

26 Claims, 58 Drawing Sheets

Related U.S. Application Data

(60) Provisional application No. 62/770,732, filed on Nov. 21, 2018, provisional application No. 62/770,741, filed on Nov. 21, 2018, provisional application No. 62/770,730, filed on Nov. 21, 2018, provisional application No. 62/770,737, filed on Nov. 21, 2018, provisional application No. 62/694,791, filed on Jul. 6, 2018.

(51) Int. Cl.
*G01R 31/08* (2020.01)
*H02J 13/00* (2006.01)
*H02J 3/24* (2006.01)

(52) U.S. Cl.
CPC .......... *H02J 3/24* (2013.01); *H02J 13/00001* (2020.01); *H02J 13/00002* (2020.01); *H02J 13/00007* (2020.01); *H02J 13/00022* (2020.01); *H02J 13/00028* (2020.01); *H02J 2203/20* (2020.01)

(58) Field of Classification Search
CPC .. G01R 19/2513; G01R 21/133; G01R 31/00; H02J 3/001; H02J 3/0073; H02J 3/24; H02J 13/00001; H02J 13/00002; H02J 13/00007; H02J 13/00022; H02J 13/00028; H02J 2203/20; Y02E 60/00; Y02P 80/10; Y04S 10/18; Y04S 10/20; Y04S 10/30; Y04S 40/121; Y04S 40/126
See application file for complete search history.

(56) References Cited

U.S. PATENT DOCUMENTS

| | | | |
|---|---|---|---|
| 2010/0042372 A1 | 2/2010 | Carter et al. | |
| 2010/0094473 A1 | 4/2010 | Anderson et al. | |
| 2011/0004324 A1 | 1/2011 | Bickel et al. | |
| 2011/0032650 A1* | 2/2011 | Hwan | H02H 3/066 505/850 |
| 2013/0169309 A1* | 7/2013 | Bickel | H02J 3/241 324/764.01 |
| 2015/0331063 A1* | 11/2015 | Ji | G01R 31/08 702/58 |
| 2015/0331984 A1* | 11/2015 | Mellteg | G06F 30/36 716/132 |
| 2018/0095123 A1* | 4/2018 | Biswas | H02J 13/00002 |

FOREIGN PATENT DOCUMENTS

| | | | |
|---|---|---|---|
| CN | 105572512 A | 5/2016 | |
| CN | 107394773 A | 11/2017 | |
| CN | 108181527 A | 6/2018 | |
| EP | 3301786 A1 | 4/2018 | |

OTHER PUBLICATIONS

Indian Patent Office First Examination Report dated Jun. 7, 2022 for corresponding Indian Patent Application No. 201914026622, 6 pages.

Intent to Grant for European Patent Application No. 19184371.3 dated Nov. 20, 2020, 186 pages.

Extended European Search Report for European Patent Application No. 19184371.3 dated Feb. 5, 2020, 12 pages.

English language machine translation of Chinese Patent Application Publication No. CN103487682A published on Jan. 1, 2014, 14 pages.

English language machine translation of Chinese Patent Application Publication No. CN105572512A published on May 11, 2016, 11 pages.

Extended European Search Report dated Apr. 29, 2021 for European Patent Application No. 21162108.1-1202, 9 pages.

Australian Examination Report dated Jan. 16, 2023 for corresponding Australian Patent Application No. 2022200274, 4 pages.

\* cited by examiner

SUPPLEMENTAL TECHNIQUES FOR CHARACTERIZING POWER QUALITY EVENTS IN AN ELECTRICAL SYSTEM

CROSS REFERENCE TO RELATED APPLICATIONS

This application is a continuation of U.S. patent application Ser. No. 16/233,241, filed on Dec. 27, 2018, which claims the benefit of and priority to U.S. Provisional Application No. 62/694,791, filed on Jul. 6, 2018; U.S. Provisional Application No. 62/770,730, filed on Nov. 21, 2018; U.S. Provisional Application No. 62/770,732, filed on Nov. 21, 2018; U.S. Provisional Application No. 62/770,737, filed on Nov. 21, 2018; and U.S. Provisional Application No. 62/770,741, filed on Nov. 21, 2018, which applications were filed under 35 U.S.C. § 119(e). The foregoing applications are incorporated by reference herein in their entirety.

FIELD

This disclosure relates generally to power quality issues, and more particularly, to systems and techniques for characterizing power quality issues or events in an electrical system.

BACKGROUND

As is known, power quality issues are one of the most significant and costly impacts on electrical systems (also sometimes referred to as "electrical networks"). Poor power quality is estimated to cost the European economy up to €150 billion annually, according to the Leonardo Power Quality Initiative.[1] Additionally, the U.S. economy experiences losses ranging from $119 billion to $188 billion annually, according to research by the Electric Power Research Institute (EPRI).[2] Perhaps the most important statistic is the EPRI finding that 80 percent of power-quality disturbances are generated within a facility. One exemplary economic model summarizes the total cost associated with power quality events as follows:

Total losses=production losses+restart losses+product/material losses+equipment losses+third-party costs+other miscellaneous costs[3]

[1] https://adfpowertuning.com/en/about-us/news-stories/148-leonardo-energy-qpan-european-power-quality-surveyq-shows-g150bn-annually-in-cost-for-low-power-quality.html
[2] https://blog.schneider-electric.com/power-management-metering-monitoring-power-quality/2015/10/16/why-poor-power-quality-costs-billions-annually-and-what-can-be-done-about-it/
[3] The Cost of Poor Power Quality, Roman Targosz and David Chapman, October 2015, ECI Publication No. Cu0145

Other miscellaneous costs associated with power quality issues may include intangible losses such as a damaged reputation with customers and suppliers or more direct losses such as the devaluation of credit ratings and stock prices.

SUMMARY

Described herein are systems and methods related to characterizing (e.g., quantifying) power quality issues or events in an electrical system. The electrical system may be associated with at least one load, process, building, facility, watercraft, aircraft, or other type of structure, for example. In one aspect of this disclosure, a method for characterizing power quality events in an electrical system includes processing electrical measurement data from or derived from energy-related signals captured by at least one first IED in the electrical system to generate or update a first dynamic tolerance curve associated with a first metering point in the electrical system. In embodiments, the at least one first IED is installed at the first metering point (which is sometimes referred to herein as a "first point of installation").

The method also includes processing electrical measurement data from or derived from energy-related signals captured by at least one second IED in the electrical system to generate or update a second dynamic tolerance curve associated with a second metering point in the electrical system. In embodiments, the at least one second IED is installed at the second metering point (which is sometimes referred to herein as a "second point of installation").

The method further includes deriving electrical measurement data for at least one first virtual meter in the electrical system from (a) the electrical measurement data from or derived from the energy-related signals captured by the at least one first IED, and (b) the electrical measurement data from or derived from the energy-related signals captured by the at least one second IED. In embodiments, the at least one first virtual meter is installed or located at a third metering point in the electrical system (which is sometimes referred to herein as a "third point of installation"). In embodiments, the third metering point (e.g., a virtual metering point) is different from both the first metering point (e.g., a physical metering point) and the second metering point (e.g., a physical metering point).

The derived electrical measurement data is used to generate or update a third dynamic tolerance curve associated with the third metering point.

In some embodiments, the method may be implemented using at least one IED coupled to the electrical system, for example, the at least one first IED and/or the at least one second IED. Additionally, in some embodiments the method may be implemented remote from the at least one IED, for example, in a gateway, a cloud-based system, on-site software, a remote server, etc. (which may alternatively be referred to as a "head-end" system herein). In some embodiments, the at least one IED may be coupled to measure electrical signals, receive electrical measurement data from the electrical signals at an input, and configured to generate at least one or more outputs. The outputs may be used to characterize power quality issues or events in an electrical system. Examples of the at least one IED may include a smart utility meter, a power quality meter, and/or another metering device (or devices). The at least one IED may include breakers, relays, power quality correction devices, uninterruptible power supplies (UPSs), filters, and/or variable speed drives (VSDs), for example. Additionally, the at least one IED may include a virtual meter in some embodiments. In embodiments, the at least one IED may also incorporate analog and/or digital I/O capabilities from equipment directly or indirectly connected to the electrical system. For example, ambient temperature readings (e.g., ° F., ° C.) from outside a facility and connected to the at least one IED would be considered as an analog input connected to the electrical system. Additionally, a breaker status (e.g., off/on, open/closed) derived from a breaker located inside switchgear within the facility and brought into the at least one IED would be considered as a digital input connected to the electrical system.

In embodiments, the above method is generally applicable to non-periodic power quality issues or events such as transients, short-duration rms variations (e.g., sags, swells, momentary interruptions, temporary interruptions, etc.), and some long-duration rms variations (e.g., that may be as long as about 1-5 minute(s)).

Examples of electrical measurement data that may be captured by the at least one first IED and/or be captured by the at least one second IED may include at least one of continuously measured voltage and current signals and their derived parameters and characteristics. Electrical parameters and events may be derived, for example, from analyzing energy-related signals (e.g., real power, reactive power, apparent power, harmonic distortion, phase imbalance, frequency, voltage/current transients, voltage sags, voltage swells, etc.). More particularly, the at least one first IED and/or the at least one second IED may evaluate a power quality event's magnitude, duration, load impact, recovery time from impact, unproductive recovery energy consumed, $CO2$ emissions from recovery energy, costs associated with the event, and so forth.

It is understood there are types of power quality events and there are certain characteristics of these types of power quality events, as described further hereinafter in connection with the table from IEEE Standard 1159-2009 (known art) provided below and the paragraph that immediately precedes that table, for example. A voltage sag is one example type of power quality event. The characteristics of voltage sag events are the magnitude of the voltage sag and its duration, for example. Systems and methods according to the disclosure may evaluate and adjust voltage event alarms based on the affect (or impact) of voltage sag events (and other events) on the electrical system. In embodiments, voltage event alarm thresholds are adjusted based on the voltage sag's magnitude and duration. In some embodiments, an anomalous voltage condition (i.e., voltage perturbation) is indicative of a power quality event (e.g., a voltage sag). As used herein, examples of power quality events may include voltage and/or current events on phase conductors, neutral conductors, and/or ground paths. As illustrated in FIG. 3, for example, as will be described further below, is some embodiments there will be multiple alarm thresholds, for example, depending on the duration of an event. Additionally, there may be a threshold "above the nominal" (e.g., transients, swells, overvoltages), and a threshold "below the nominal" (e.g., sags, interruptions, undervoltages).

The above method, and the other methods (and systems) described below, may include one or more of the following features either individually or in combination with other features in some embodiments. In some embodiments, the at least one first virtual meter consists of (or incudes) one or more unmetered branch circuits. In some embodiments, processing electrical measurement data from or derived from energy-related signals captured by at least one first IED in the electrical system to generate or update a first dynamic tolerance curve associated with a first metering point in the electrical system, includes: processing the electrical measurement data from or derived from the energy-related signals captured by the at least one first IED in the electrical system to identify a power quality event at the first metering point, and to determine an impact of the identified power quality event at the first metering point. The identified power quality event and the determined impact of the identified power quality at the first metering point may be used to generate or update the first dynamic tolerance curve associated with the first metering point. In some embodiments, the first dynamic tolerance curve characterizes at least an impact of power quality events on the first metering point. In some embodiments, the at least one first IED is configured to monitor one or more loads in the electrical system, and the first dynamic tolerance curve further characterizes a response of the one or more loads to the power quality events.

In some embodiments, processing electrical measurement data from or derived from energy-related signals captured by at least one first IED in the electrical system to generate or update a first dynamic tolerance curve associated with a first metering point in the electrical system, includes: processing the electrical measurement data from or derived from the energy-related signals captured by the at least one first IED in the electrical system to identify a power quality event at the first metering point, and to determine a time of occurrence of the identified power quality event at the first metering point. In some embodiments, processing electrical measurement data from or derived from energy-related signals captured by at least one second IED in the electrical system to generate or update a second dynamic tolerance curve associated with a second metering point in the electrical system, includes: determining an impact of the identified power quality event at the second metering point based on an evaluation of the electrical measurement data from or derived from the energy-related signals captured by the at least one second IED proximate to the determined time of occurrence of the power quality event at the first metering point. The identified power quality event and the determined impact of the identified power quality at the second metering point may be used to generate or update the second dynamic tolerance curve associated with the second metering point. In some embodiments, the second dynamic tolerance curve characterizes at least an impact of power quality events on the second metering point.

In some embodiments, the at least one second IED is not configured to capture the power quality event, or the at least one second IED is incapable of capturing the power quality event. In some embodiments, the at least one second IED is configured to monitor one or more loads in the electrical system, and the second dynamic tolerance curve further characterizes a response of the one or more loads to the power quality events.

In some embodiments, each of the loads monitored by the at least one first IED and/or the at least one second IED has a rated voltage and recommended operational range, for example, as shown in FIGS. 49 and 50. The rated voltage corresponds to a desired voltage magnitude/level for optimal load operation. Additionally, the recommended operational range is the area above and below the rated voltage where the loads may still operate continuously, although not necessarily optimally. In some embodiments, the upper and lower alarm thresholds may be configured inside (or within) the recommended operational range of the loads to ensure the loads retain their operational integrity and are not overly stressed, and to ensure the end-user knows if/when they are getting close to the recommended operational boundaries. In other embodiments, the upper and the lower alarm thresholds align with the recommended operational range of the loads so that excursions beyond the recommended operational range may be measured, captured and stored (e.g., on a memory device associated with the IEDs or electrical system). Additional aspects of rated voltages and recommended operational ranges of loads, and their relationship to the upper and lower alarm thresholds, are described further in connection with FIGS. 49 and 50, for example.

In some embodiments, at least the determined time of occurrence of the identified power quality event at the first metering point is communicated from the at least one first IED to at least one of: a cloud-based system, on-site software, a gateway, and another head-end system. In some embodiments, the impact of the identified power quality event at the second metering point is determined on the at least one of: the cloud-based system, the on-site software, the gateway, and the other head-end system. In some embodiments, communicating the determined time of occurrence from the at least one first IED to the at least one of: the cloud-based system, the on-site software, the gateway, and the other head-end system, includes: producing at least one of a timestamp, alarm, and a trigger indicative of the determined time of occurrence on the at least one first IED; and communicating the at least one of the timestamp, the alarm, and the trigger to the at least one of: the cloud-based system, the on-site software, the gateway, and the other head-end system.

In some embodiments, identifying the power quality event includes identifying at least one of a power quality event type of the at least one power quality event. The identified power quality event type may include, for example, one of a voltage sag, a voltage swell, a voltage transient, an instantaneous interruption, a momentary interruption, a temporary interruption, and a long-duration root-mean-square (rms) variation.

In some embodiments, deriving electrical measurement data for at least one first virtual meter in the electrical system from (a) the electrical measurement data from or derived from the energy-related signals captured by the at least one first IED, and (b) the electrical measurement data from or derived from the energy-related signals captured by the at least one second IED, includes: deriving the electrical measurement data for the at least one first virtual meter in the electrical system based on a known location of the at least one first virtual meter with respect to the at least one first IED and the at least one second IED.

In another aspect of this disclosure, a method for characterizing an impact of a power quality event on an electric system, includes processing electrical measurement data from or derived from energy-related signals captured by at least one metering device to identify a power quality event associated with at least one load monitored by the at least one metering device. In embodiments, the at least one metering device and the at least one load are installed at respective locations in the electrical system. The method also includes determining if the identified power quality event has an impact on the at least one load or on the electrical system. In response to determining that the identified power quality event has an impact on the at least one load or on the electrical system, a recovery time for the at least one load or the electrical system to recover from the identified power quality event may be determined, and electrical measurement data from or derived from energy-related signals captured by the at least one metering device during the recovery period may be tagged (or otherwise indicated) as atypical/abnormal/event-related based on the determined recovery time. In some embodiments, the at least one metering device includes at least one of an IED and a virtual meter.

In some embodiments, if there is an impact due to an event, the recovery time data may be tagged as atypical/abnormal/event-related. Some or all data from other devices (excluding the at least one metering device) may also be tagged as atypical/abnormal/event-related based on the recovery period of the at least one metering device. This tagging may occur in the cloud-based system, on-site software, gateway, or other head-end system. Moreover, time periods considered to be atypical due to an impactful event may be communicated to any discrete metering device so that the discrete metering device may tag its data accordingly. It is understood that in some embodiments the recovery time may be determined and tracked in real-time (or in semi-real time).

In some embodiments, the energy-related signals captured by the at least one metering device include at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages. In embodiments, the energy-related parameters may include (or leverage) substantially any electrical parameter derived from the voltage and current signals (including the voltages and currents themselves).

In some embodiments, in response to determining that the identified power quality event has an impact on the at least one load or on the electrical system, one or more parameters and/or metrics associated with the electrical measurement data may be compared against local utility rate structures to calculate a total energy-related costs of the identified power quality event, and to identify opportunities for reducing the total energy-related costs.

In some embodiments, an economic impact of the identified power quality event may be determined based, at least in part, on one or more parameters and/or metrics associated with the determined recovery time or period.

As used herein, a load loss (sometimes also referred to as a "loss of load") is the unexpected, unplanned and/or unintentional removal of one or more loads from the electrical system. In this application, a voltage perturbation or event, and the subsequent load loss, is likely a result of one or more external influences on the electrical system (e.g., a fault, etc.), or the normal or abnormal operation of loads, protective devices, mitigation devices, and/or other equipment intentionally connected to the electrical system. Load losses may be indicated by measured parameters such as voltage, current, power, energy, harmonic distortion, imbalance, etc., or they may be indicated by discrete (digital) and/or analog input-output (I/O) signals originating from equipment directly and/or indirectly connected to the electrical system. For example, breakers often provide an output indication on their present position (e.g., open/closed, off/on, etc.) to communicate their operational status.

In a further aspect of this disclosure, a method for reducing recovery time/recovery period from a power quality event in an electrical system includes processing electrical measurement data from or derived from energy-related signals captured by at least one IED installed in the electrical system to identify a power quality event associated with one or more portions of the electrical system. The method also includes determining at least one means for recovering from the identified power quality event, and applying a selected one of the at least one means for recovering from the identified power quality event. A response characteristic of the electrical system may be tracked in response to the selected one of the at least one means for recovering from the identified power quality event being applied. Additionally, the response characteristic of the electrical system may be evaluated to determine effectiveness of the selected one of the at least one means for recovering from the identified power quality event.

In some embodiments, tracking a response characteristic of the electrical system in response to the selected one of the at least one means for recovering from the identified power quality event being applied, includes: tracking the response characteristic of the electrical system with respect to a baseline response of the electrical system in response to the selected one of the at least one means for recovering from the identified power quality event being applied. In some embodiments, tracking the response characteristic includes identifying recurring event data and/or characteristics. In some embodiments, the identified recurring event data is used to predict power quality events in the electrical system, for example, and alternatively, projected impacts of power quality events and/or recovery times associated with the power quality events. In some embodiments, tracking the response characteristic of the electrical system with respect to a baseline response of the electrical system includes identifying, tagging and differentiating aberrant and/or atypical operational data from normal operational data for performing at least one of: calculations, metrics, analytics, and statistical evaluations. In some embodiments, the normal operational data corresponds to non-recovery data. Additionally, in some embodiments the operational data transpiring during a determined recovery period is differentiated and tagged as aberrant or atypical operational data.

In some embodiments, the IEDs and loads of the above and below described systems and methods are installed at a same respective location or metering point in the electrical system. Additionally, in some embodiments the IEDs and loads of the above and below described systems and methods are installed at different respective locations (i.e., a plurality of locations) or metering points in the electrical system. In embodiments in which the electrical system includes more than one load, for example, a specific IED may be upstream from one load in the electrical system while being downstream from another load in the electrical system.

As used herein, the terms "upstream" and "downstream" are used to refer to electrical locations within an electrical system. More particularly, the electrical locations "upstream" and "downstream" are relative to an electrical location of an IED collecting data and providing this information. For example, in an electrical system including a plurality of IEDs, one or more IEDs may be positioned (or installed) at an electrical location that is upstream relative to one or more other IEDs in the electrical system, and the one or more IEDs may be positioned (or installed) at an electrical location that is downstream relative to one or more further IEDs in the electrical system. A first IED or load that is positioned on an electrical circuit upstream from a second IED or load may, for example, be positioned electrically closer to an input or source of the electrical system (e.g., a utility feed) than the second IED or load. Conversely, a first IED or load that is positioned on an electrical circuit downstream from a second IED or load may be positioned electrically closer to an end or terminus of the electrical system than the other IED.

A first IED or load that is electrically connected in parallel (e.g., on an electrical circuit) with a second IED or load may be considered to be "electrically" upstream from said second IED or load in embodiments, and vice versa. In embodiments, algorithm(s) used for determining a direction of a power quality event (i.e., upstream or downstream) is/are located (or stored) in the IED, cloud, on-site software, gateway, etc. As one example, the IED can record an electrical event's voltage and current phase information (e.g., by sampling the respective signals) and communicatively transmit this information to a cloud-based system. The cloud-based system may then analyze the voltage and current phase information (e.g., instantaneous, root-mean-square (rms), waveforms and/or other electrical characteristic) to determine if the source of the voltage event was electrically upstream or downstream from where the IED is electrically coupled to the electrical system (or network).

In some embodiments, the electrical measurement data from energy-related signals captured by the IEDs (e.g., first and second IEDs) may be processed on one or more or the IEDs, or be processed in on-site software, in a cloud-based application, or in a gateway, etc., to characterize power quality events in the electrical system. Additionally, in some embodiments the electrical measurement data may be processed on a system for quantifying power quality events in an electrical system, for example, a control system associated with the electrical system. The control system may be used for controlling one or more parameters associated with the electrical system, for example. In embodiments, identifying the power quality event may include identifying: (a) a type of power quality event, (b) a magnitude of the anomalous power quality event, (c) a duration of the power quality event, and/or (d) a location of the power quality event in the electrical system. In embodiments, the power quality event type may include one of a voltage sag, a voltage swell, a voltage interruption, and a voltage transient. Additionally, in embodiments the location of the power quality event may be derived from voltage and current signals as measured by the IEDs and associated with the anomalous voltage condition.

As discussed above, a voltage event is one example type of power quality event. A power quality event may include at least one of a voltage sag, a voltage swell, and a voltage transient, for example. According to IEEE Standard 1159-2009, for example, a voltage sag is a decrease to between 0.1 and 0.9 per unit (pu) in rms voltage or current at the power frequency for durations of 0.5 cycle to 1 min. Typical values are 0.1 to 0.9 pu. Additionally, according to IEEE Standard 1159-2009, a voltage swell is an increase in rms voltage or current at the power frequency for durations from 0.5 cycles to 1 min. Below is a table from IEEE Standard 1159-2009 (known art), which defines various categories and characteristics of power system electromagnetic phenomena.

| Categories | | | Typical spectral content | Typical duration | Typical voltage magnitude |
|---|---|---|---|---|---|
| 1.0 Transients | | | | | |
| | 1.1 Impulsive | | | | |
| | | 1.1.1 Nanosecond | 5 ns rise | <50 ns | |
| | | 1.1.2 Microsecond | 1 μs rise | 50 ns-1 ms | |
| | | 1.1.3 Millisecond | 0.1 ms rise | >1 ms | |
| | 1.2 Oscillatory | | | | |
| | | 1.2.1 Low frequency | <5 kHz | 0.3-50 ms | 0-4 pu |
| | | 1.2.2 Medium frequency | 5-500 kHz | 20 μs | 0-8 pu |
| | | 1.2.3 High frequency | 0.5-5 MHz | 5 μs | 0-4 pu |
| 2.0 Short duration variations | | | | | |
| | 2.1 Instantaneous | | | | |
| | | 2.1.1 Sag | | 0.5-30 cycles | 0.1-0.9 pu |
| | | 2.1.2 Swell | | 0.5-30 cycles | 1.1-1.8 pu |
| | 2.2 Momentary | | | | |
| | | 2.2.1 Interruption | | 0.5 cycles-3 s | <0.1 pu |
| | | 2.2.2 Sag | | 30 cycles-3 s | 0.1-0.9 pu |
| | | 2.2.3 Swell | | 30 cycles-3 s | 1.1-1.4 pu |

-continued

| Categories | Typical spectral content | Typical duration | Typical voltage magnitude |
|---|---|---|---|
| 2.3 Temporary | | | |
|    2.3.1 Interruption | | 3 s-1 min | <0.1 pu |
|    2.3.2 Sag | | 3 s-1 min | 0.1-0.9 pu |
|    2.3.3 Swell | | 3 s-1 min | 1.1-1.2 pu |
| 3.0 Long duration variations | | | |
|    3.1 Interruption, sustained | | >1 min | 0.0 pu |
|    3.2 Undervoltages | | >1 min | 0.8-09 pu |
|    3.3 Overvoltages | | >1 min | 1.1-1.2 pu |
| 4.0 Voltage imbalance | | steady state | 0.5-2% |
| 5.0 Waveform distortion | | | |
|    5.1 DC offset | | steady state | 0-0.1% |
|    5.2 Harmonics | 0-100th H | steady state | 0-20% |
|    5.3 Interharmonics | 0-6 kHz | steady state | 0-2% |
|    5.4 Notching | | steady state | |
|    5.5 Noise | broad-band | steady state | 0-1% |
| 6.0 Voltage fluctuations | <25 Hz | intermittent | 0.1-7% |
| 7.0 Power frequency variations | | <10 s | |

It is understood that the above table is one standards body's (IEEE in this case) way of defining/characterizing power quality events. It is understood there are other standards that define power quality categories/events as well, such as the International Electrotechnical Commission (IEC), American National Standards Institute (ANSI), etc., which may have different descriptions or power quality event types, characteristics, and terminology. In embodiments, power quality events may be customized power quality events (e.g., defined by a user).

In some embodiments, the electrical measurement data processed to identify the power quality event may be continuously or semi-continuously captured by the at least one first IED, and the tolerance curve may be dynamically updated in response to power quality events detected (or identified) from the electrical measurement data. For example, the tolerance curve may initially be generated in response to power quality events identified from electrical measurement data captured at a first time, and may be updated or revised in response to (e.g., to include or incorporate) power quality events identified from electrical measurement data captured at a second time. As events are captured, the tolerance curve (also sometimes referred to herein as "a dynamic tolerance curve") may be continuously (e.g., dynamically) updated according to the unique response of the electrical system.

In some embodiments, the tolerance curve may be displayed in a graphical user interface (GUI) of at least one IED, or a GUI of a control system used for monitoring or controlling one or more parameters associated with the electrical system. In embodiments, the control system may be a meter, an IED, on-site/head-end software (i.e., a software system), a cloud-based control system, a gateway, a system in which data is routed over the Ethernet or some other communications system, etc. A warning may be displayed in the GUI of the IED, the monitoring system or the control system, for example, in response to a determined impact (or severity) of the power quality event being outside of a range or threshold (e.g., voltage event alarm threshold).

In some embodiments, the range is a predetermined range, for example, a user configured range. Additionally, in some embodiments the range is automatic, for example, using standards-based thresholds. Further, in some embodiments the range is "learned," for example, by starting with a nominal voltage and pushing out the thresholds as non-impactful events occur in the natural course of the electrical network's operation.

The GUI may be configured to display factors contributing to the power quality event. Additionally, the GUI may be configured to indicate a location of the power quality event in the electrical system. Further, the GUI may be configured to indicate how loads (or another specific system or piece of equipment in the electrical system) will respond to the power quality event. It is understood that any number of information may be displayed in the GUI. As part of this invention, any electrical parameter, impact to a parameter, I/O status input, I/O output, process impact, recovery time, time of impact, phases impacted, potentially discrete loads impacted beneath a single IED, etc. may be displayed in the GUI. FIG. 20, for example, as will be discussed further below, shows a simple example of incorporating percent load impacted with an indication of recovery time.

In embodiments, the tolerance curve displayed in the GUI does not have fixed scaling but, rather, can (and needs to) auto-scale, for example, to capture or display a plurality of power quality events. In accordance with various aspects of the disclosure, the beauty of having a dynamic tolerance curve is not being constrained to a static curve or curves (e.g., with fixed scaling). For example, referring briefly to FIG. 2 (which will be discussed further below), while the y-axis is shown as a percent of nominal in FIG. 2, it can also be shown as an absolute nominal value (e.g., 120 volts, 208 volts, 240 volts, 277 volts, 480 volts, 2400 volts, 4160 volts, 7.2 kV, 12.47 kV, etc.). In this case, auto-scaling would be required because different voltage ranges would require different scaling for the y-axis. Additionally, the x-axis may be scaled in different units (e.g., cycles, seconds, etc.) and/or may have a variable maximum terminus point (e.g., 10 seconds, 1 minute, 5 minutes, 600 cycles, 3600 cycles, 18,000 cycles, etc.). In other words, in some embodiments there is no reason for the GUI to show more than it has to.

In embodiments, a goal of the invention claimed herein is to build a customized tolerance curve for a discrete location within a customer's power system (e.g., at a given IED) based on a perceived impact to downstream loads. Additionally, in embodiments a goal of the invention claimed herein is to quantify the time it takes to recover from a power quality event. In short, aspects of the invention claimed herein are directed toward describing the impact of a power quality event, which allows a customer to understand their operational parameters and constraints, accordingly.

As used herein, an IED is a computational electronic device optimized to perform a particular function or set of functions. As discussed above, examples of IEDs include smart utility meters, power quality meters, and other metering devices. IEDs may also be imbedded in variable speed drives (VSDs), uninterruptible power supplies (UPSs), circuit breakers, relays, transformers, or any other electrical apparatus. IEDs may be used to perform monitoring and control functions in a wide variety of installations. The installations may include utility systems, industrial facilities, warehouses, office buildings or other commercial complexes, campus facilities, computing co-location centers, data centers, power distribution networks, and the like. For example, where the IED is an electrical power monitoring device, it may be coupled to (or be installed in) an electrical power distribution system and configured to sense and store data as electrical parameters representing operating characteristics (e.g., voltage, current, waveform distortion, power, etc.) of the power distribution system. These parameters and characteristics may be analyzed by a user to evaluate potential performance, reliability or power quality-related issues. The IED may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of a IED may be embodied in a computer program that is accessible by the IED.

In some embodiments, the term "IED" as used herein may refer to a hierarchy of IEDs operating in parallel and/or tandem. For example, a IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software.

The features proposed in this disclosure evaluate specific power quality events to characterize their impact on loads of an electrical system, recovery time, and other useful or interesting parameters. Its scope may include discrete metered points, network zones, and/or the aggregated electrical system in total. Novel ideas to display these concepts are also discussed, allowing the energy consumer to more efficiently and cost-effectively identify, analyze, mitigate, and manage their electrical networks.

Of the seven recognized power quality categories defined by IEEE 1159-2009, short-duration root mean square (rms) variations are generally the most disruptive and have the largest universal economic impact on energy consumers. Short-duration rms variations include voltage sags/dips, swells, instantaneous interruptions, momentary interruptions and temporary interruptions. One example study by the Electric Power Research Institute (EPRI) estimates an average of about 66 voltage sags are experienced by industrial customers each year. As the trend of industries becoming more dependent on sag-sensitive equipment has increased, so has the impact of these events.

The prevalence of voltage sags and the consequences of a growing install base of sag-sensitive equipment present many additional opportunities for electric solutions and services providers. The table below illustrates several example opportunities:

| Opportunities | Benefits |
|---|---|
| Solutions | Increased monitoring systems components |
|  | More suitable sag-immunity equipment |
|  | Targeted sag mitigation equipment |
| Services | Engineering and consulting |
|  | Remote monitoring and diagnostics |
|  | Equipment installation |

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
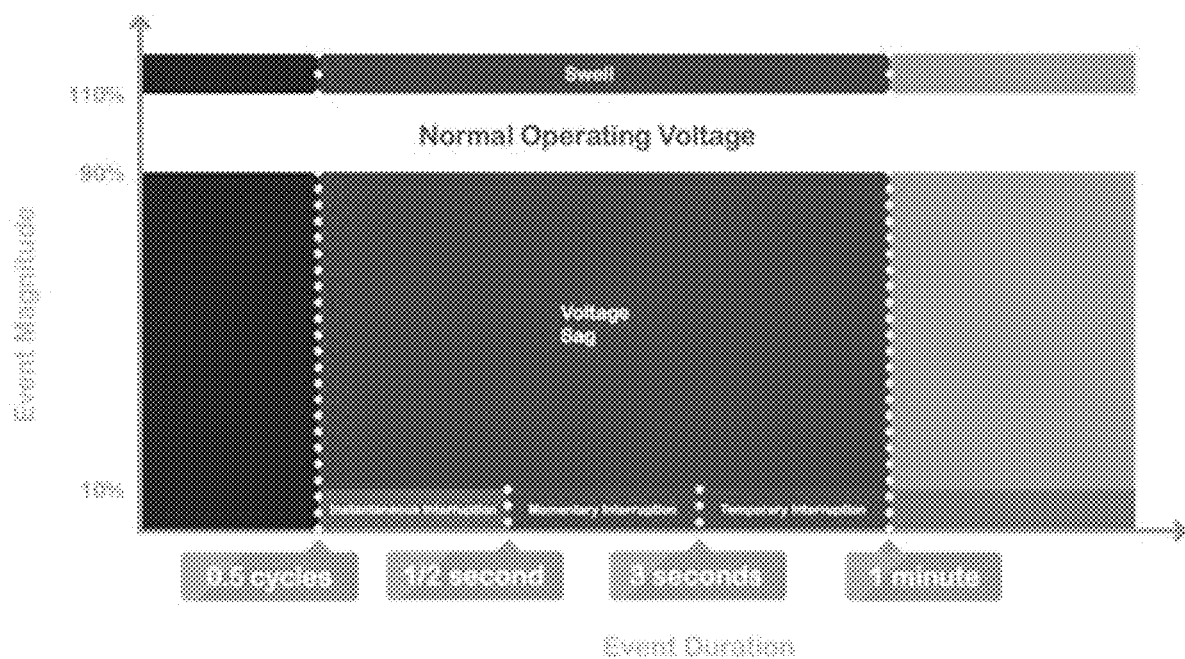
FIG. 1 shows a graphical view of several example power quality categories.

For convenience, certain introductory concepts and terms used in the specification (and adopted from IEEE Standard 1159-2009) are collected here. Several of these concepts and terms are shown in FIG. 1, for example. It is notable that FIG. 1 does not include all power quality categories such as waveform distortion, imbalance, voltage fluctuations, and power frequency deviations.

As used herein, the term "aperiodic event" is used to describe an electrical event that occurs non-cyclically, arbitrarily or without specific temporal regularity. For the sake of this paper, both short-duration root-mean-square (rms) variations and transients are considered to be aperiodic events (i.e., notching is considered as a harmonic phenomenon).

As used herein, the term "instantaneous interruption" is used to describe a deviation to 0-10% of the nominal value for a duration of ½ cycle to 30 cycles.

As used herein, the term "momentary interruption" is used to describe a deviation to 0-10% of the nominal value for a duration of 30 cycles to 3 seconds.

As used herein, the term "sag" (of which a "voltage sag" is one example) is used to describe a deviation to 10-90% of the nominal value, for example, for a duration of ½ cycle to 1 minute, as shown in FIG. 1.

As used herein, the term "short-duration rms variations" is used to describe a deviation from the nominal value with a duration of ½ cycle to 1 minute. Sub-categories of short-duration rms variations include instantaneous interruptions, momentary interruptions, temporary interruptions, sags and swells.

As used herein, the term "swell" is used to describe a deviation greater than 110% of the nominal value, for example, for a duration of ½ cycle to 1 minute, as shown in FIG. 1.

As used herein, the term "temporary interruption" is used to describe a deviation to 0-10% of the nominal value for a duration of 3 seconds to 1 minute.

As used herein, the term "transient" is used to describe a deviation from the nominal value with a duration less than 1 cycle. Sub-categories of transients include impulsive (uni-direction polarity) and oscillatory (bi-directional polarity) transients.

In embodiments, the degree of impact a short-duration rms variation has on an energy consumer's facility is primarily dependent on four factors:
1. The nature and source of the event,
2. The susceptibility of the load(s) to the event,
3. The event's influence on the process or activity, and
4. The cost sensitivity to this event.

Consequently, each customer system, operation or load may respond differently to a given electrical perturbation. For example, it is possible for a voltage sag event to significantly impact one customer's operation while the same voltage sag may have little or no noticeable impact on another customer's operation. It is also possible for a voltage sag to impact one part of a customer's electrical system differently than it does another part of the same electrical system.

Figure 1A:
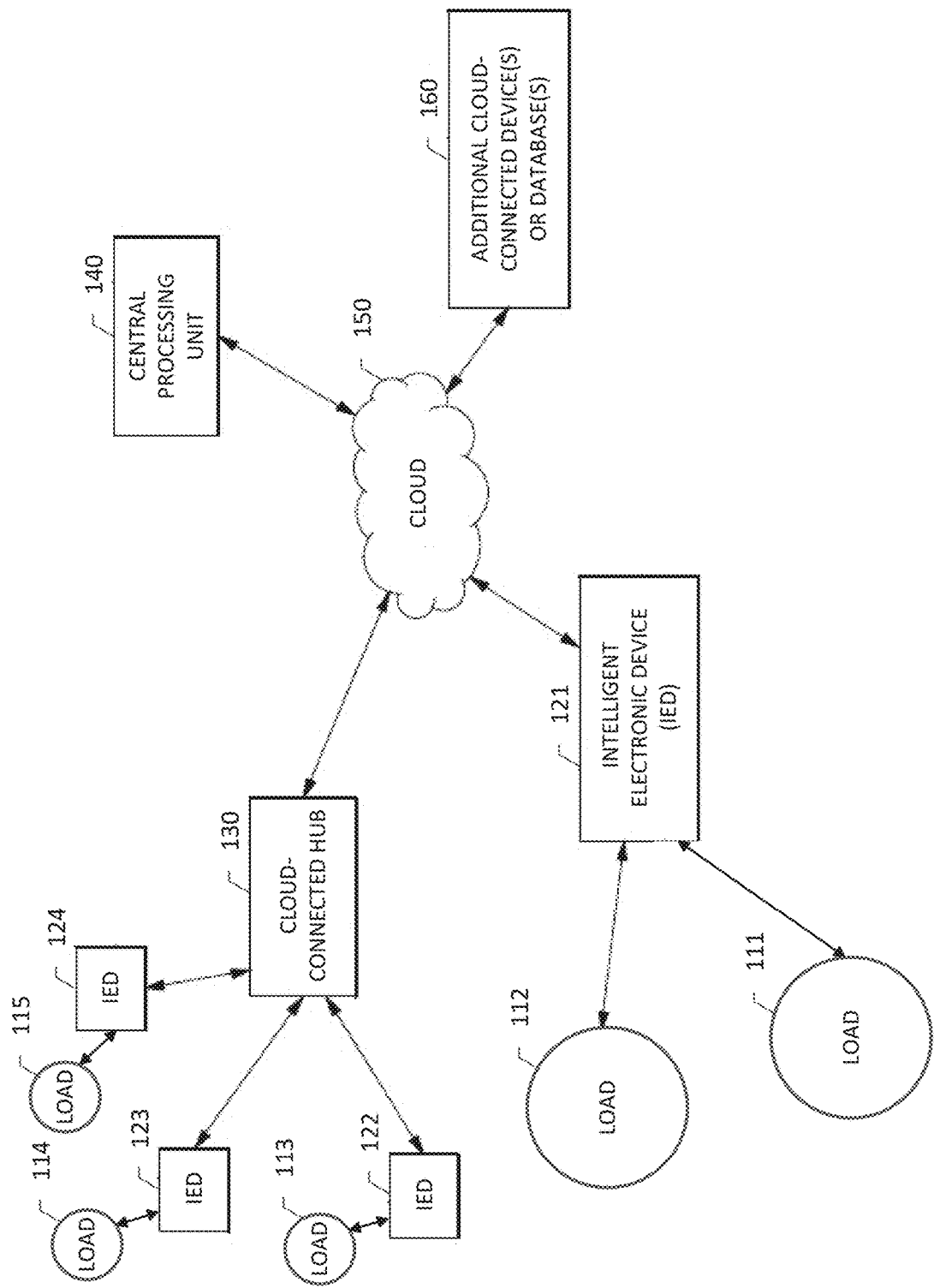
FIG. 1A shows an example electrical system in accordance with embodiments of the disclosure.

Referring to FIG. 1A, an example electrical system in accordance with embodiments of the disclosure includes one or more loads (here, loads 111, 112, 113, 114, 115) and one or more intelligent electronic devices (IEDs) (here, IEDs 121, 122, 123, 124) capable of sampling, sensing or monitoring one or more parameters (e.g., power monitoring parameters) associated with the loads. In embodiments, the loads 111, 112, 113, 114, 115 and IEDs 121, 122, 123, 124 may be installed in one or more buildings or other physical locations or they may be installed on one or more processes and/or loads within a building. The buildings may correspond, for example, to commercial, industrial or institutional buildings.

As shown in FIG. 1A, the IEDs 121, 122, 123, 124 are each coupled to one or more of the loads 111, 112, 113, 114, 115 (which may be located "upstream" or "downstream" from the IEDs in some embodiments). The loads 111, 112, 113, 114, 115 may include, for example, machinery or apparatuses associated with a particular application (e.g., an industrial application), applications, and/or process(es). The machinery may include electrical or electronic equipment, for example. The machinery may also include the controls and/or ancillary equipment associated with the equipment.

In embodiments, the IEDs 121, 122, 123, 124 may monitor and, in some embodiments, analyze parameters (e.g., energy-related parameters) associated with the loads 111, 112, 113, 114, 115 to which they are coupled. The IEDs 121, 122, 123, 124 may also be embedded within the loads 111, 112, 113, 114, 115 in some embodiments. According to various aspects, one or more of the IEDs 121, 122, 123, 124 may be configured to monitor utility feeds, including surge protective devices (SPDs), trip units, active filters, lighting, IT equipment, motors, and/or transformers, which are some examples of loads 111, 112, 113, 114, 115, and the IEDs 121, 122, 123, 124 may detect ground faults, voltage sags, voltage swells, momentary interruptions and oscillatory transients, as well as fan failure, temperature, arcing faults, phase-to-phase faults, shorted windings, blown fuses, and harmonic distortions, which are some example parameters that may be associated with the loads 111, 112, 113, 114, 115. The IEDs 121, 122, 123, 124 may also monitor devices, such as generators, including input/outputs (I/Os), protective relays, battery chargers, and sensors (for example, water, air, gas, steam, levels, accelerometers, flow rates, pressures, and so forth).

According to another aspect, the IEDs 121, 122, 123, 124 may detect overvoltage and undervoltage conditions, as well as other parameters such as temperature, including ambient temperature. According to a further aspect, the IEDs 121, 122, 123, 124 may provide indications of monitored parameters and detected conditions that can be used to control the loads 111, 112, 113, 114, 115 and other equipment in the electrical system in which the loads 111, 112, 113, 114 and IEDs 121, 122, 123, 124 are installed. A wide variety of other monitoring and/or control functions can be performed by the IEDs 121, 122, 123, 124, and the aspects and embodiments disclosed herein are not limited to IEDs 121, 122, 123, 124 operating according to the above-mentioned examples.

It is understood that the IEDs 121, 122, 123, 124 may take various forms and may each have an associated complexity (or set of functional capabilities and/or features). For example, IED 121 may correspond to a "basic" IED, IED 122 may correspond to an "intermediate" IED, and IED 123 may correspond to an "advanced" IED. In such embodiments, intermediate IED 122 may have more functionality (e.g., energy measurement features and/or capabilities) than basic IED 121, and advanced IED 123 may have more functionality and/or features than intermediate IED 122. For example, in embodiments IED 121 (e.g., an IED with basic capabilities and/or features) may be capable of monitoring instantaneous voltage, current energy, demand, power factor, averages values, maximum values, instantaneous power, and/or long-duration rms variations, and IED 123 (e.g., an IED with advanced capabilities) may be capable of monitoring additional parameters such as voltage transients, voltage fluctuations, frequency slew rates, harmonic power flows, and discrete harmonic components, all at higher sample rates, etc. It is understood that this example is for illustrative purposes only, and likewise in some embodiments an IED with basic capabilities may be capable of monitoring one or more of the above energy measurement parameters that are indicated as being associated with an IED with advanced capabilities. It is also understood that in some embodiments the IEDs 121, 122, 123, 124 each have independent functionality.

In the example embodiment shown, the IEDs 121, 122, 123, 124 are communicatively coupled to a central processing unit 140 via the "cloud" 150. In some embodiments, the IEDs 121, 122, 123, 124 may be directly communicatively coupled to the cloud 150, as IED 121 is in the illustrated embodiment. In other embodiments, the IEDs 121, 122, 123, 124 may be indirectly communicatively coupled to the cloud 150, for example, through an intermediate device, such as a cloud-connected hub 130 (or a gateway), as IEDs 122, 123, 124 are in the illustrated embodiment. The cloud-connected hub 130 (or the gateway) may, for example, provide the IEDs 122, 123, 124 with access to the cloud 150 and the central processing unit 140.

As used herein, the terms "cloud" and "cloud computing" are intended to refer to computing resources connected to the Internet or otherwise accessible to IEDs 121, 122, 123, 124 via a communication network, which may be a wired or wireless network, or a combination of both. The computing resources comprising the cloud 150 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 140 may be an example of a cloud computing system, or cloud-connected computing system. In embodiments, the central processing unit 140 may be a server located within buildings in which the loads 111, 112, 113, 114, 115, and the IEDs 121, 122, 123, 124 are installed, or may be remotely-located cloud-based service. The central processing unit 140 may include computing functional components similar to those of the IEDs 121, 122, 123, 124 is some embodiments, but may generally possess greater numbers and/or more powerful versions of components involved in data processing, such as processors, memory, storage, interconnection mechanisms, etc. The central processing unit 140 can be configured to implement a variety of analysis techniques to identify patterns in received measurement data from the IEDs 121, 122, 123, 124, as discussed further below. The various analysis techniques discussed herein further involve the execution of one or more software functions, algorithms, instructions, applications, and parameters, which are stored on one or more sources of memory communicatively coupled to the central processing unit 140. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 140 is connected to the cloud 150, it may access additional cloud-connected devices or databases 160 via the cloud 150. For example, the central processing unit 140 may access the Internet and receive information such as weather data, utility pricing data, or other data that may be useful in analyzing the measurement data received from the IEDs 121, 122, 123, 124. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the IEDs 121, 122, 123, 124 (e.g., IED makes, models, types, etc.) and data collected by the IEDs 121, 122, 123, 124 (e.g., energy usage statistics) using the user device. Additionally, in embodiments the user may configure the IEDs 121, 122, 123, 124 using the user device.

In embodiments, by leveraging the cloud-connectivity and enhanced computing resources of the central processing unit 140 relative to the IEDs 121, 122, 123, 124, sophisticated analysis can be performed on data retrieved from one or more IEDs 121, 122, 123, 124, as well as on the additional sources of data discussed above, when appropriate. This analysis can be used to dynamically control one or more parameters, processes, conditions or equipment (e.g., loads) associated with the electrical system.

In embodiments, the parameters, processes, conditions or equipment are dynamically controlled by a control system associated with the electrical system. In embodiments, the control system may correspond to or include one or more of the IEDs 121, 122, 123, 124 in the electrical system, central processing unit 140 and/or other devices within or external to the electrical system.

Figure 1B:
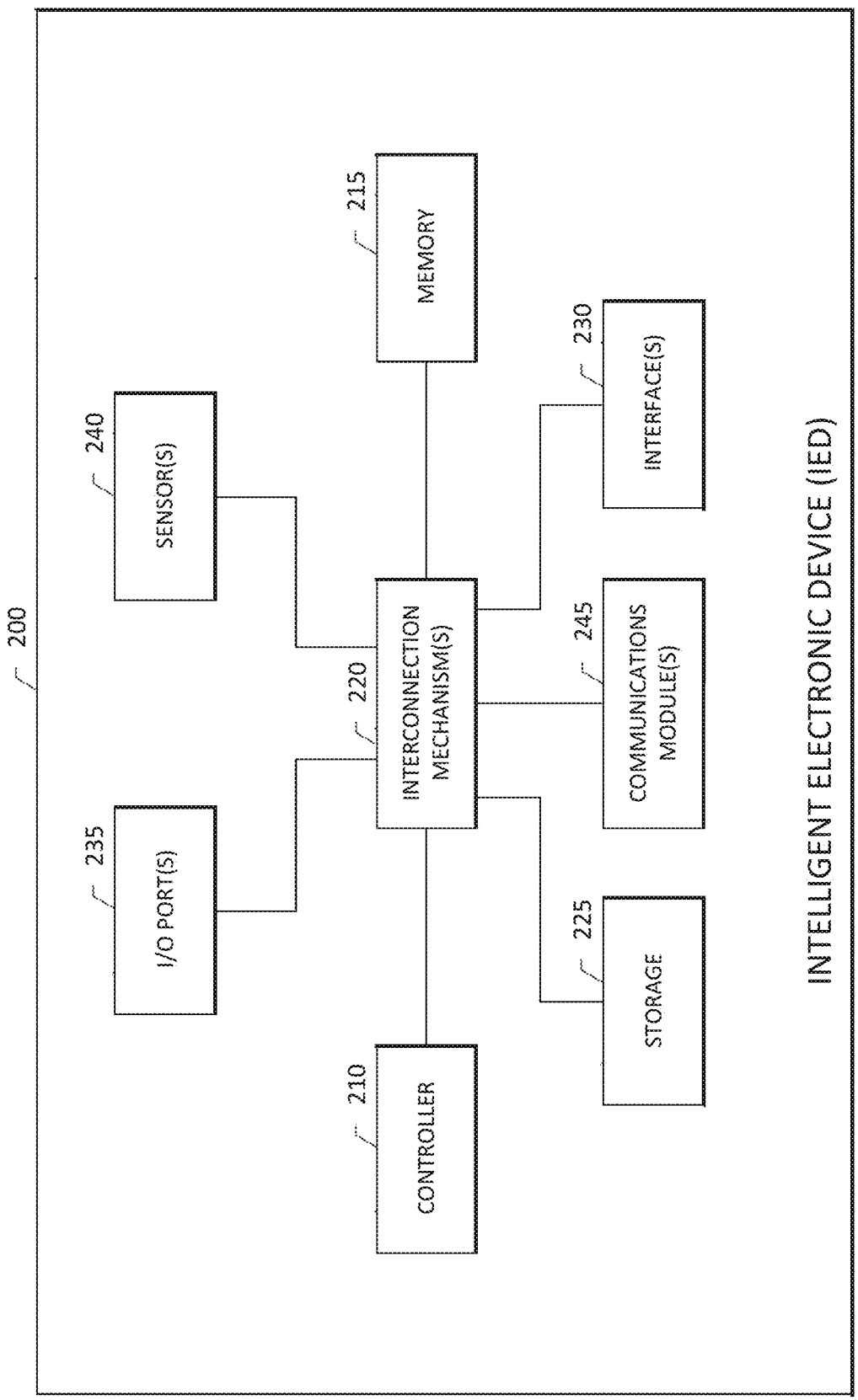
FIG. 1B shows an example intelligent electronic device (IED) that may be used in an electrical system in accordance with embodiments of the disclosure.

Referring to FIG. 1B, an example IED 200 that may be suitable for use in the electrical system shown in FIG. 1A, for example, includes a controller 210, a memory device 215, storage 225, and an interface 230. The IED 200 also includes an input-output (I/O) port 235, a sensor 240, a communication module 245, and an interconnection mechanism 220 for communicatively coupling two or more IED components 210-245.

The memory device 215 may include volatile memory, such as DRAM or SRAM, for example. The memory device 215 may store programs and data collected during operation of the IED 200. For example, in embodiments in which the IED 200 is configured to monitor or measure one or more electrical parameters associated with one or more loads (e.g., 111, shown in FIG. 1A) in an electrical system, the memory device 215 may store the monitored electrical parameters.

The storage system 225 may include a computer readable and writeable nonvolatile recording medium, such as a disk or flash memory, in which signals are stored that define a program to be executed by the controller 210 or information to be processed by the program. The controller 210 may control transfer of data between the storage system 225 and the memory device 215 in accordance with known computing and data transfer mechanisms. In embodiments, the electrical parameters monitored or measured by the IED 200 may be stored in the storage system 225.

The I/O port 235 can be used to couple loads (e.g., 111, shown in FIG. 1A) to the IED 200, and the sensor 240 can be used to monitor or measure the electrical parameters associated with the loads. The I/O port 235 can also be used to coupled external devices, such as sensor devices (e.g., temperature and/or motion sensor devices) and/or user input devices (e.g., local or remote computing devices) (not shown), to the IED 200. The I/O port 235 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the IED 200.

The communication module 245 may be configured to couple the IED 200 to one or more external communication networks or devices. These networks may be private networks within a building in which the IED 200 is installed, or public networks, such as the Internet. In embodiments, the communication module 245 may also be configured to couple the IED 200 to a cloud-connected hub (e.g., 130, shown in FIG. 1A), or to a cloud-connected central processing unit (e.g., 140, shown in FIG. 1A), associated with an electrical system including IED 200.

The IED controller 210 may include one or more processors that are configured to perform specified function(s) of the IED 200. The processor(s) can be a commercially available processor, such as the well-known Pentium™, Core™, or Atom™ class processors available from the Intel Corporation. Many other processors are available, including programmable logic controllers. The IED controller 210 can execute an operating system to define a computing platform on which application(s) associated with the IED 200 can run.

In embodiments, the electrical parameters monitored or measured by the IED 200 may be received at an input of the controller 210 as IED input data, and the controller 210 may process the measured electrical parameters to generate IED output data or signals at an output thereof. In embodiments, the IED output data or signals may correspond to an output of the IED 200. The IED output data or signals may be provided at I/O port(s) 235, for example. In embodiments, the IED output data or signals may be received by a cloud-connected central processing unit, for example, for further processing (e.g., to identify power quality events, as briefly discussed above), and/or by equipment (e.g., loads) to which the IED is coupled (e.g., for controlling one or more parameters associated with the equipment, as will be discussed further below). In one example, the IED 200 may include an interface 230 for displaying visualizations indicative of the IED output data or signals. The interface 230 may correspond to a graphical user interface (GUI) in embodiments, and the visualizations may include tolerance curves characterizing a tolerance level of the equipment to which the IED 200 is coupled, as will be described further below.

Components of the IED 200 may be coupled together by the interconnection mechanism 220, which may include one or more busses, wiring, or other electrical connection apparatus. The interconnection mechanism 220 may enable communications (e.g., data, instructions, etc.) to be exchanged between system components of the IED 200.

It is understood that IED 200 is but one of many potential configurations of IEDs in accordance with various aspects of the disclosure. For example, IEDs in accordance with embodiments of the disclosure may include more (or fewer) components than IED 200. Additionally, in embodiments one or more components of IED 200 may be combined. For example, in embodiments memory 215 and storage 225 may be combined.

Returning now to FIG. 1A, in order to accurately describe aperiodic events such as voltage sags in an electrical system (such as the electric system shown in FIG. 1A), it is important to measure the voltage signals associated with the event. Two attributes often used to characterize voltage sags and transients are magnitude (deviation from the norm) and duration (length in time) of the event. Both parameters are instrumental in defining, and thus, mitigating these types of power quality issues. Scatter plots of an event's magnitude (y-axis) versus its corresponding duration (x-axis) are typically shown in a single graph called a "Magnitude-Duration" plot, "Power Tolerance Curve", or as referred to herein, a Tolerance Curve.

Figure 2:
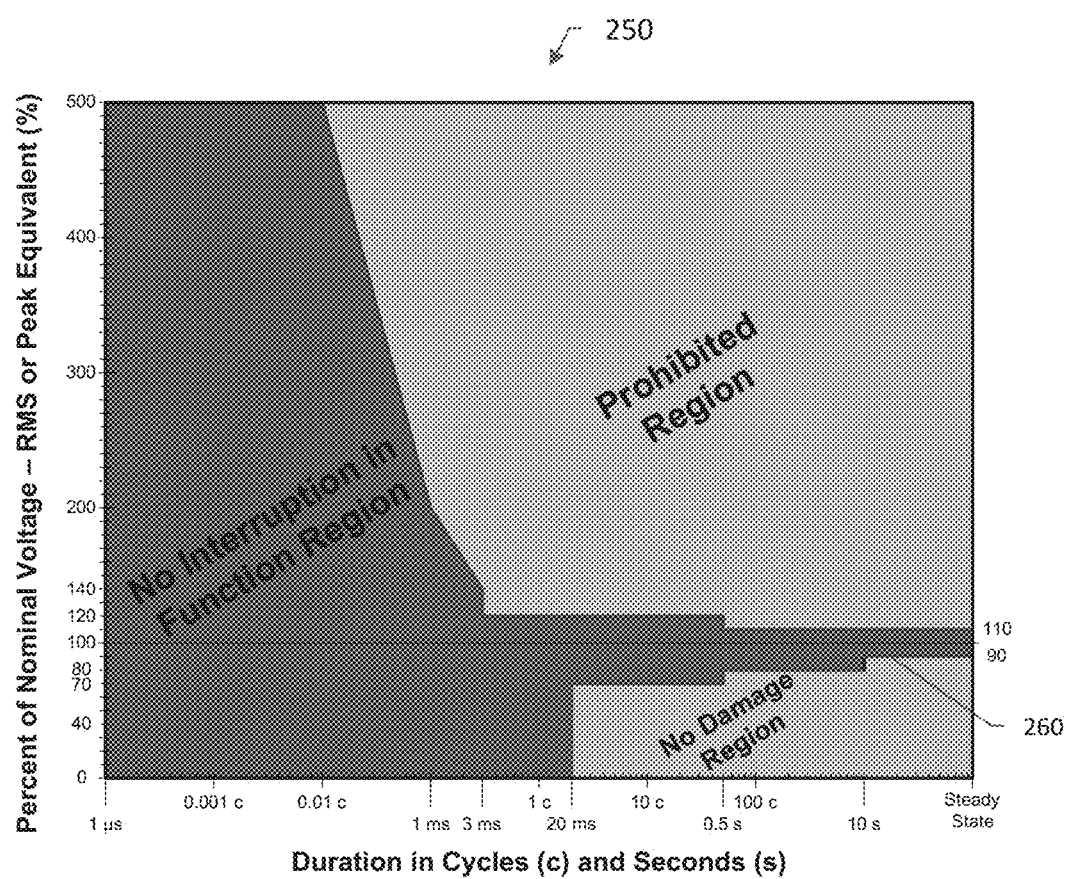
FIG. 2 shows an example Information Technology Industry (ITI) curve (also sometimes referred to as a "power acceptability curve")

FIG. 2 illustrates a well-known Magnitude-Duration plot 250: the Information Technology Industry (ITI) Curve (sometimes referred to as an ITIC or CBEMA Curve) 260. The ITIC Curve 260 shows "an AC input voltage envelope which typically can be tolerated (no interruption in function) by most Information Technology Equipment (ITE)," and is "applicable to 120V nominal voltages obtained from 120V, 208Y/120V, and 120/240V 60 Hertz systems." The "Prohibited Region" in the graph includes any surge or swell which exceeds the upper limit of the envelope. Events occurring in this region may result in damage to the ITE. The "No Damage Region" includes sags or interruptions (i.e., below the lower limit of the envelope) that are not expected to damage the ITE. Additionally, the "No Interruption in Function Region" describes the area between the blue lines where sags, swells, interruptions and transients can normally be tolerated by most ITE.

As is known, constraints of the ITIC Curve 260 include:
1. It is a static/fixed envelope/curve,
2. It is proposed for IT,
3. It is intended for 120V 60 Hz electrical systems,
4. It is a standardized/generic graph describing what "normally" should be expected,
5. It inherently provides no information regarding the consequences of an event,
6. It is solely a voltage-based graph, and does not consider any other electrical parameter(s), and
7. It is presented on a semi-log graph for multiplicative efficiency.

It is understood that prior art tolerance curves such as the ITIC/CBEMA, SEMI Curve, or other manually configured curves are often nothing more than suggestions for specific applications. They do not indicate how a specific system or piece of equipment, apparatus, load, or controls associated with the equipment, apparatus, or load will actually respond to a sag/swell event, what the event's impact will be the electrical system, or how and where to economically mitigate the issues. Furthermore, zones (sub-systems) within the electrical system are all treated the same, even though the majority of IEDs monitor multiple loads. A good analogy is a road atlas: while the atlas illustrates the location of the road, it does not indicate the location of road hazards, expected gas mileage, condition of the vehicle, construction, and so forth. A better approach is required to improve managing voltage sags and swells in electrical systems.

With the foregoing in mind, the ability to provide customized tolerance curves allows an energy consumer (and the systems and methods disclosed herein) to better manage their system through simplified investment decisions, reduced CAPEX and OPEX costs, identified and characterized issues and opportunities, improved event ride-though, and ultimately, higher productivity and profitability.

A few example factors to be considered when leveraging the benefits of providing dynamic tolerance curves for energy consumers include:
1. No two customers are exactly alike and no two metering points are identical. A dynamic tolerance curve is uniquely customized to the point at which the metering data is collected on a specific electrical system.
2. As events occur and are captured, a dynamic tolerance curve is continuously updated according the unique responses of the electrical system.
3. A dynamic tolerance curve can be applied to any type of electrical system/any type of customer; it is not limited to ITE systems.
4. A dynamic tolerance curve can also be used for substantially any voltage level; it is not limited to 120-volt systems.
5. A dynamic tolerance curve does not have fixed scaling; it can (and may need to) auto-scale.
6. It is possible to automatically aggregate dynamic tolerance curves from discrete devices into a single dynamic system tolerance curve.

With the foregoing in mind, there are a plurality of new potential features according to this disclosure that can produce numerous benefits for energy consumers. In embodiments, the goal of these features is to simplify a generally complex topic into actionable opportunities for energy consumers. Example features according to this disclosure are set forth below for consideration.

I. Dynamic Tolerance Curves

This embodiment of the disclosure comprises automatically adjusting a sag/swell tolerance curve based on load impact as measured by a discrete IED. In this embodiment, "load impact" is determined by evaluating a pre-event load against a post-event load (i.e., the load after the event's onset). The difference between the pre-event and post event loads (i.e., kW, current, energy, etc.) is used to quantify the event's impact. The measure of "impact" may be calculated as a percent value, absolute value, normalized value, or other value useful to the energy consumer. Further evaluations may include changes in voltage, current, power factor, total harmonic distortion (THD) levels, discrete harmonic component levels, total demand distortion (TDD), imbalance, or any other electrical parameter/characteristic that can provide an indication of the type (load or source), magnitude, and location of change within the electrical system. The source of data may originate from logged data, waveform data, direct MODBUS reads, or any other means.

Figure 3:
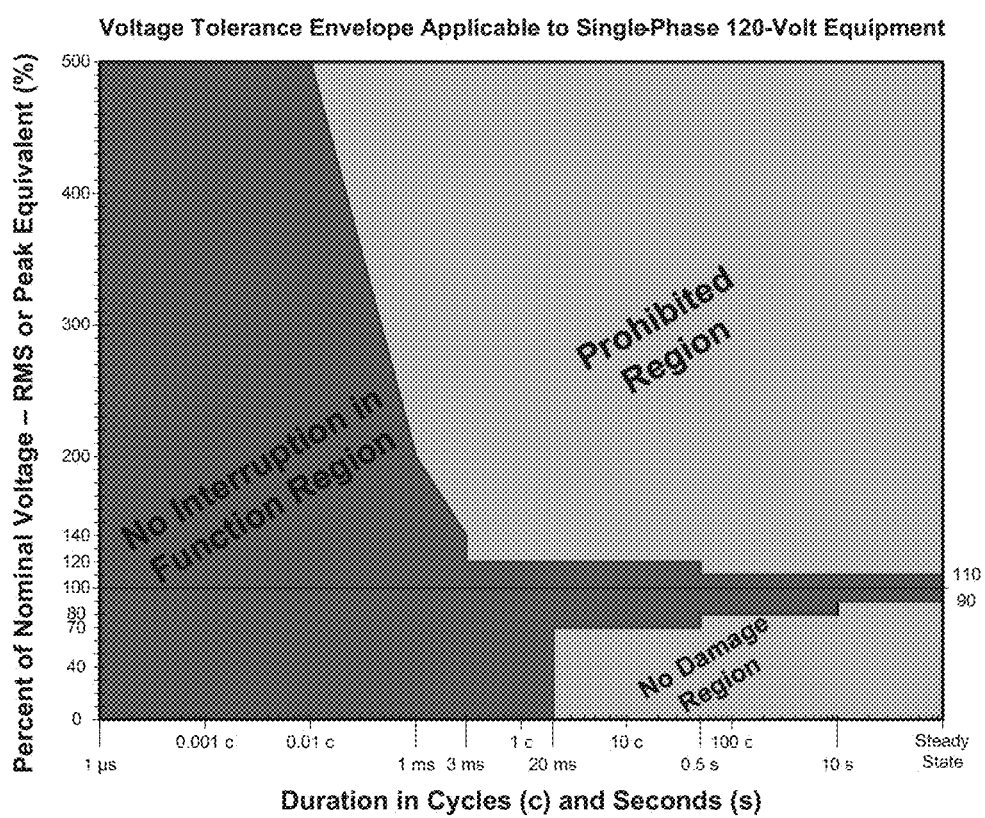
FIG. 3 shows an example baseline voltage tolerance curve which could be the ITI curve (as illustrated) or some other unique relationship between an event's voltage magnitude and duration.

FIG. 3 illustrates a typical tolerance curve (e.g., ITIC curve), which is used as a baseline (also shown in FIG. 2). It should be noted that in embodiments substantially any known uniquely described tolerance curve (e.g., SEMI F47, ANSI, CBEMA, other custom curve) may be used as the baseline tolerance curve because an intent of this embodiment of the disclosure is to dynamically customize (i.e., change, update, revise, etc.) the tolerance curve so that it reflects the unique electrical voltage event tolerance characteristics at the IED's point of installation. As more events are captured and quantified by the IED, the accuracy and characterization of the dynamic voltage tolerance curve may improve at that IED's point of installation. FIG. 3 is also shown as a semi-logarithmic graph; however, the dynamic tolerance curve may be scaled in any practical format for both analyses and/or viewing purposes.

Figure 4:
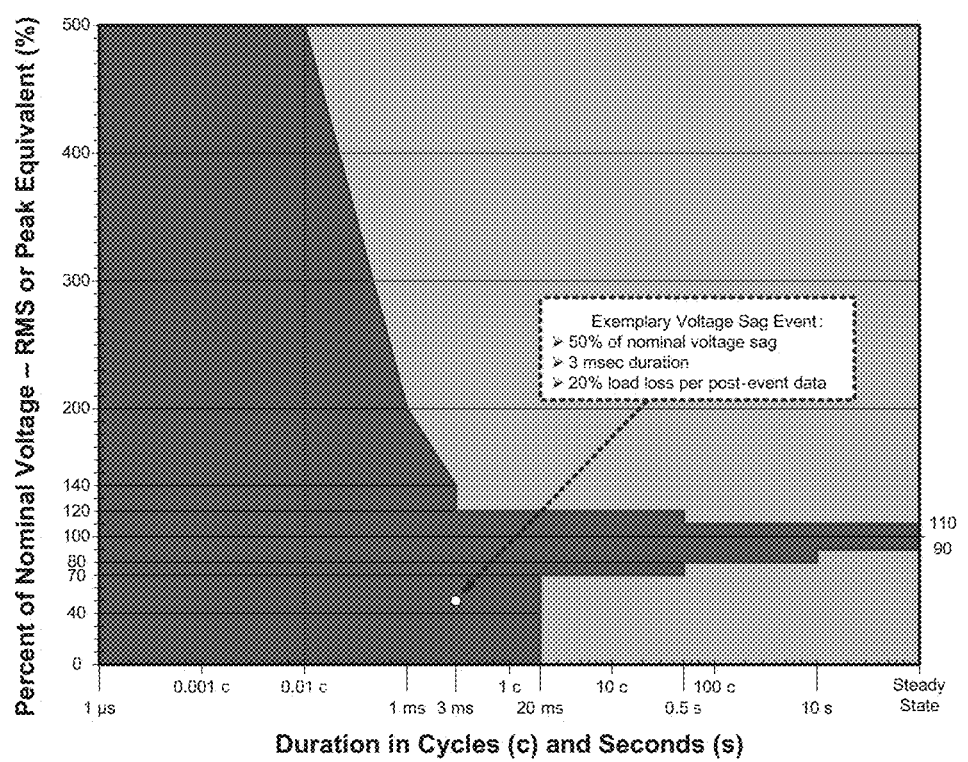
FIG. 4 shows an example voltage sag event on a baseline voltage tolerance curve.
Figure 5:
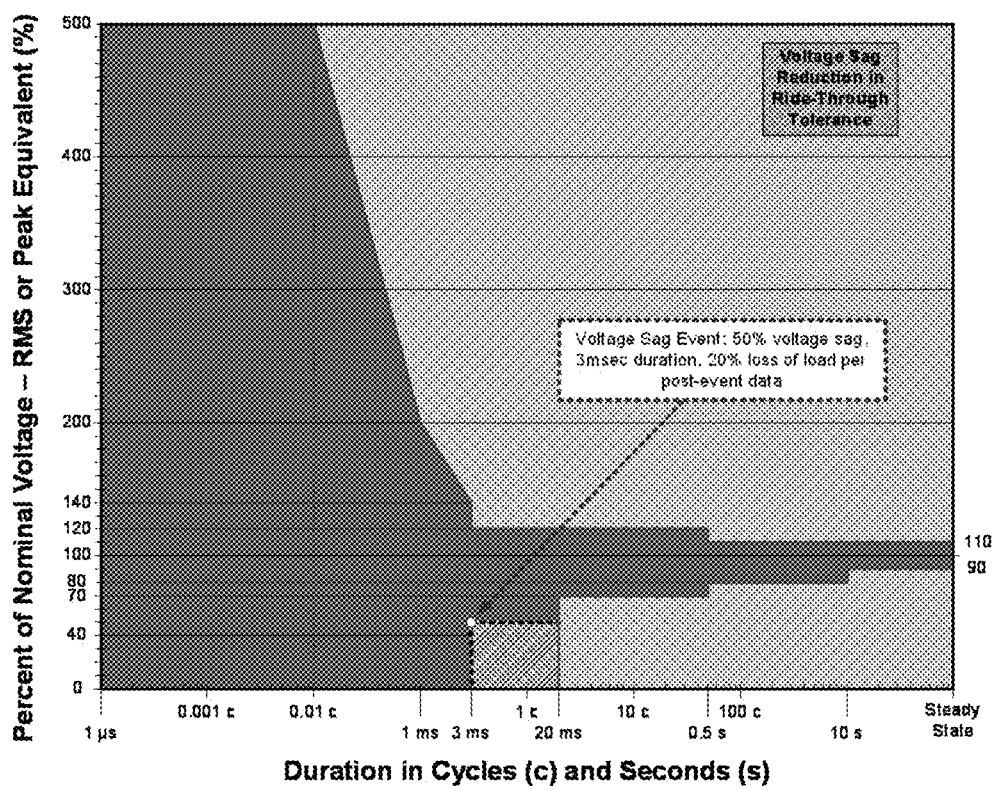
FIG. 5 shows an example recommended change to the baseline voltage tolerance curve of FIG. 3 based on an impact of the voltage sag event shown in FIG. 4.
Figure 6:
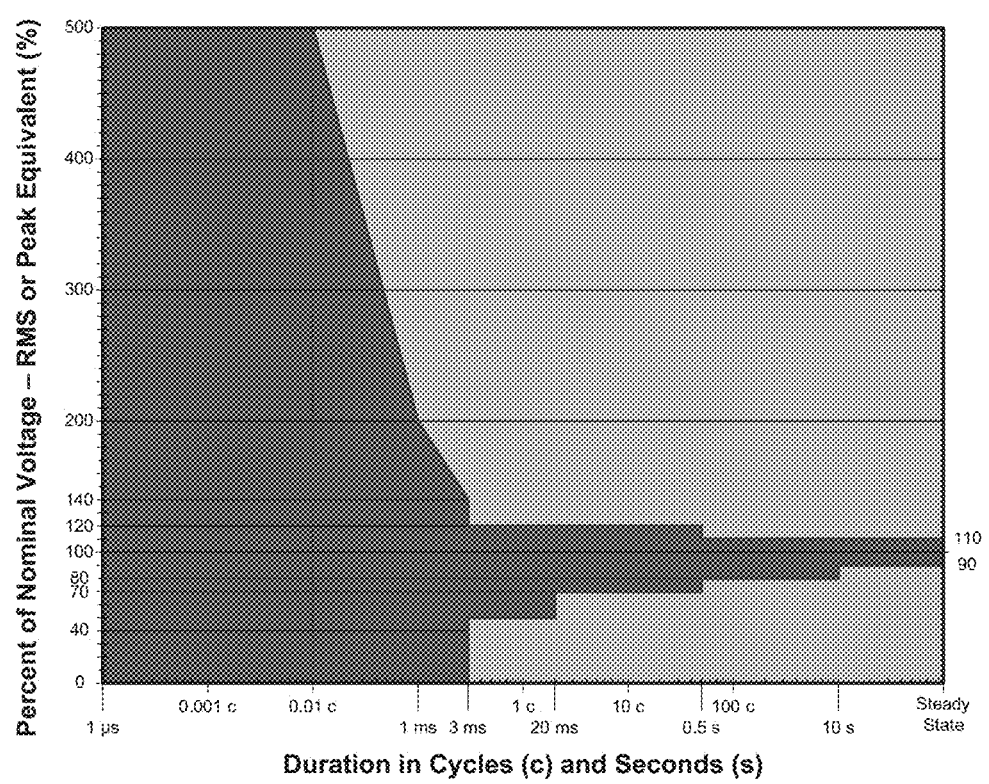
FIG. 6 shows an example dynamically customized and updated voltage tolerance curve.

FIG. 4 illustrates an example voltage sag event (50% of nominal, 3 milliseconds duration) on a standard/baseline tolerance curve that results in the loss of 20% of the load as determined by the IED. The shaded area in FIG. 5 illustrates the difference between the baseline tolerance curve (e.g., as shown in FIG. 3) and the actual tolerance of the downstream metered load(s) due to the particular sensitivity at this location in the electrical system to this degree (magnitude and duration) of voltage sag. FIG. 6 illustrates an example automatically customized and updated tolerance curve built from the event data point and determined for the point where the IED is installed on the electrical system. In embodiments, it assumes that any sag/swell/transient event with more severe characteristics (i.e., deeper voltage sag, greater voltage swells, larger transient, longer duration, etc.) will impact the load at least as severely as the event presently being considered.

Figure 7:
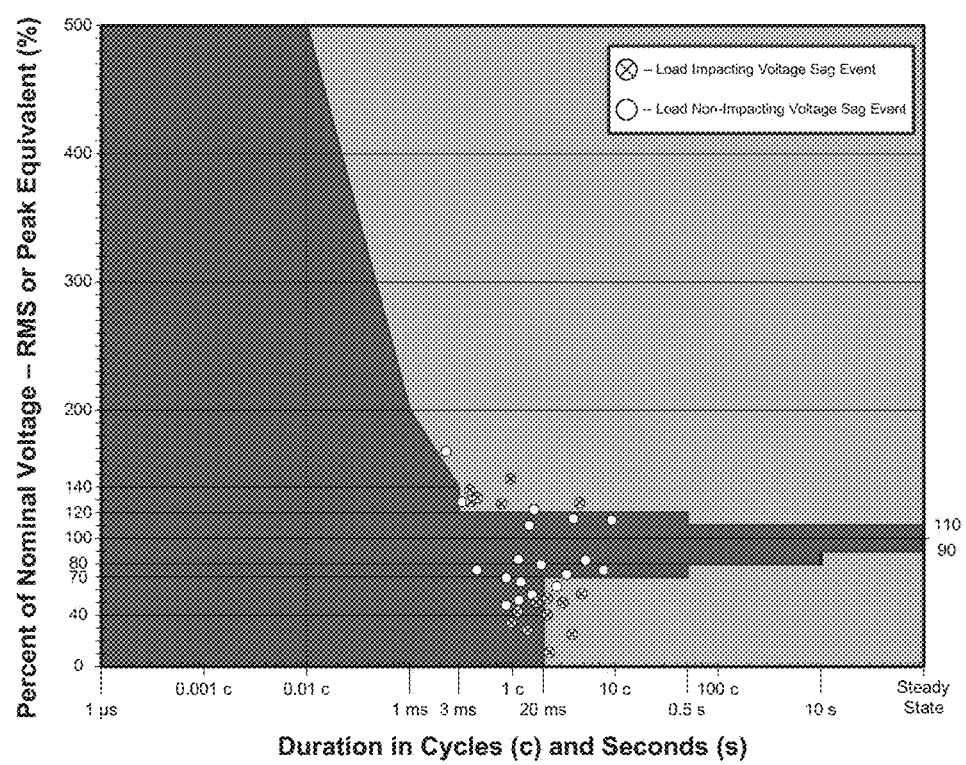
FIG. 7 shows an example of a multitude of impactful and non-impactful voltage sags, swells, and transients on a voltage tolerance curve.
Figure 8:
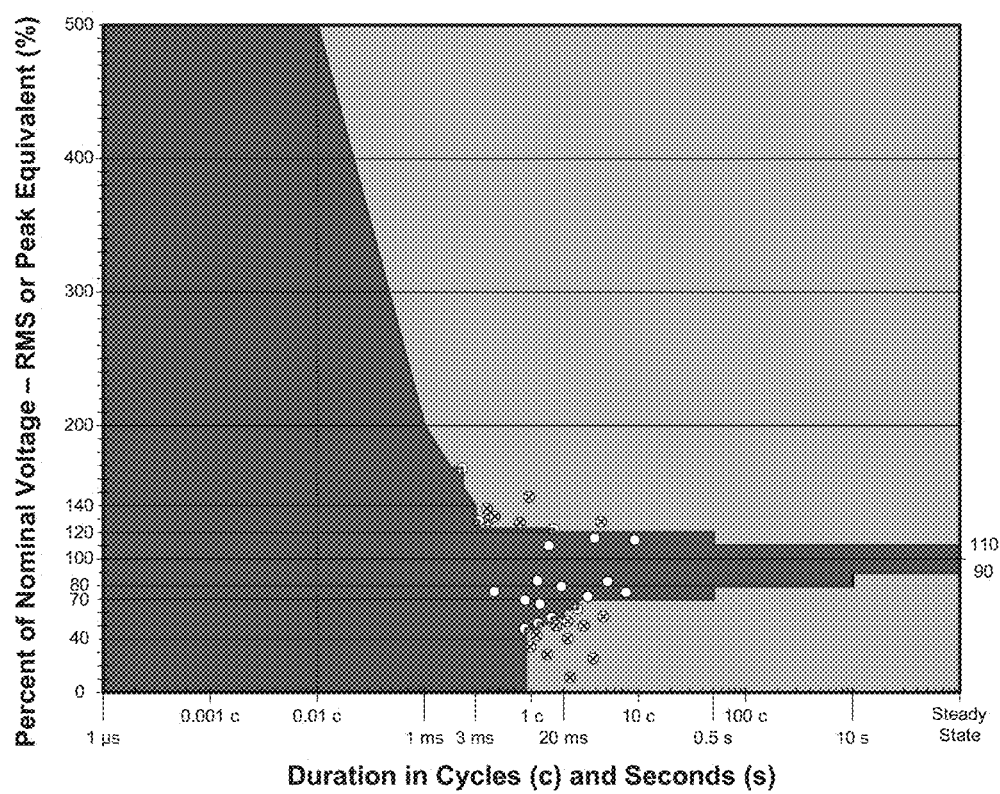
FIG. 8 shows a dynamically customized and updated voltage tolerance curve for a multitude of impactful and non-impactful events.

FIG. 7 illustrates a multitude of voltage sags/swells/transients on a standard/baseline tolerance curve. Some events are indicated as impactful and some are indicated as not impactful, based on one or more changing parameters at the moment of the event. FIG. 8 illustrates an automatically customized and updated tolerance curve for the multitude of impactful and non-impactful voltage sags/swells/transients as determined by the measured data taken from the point where the IED is installed on the electrical system.

a. Three-Dimension (3-D) Dynamic Tolerance Curves with Load Impact (Also Sometimes Referred to Herein as "Dynamic Tolerance-Impact Curves")

Standard tolerance curves (e.g., ITIC Curve, SEMI Curve, etc.) are described in two-dimensional graphs with percent of nominal voltage on the y-axis and duration (e.g., cycles, second, milliseconds, etc.) on the x-axis, for example, as shown in FIG. 7. While the y-axis is presented in units of percent of nominal voltage, it is understood that the y-axis units may also be in absolute units (e.g., real values such as voltage), or substantially any other descriptor of the y-axis parameter's magnitude. Additionally, while the x-axis is logarithmic in FIG. 7, for example, it is understood that the x-axis does not have to be logarithmic (for example, it can be linear as well). These 2-D standard tolerance curve graphs provide only a limited description of an event's characteristics (magnitude and duration); they don't provide information related to an event's impact on the load(s). While the energy consumer knows an event occurred, they cannot tell whether (and if so, to what degree) an event impacted their electrical system (and likely, their operation).

Adding a third dimension to the tolerance curve graph allows the energy consumer to visually identify the characterization of their system's sag/swell/transient tolerance (at the metering point) related to magnitude, duration, and a third parameter such as load impact. Again, load impact is determined by analyzing changes in the load (or other electrical parameter) before and after an event using logged data, waveform data, direct MODBUS read data, other data, or any combination thereof.

Figure 9:
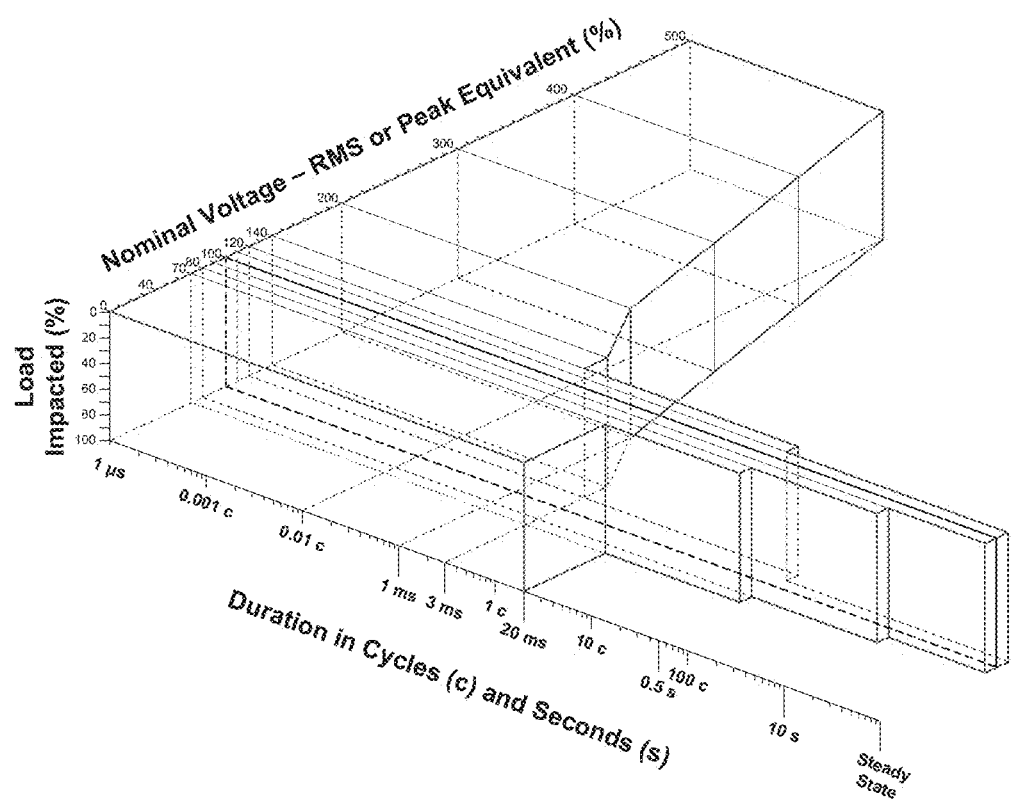
FIG. 9 shows an example three-dimensional (3-D) tolerance-impact curve with load(s) impact.
Figure 10:
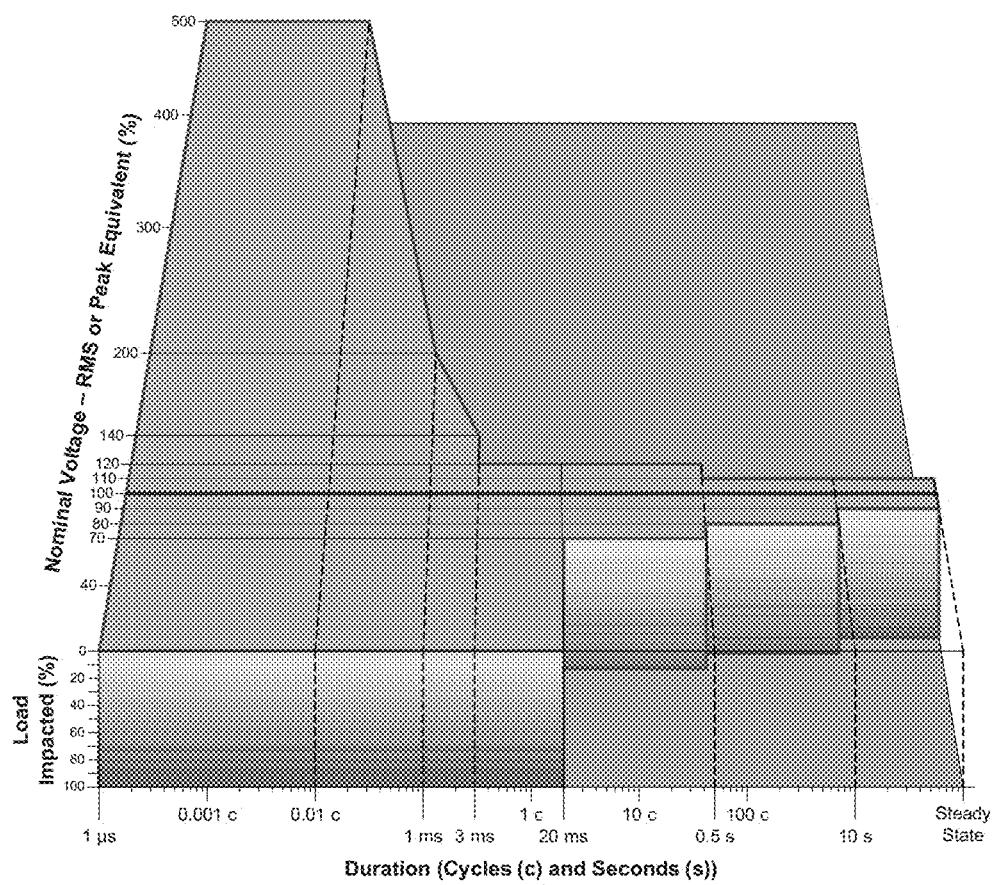
FIG. 10 shows an example 3-D tolerance-impact curve with gradient color shading indicating severity of load(s) impact.
Figure 11:
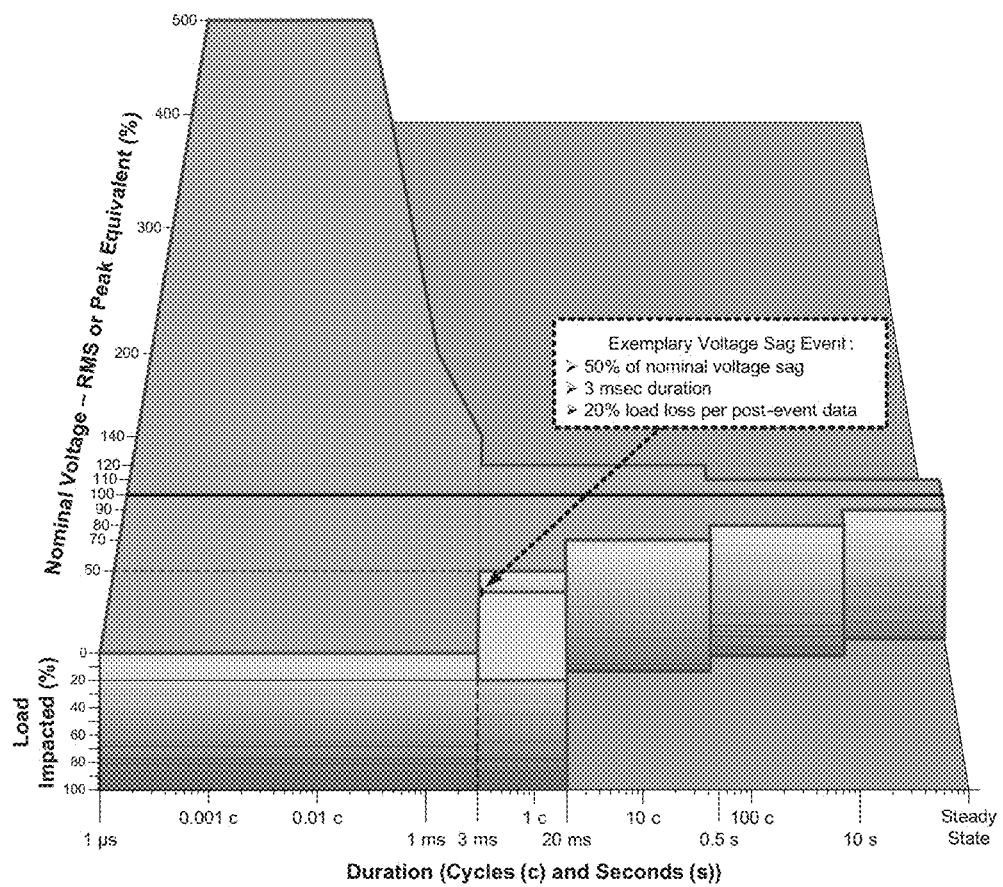
FIG. 11 shows an example 3-D tolerance-impact curve with a sample event indicating severity of load(s) impact.

Three-dimensional (3-D) tolerance curves in accordance with embodiments of the disclosure may be adapted and/or oriented to any axis, perspective, scale, numerically ascending/descending, alphabetized, color, size, shape, electrical parameter, event characteristic, and so forth to usefully describe an event or events to the energy consumer. For example, FIG. 9 illustrates an exemplary orthographic perspective of a tolerance-impact curve incorporating three parameters: 1) percent of nominal voltage on the y-axis, 2) duration in cycles and seconds on the x-axis, and 3) percent load impacted on the z-axis. While the y-axis is presented in units of percent of nominal voltage in the illustrated embodiment, it is understood that the y-axis units may also be in absolute units (e.g., real values such as voltage), or substantially any other descriptor of the y-axis parameter's magnitude. Additionally, while the x-axis is logarithmic in the illustrated embodiment, it is understood that the x-axis does not have to be logarithmic (for example, it can be linear as well). FIG. 10 illustrates an exemplary single-point perspective 3-D view of the same tolerance-impact curve shown in FIG. 9, and incorporates the same respective parameters for the three axes. It also attempts to integrate color shading to help illustrate the severity of the impact due to specific magnitude and duration events (least to worst; yellow to red, in the illustrated embodiment). FIG. 11 attempts to illustrate an exemplary single-point perspective 3-D view of a tolerance-impact curve incorporating magnitude, duration, percent load impact, shading, and event shape (to provide more event characteristics in a single graph). Again, the load impact may be as a relative percentage of the total load before the event (as shown in the graph), as a real value (e.g., kW, Amps, etc.), ascending or descending in value, or any other manipulation of these or any other electrical parameters.

b. Three-Dimension (3-D) Dynamic Tolerance-Recovery Time Curves

Building on the previous section discussing load impact, in embodiments it is also possible to use tolerance-impact curves to more directly quantify the effect of a voltage sag/swell/transient event on an energy consumer's operation. The time to recover from an event may directly affect the overall cost of a voltage event.

For the purpose of this disclosure, "recovery time" is defined as the period of time required to return the electrical system parameters back to (or approximately back to) their original state prior to the event that prompted their initial perturbation. In embodiments, recovery time and load impact are independent variables; neither is dependent on the other. For example, a voltage event may impact a small percentage of load, yet the recovery time may be considerable. Conversely, the recovery time from an extremely impactful event could be relatively short. Just as the impact of an event is dependent on a number of factors (some examples of which are set forth in the summary section of this disclosure), so too is the recovery time. A few examples of factors that can heavily influence the duration of recovery time include: ability to quickly locate event source (if it's within the facility), extent of equipment damage, spare parts availability, personnel availability, redundant systems, protection schemes, and so forth.

One example method for calculating the recovery time includes measuring the elapsed time between the occurrence of a first impactful event and the point when the load exceeds a predetermined threshold of the pre-event load. For example, a 500 kW pre-event load with a 90% recovery threshold will indicate the recovery has occurred at 450 kW. If it takes 26 minutes for the metered load to meet or exceed 450 kW (i.e., 90% of the pre-event load), then the recovery time is equal to 26 minutes. The recovery threshold can be determined using a relative percentage of the pre-event load, an absolute value (kW), the recovery of the voltage or current levels, an external or manual trigger, a recognized standard value, a subjective configuration, or by some other method using an electrical or non-electrical parameter(s).

Figure 12:
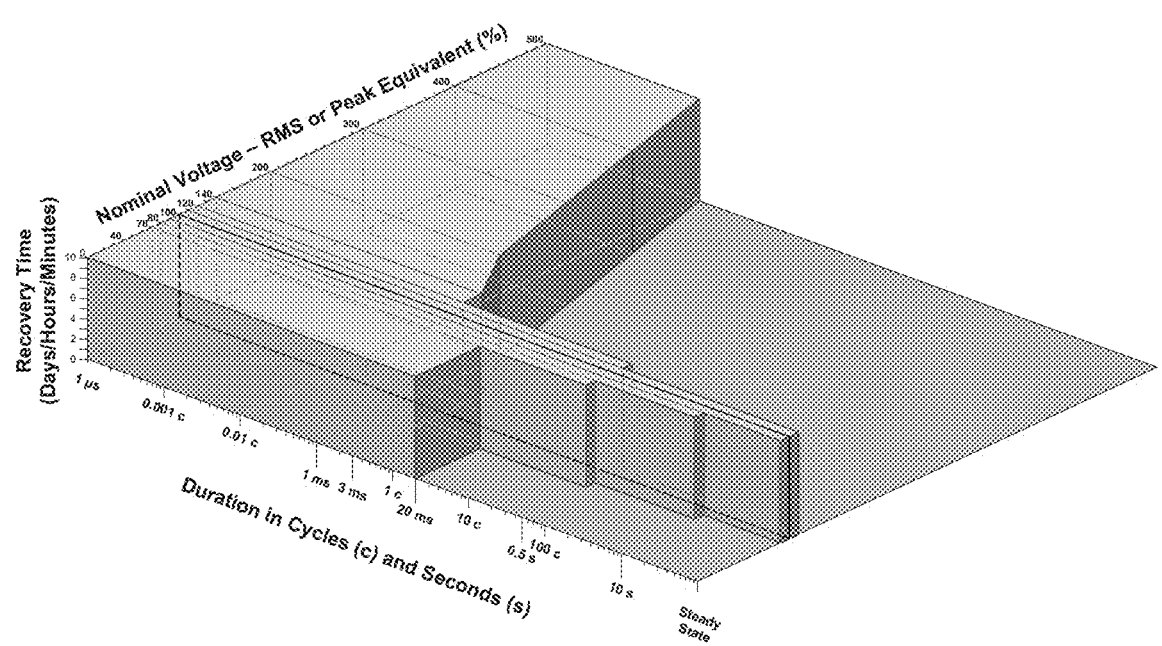
FIG. 12 shows an example 3-D tolerance-impact curve with recovery time.
Figure 13:
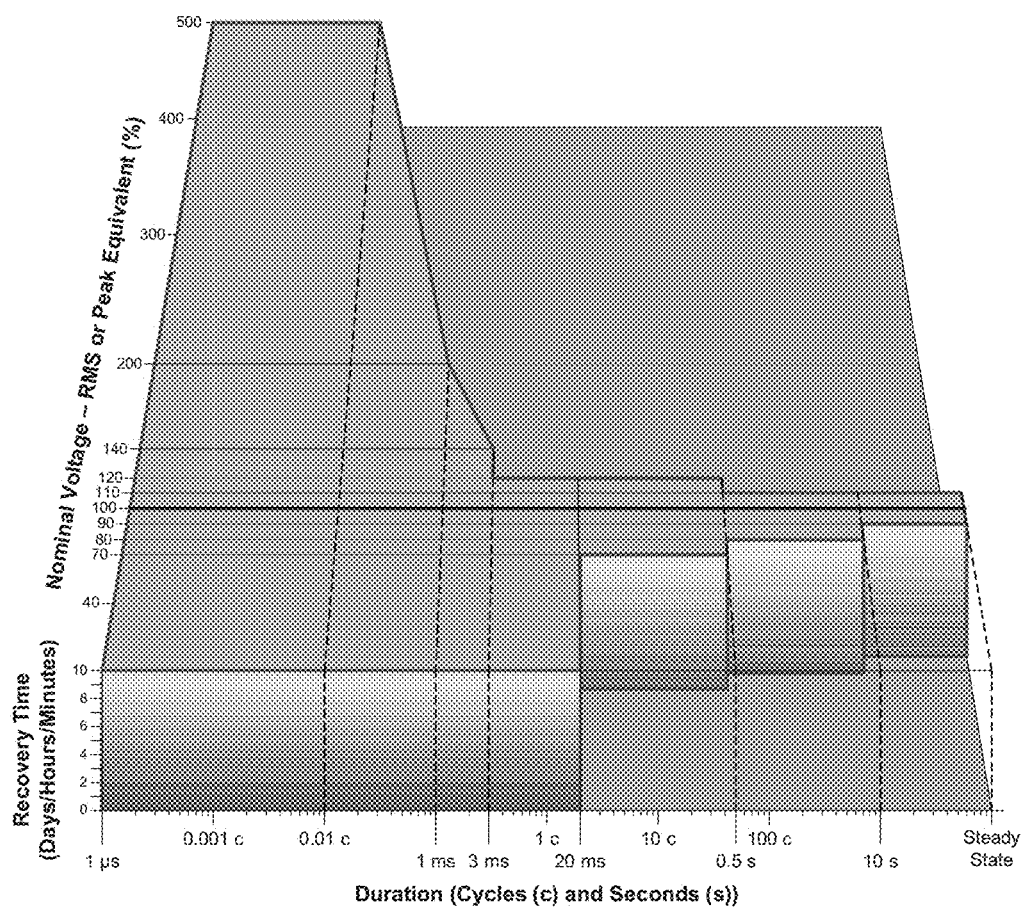
FIG. 13 shows an example 3-D tolerance-impact curve with gradient color shading indicating length of recovery time.
Figure 14:
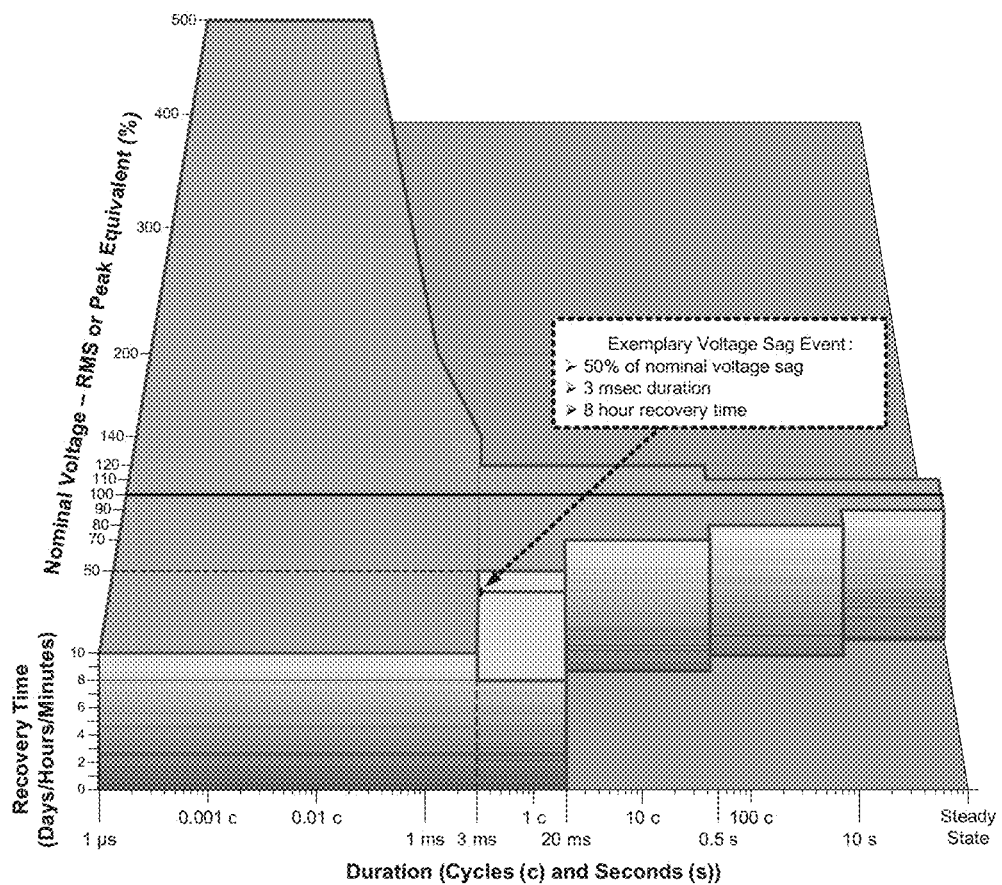
FIG. 14 shows an example 3-D tolerance-impact curve with a sample event indicating length of recovery time.

FIG. 12 illustrates an exemplary orthographic perspective of a tolerance-recovery time curve incorporating three parameters: 1) percent of nominal voltage on the y-axis, 2) duration in cycles and seconds (or alternatively, milliseconds) on the x-axis, and 3) recovery time or period in days, hours, and/or minutes on the z-axis. While the y-axis is presented in units of percent of nominal voltage in the illustrated embodiment, it is understood that the y-axis units may also be in absolute units (e.g., real values such as voltage), or substantially any other descriptor of the y-axis parameter's magnitude. Additionally, while the x-axis is logarithmic in the illustrated embodiment, it is understood that the x-axis does not have to be logarithmic (for example, it can be linear as well). In embodiments, the z-axis (recovery time) may be configured to substantially any fixed scale (or auto-scaled), may be listed in ascending or descending order, and may use substantially any known temporal unit. FIG. 13 illustrates an exemplary single-point perspective 3-D view of the same tolerance-recovery time curve shown in FIG. 12, and incorporates the same respective parameters for the three axes. FIG. 13 also integrates color shading to help illustrate the severity of the recovery time due to specific magnitude and duration events (least to worst; yellow to red in the illustrated embodiment). FIG. 14 illustrates an exemplary single-point perspective 3-D view of a tolerance-recovery time curve incorporating magnitude, duration, recovery time, shading, and event shape (to provide more event characteristics in a single graph).

c. 3-D Dynamic Tolerance-Economic Impact Curves

The 3-D curves discussed above may also be used to illustrate economic impact (e.g., production losses, restart losses, product/material losses, equipment losses, third-party losses, total losses, etc.) as it relates to voltage events. Obviously, configuration may be time-consuming; however, the relationship between recovery time and any relevant economic factor can easily be shown and understood using dynamic tolerance-economic impact curves. The cost of downtime (CoD) may be initially used to determine a given economic cost during the recovery period (assuming the CoD value is reasonable). Some studies indicate each minute of downtime costs energy consumers in the automotive industry more than $22K. By contrast, the similar studies indicate that healthcare industry energy consumers lose more than $10K/minute of downtime. Over time, energy consumers (and the systems and methods disclosed herein) can quantify their typical recovery time costs (whether it's linear or non-linear), or they may have a study done to determine this relationship at their facility or business. Determining the relationship between voltage events and economic factors will allow energy consumers to make faster and better decisions regarding capitalization expenditures and/or the retention of services.

Figure 15:
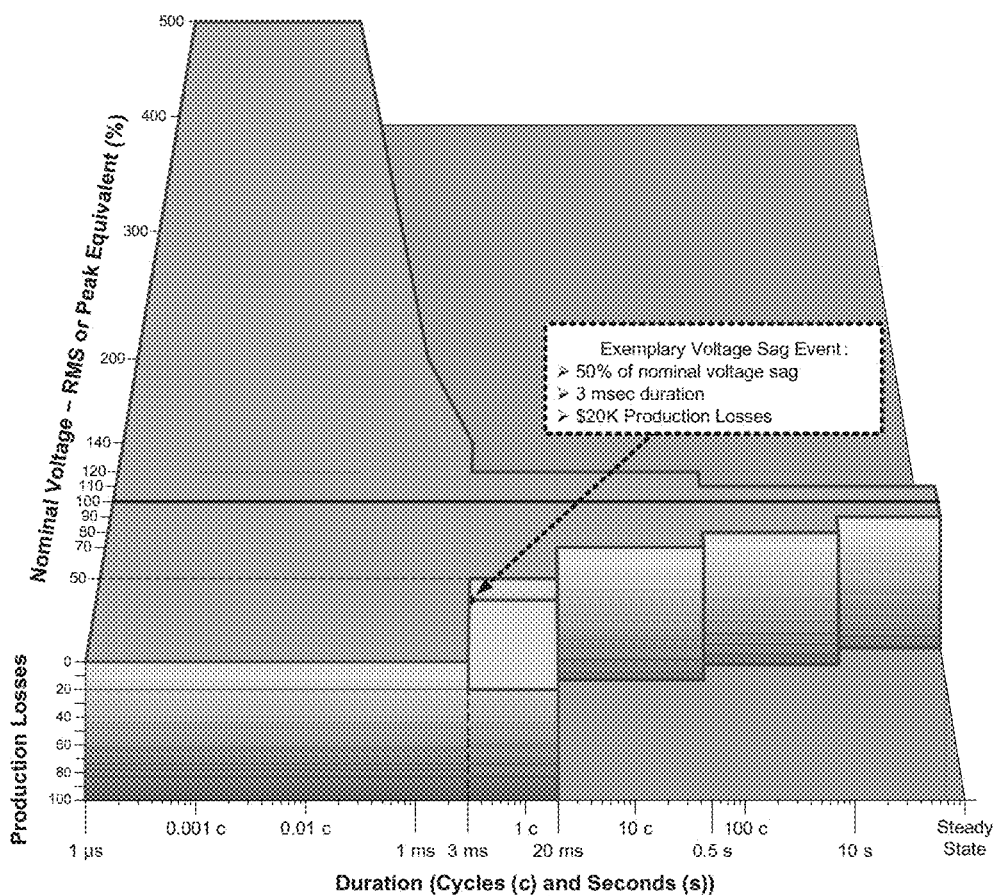
FIG. 15 shows another example 3-D tolerance-impact curve with a sample event indicating production losses as an economic impact.

For example, FIG. 15 illustrates the production losses with respect to a 50% of nominal voltage sag event with a duration of 3 milliseconds. Assuming the recovery time was 8 hours (see, e.g., FIG. 13) and production losses are an average of $2.5K/hour, the total production losses will be $20K. If ride-through capabilities can help avoid an operational disruption at a cost of $50K, the payback for investing in voltage sag ride-though equipment is may only be about 2.5 voltage events, for example. As mentioned at the beginning of this document, studies have shown the average industrial customer experiences about 66 voltage sags each year so a decision to mitigate should be straightforward in this case.

d. Upstream/Downstream Tolerance-Impact Curves

As has been stated and is widely known, electrical systems are sensitive to voltage events in varying degrees. For some energy consumers, voltage events may just be a nuisance (no significant impact); for other energy consumers, any small voltage anomaly may be catastrophic. As previously discussed, quantifying the impact of voltage events helps energy consumers determine the severity, prevalence, and influence of these events on their operation. If voltage events impact the energy consumer's operation, the next step is identifying the source of the problem.

Figure 16:
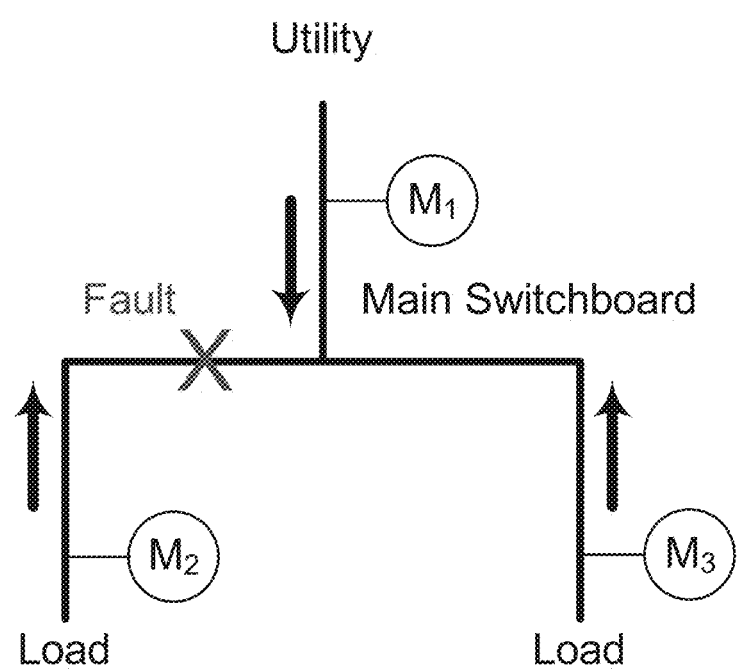
FIG. 16 shows an example simple electrical network with a fault.

Metering algorithms and other associated methods may be used to determine whether a voltage event's source is upstream or downstream from a metering point (e.g., an IED's electrical point of installation in an electrical system). For example, FIG. 16 illustrates a simple electrical network with three metering points ($M_1$, $M_2$, and $M_3$). A fault (X) is shown to occur between $M_1$ and $M_2$. In embodiments, algorithms in $M_1$ may indicate the source of the fault to be downstream (↓) from its location, and algorithms in $M_2$ may indicate the source of the fault to be upstream (↑) from its location. Additionally, in embodiments algorithms in $M_3$ may indicate the source of the fault to be upstream (↑). By evaluating the fault as a system event (i.e., using data from all three IEDs), in embodiments it is possible to generally identify the location of the fault's source within the electrical network (i.e., with respect to the metering points).

This embodiment evaluates the impact of a voltage event against the indicated location (upstream or downstream from the metering point) related to the voltage event's source. This is very useful because upstream voltage event sources often require different mitigative solutions (and associated costs) than downstream voltage event sources. Furthermore, there will likely be different economic considerations (e.g., impact costs, mitigation costs, etc.) depending on where the voltage event source is located within the electrical system. The larger the impacted area, the more expensive the cost may be to mitigate the problem. Upstream voltage events can potentially impact a larger portion of the electrical network than downstream voltage events, and therefore, may be more expensive to mitigate. Again, the cost to mitigate voltage events will be determined on a case-by-case basis since each metering point is unique.

In embodiments, the IEDs installed at the metering points are configured to measure, protect, and/or control a load or loads. The IEDs are typically installed upstream from the load(s) because current flow to the load(s) may be a critical aspect in measuring, protecting and/or controlling the load(s). However, it is understood that the IEDs may also be installed downstream from the load(s).

Figure 16A:
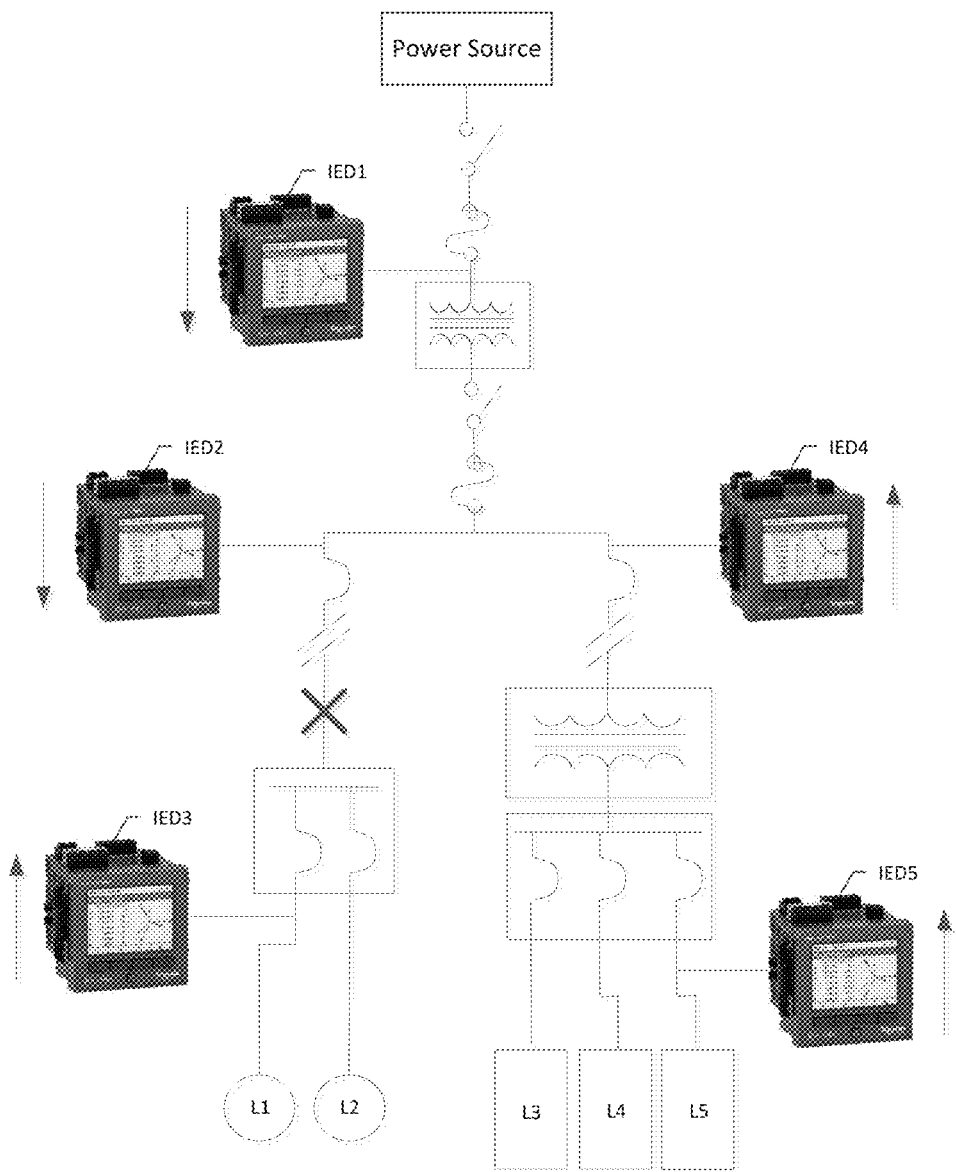
FIG. 16A shows another example electrical network with a fault.

Referring to FIG. 16A, another example electrical system includes a plurality of IEDs (IED1, IED2, IED3, IED4, IED5) and a plurality of loads (L1, L2, L3, L4, L5). In embodiments, loads L1, L2 correspond to a first load type, and loads L3, L4, L5 correspond to a second load type. The first load type may be the same as or similar to the second load type in some embodiments, or different from the second load type in other embodiments. Loads L1, L2 are positioned at a location that is "electrically" (or "conductively") downstream relative to at least IEDs IED1, IED2, IED3 in the electrical system (i.e., IEDs IED1, IED2, IED3 are upstream from loads L1, L2). Additionally, loads L3, L4, L5 are positioned at a location that is "electrically" downstream relative to at least IEDs IED1, IED4, IED5 in the electrical system (i.e., IEDs IED1, IED4, IED5 are upstream from loads L3, L4, L5).

In the illustrated embodiment, a power quality event (or fault) X is shown occurring upstream relative to loads L1, L2. Up arrows indicate "upstream" and down arrows indicate "downstream" in the example embodiment shown. As illustrated, IEDs IED1, IED2 are shown pointing towards the fault X. Additionally, IEDs IED3, IED4, IED5 are shown pointing upstream. In embodiments, this is because the path leading to the fault X is upstream from IEDs IED3, IED4, IED5 respective location in the electrical system, and downstream from IEDs IED1, IED2 respective location in the electrical system. In embodiments, algorithms that determine a direction of the fault X may be located (or stored) in the IEDs, on-site software, cloud-based systems, and/or gateways, etc., for example.

Figure 17:
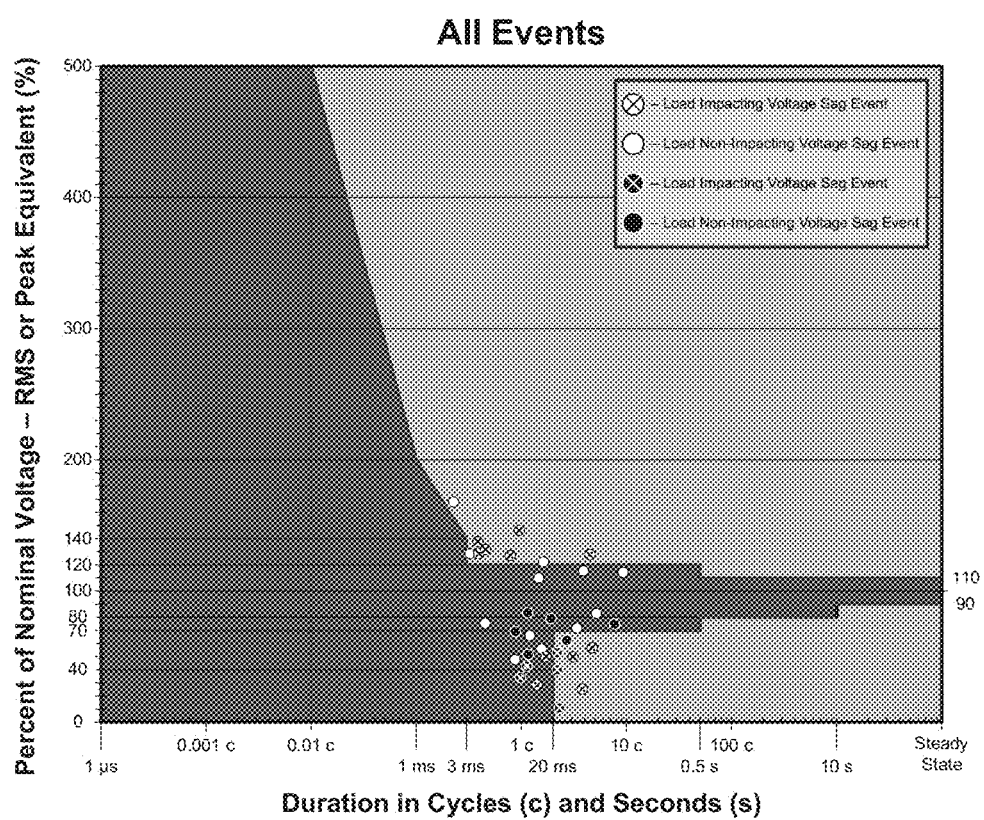
FIG. 17 shows an example customized tolerance curve with a multitude of impactful and non-impactful upstream and downstream events.
Figure 18:
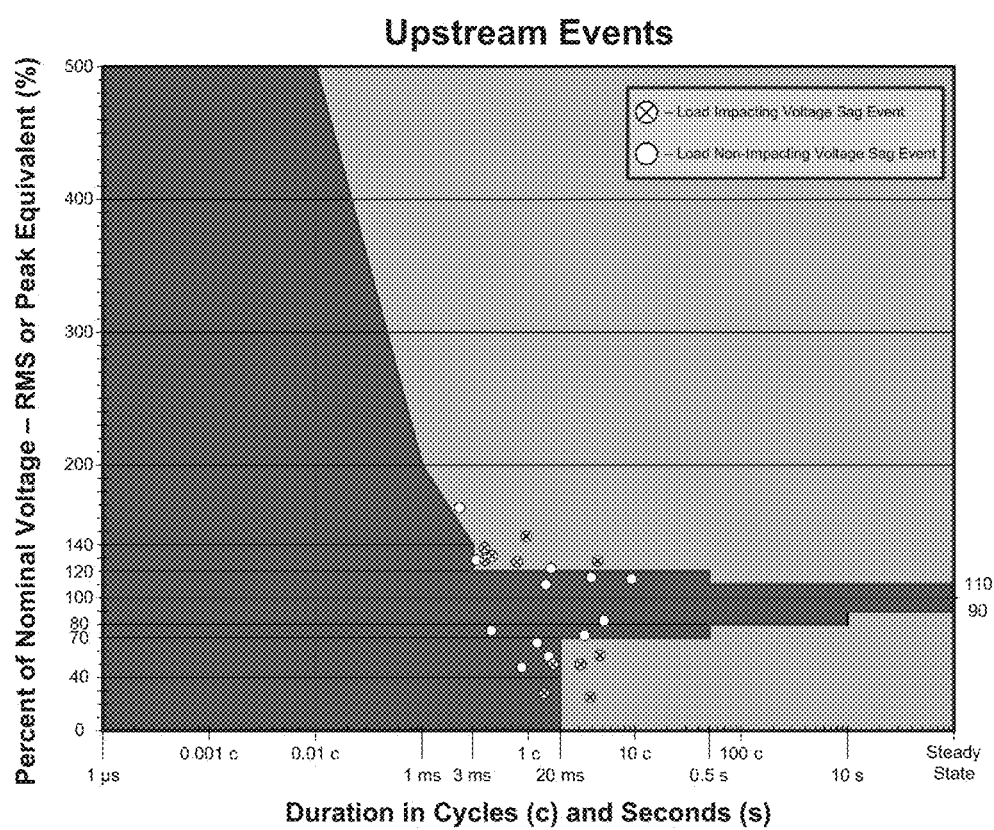
FIG. 18 shows an example customized tolerance curve with a multitude of impactful and non-impactful disaggregated upstream events.
Figure 19:
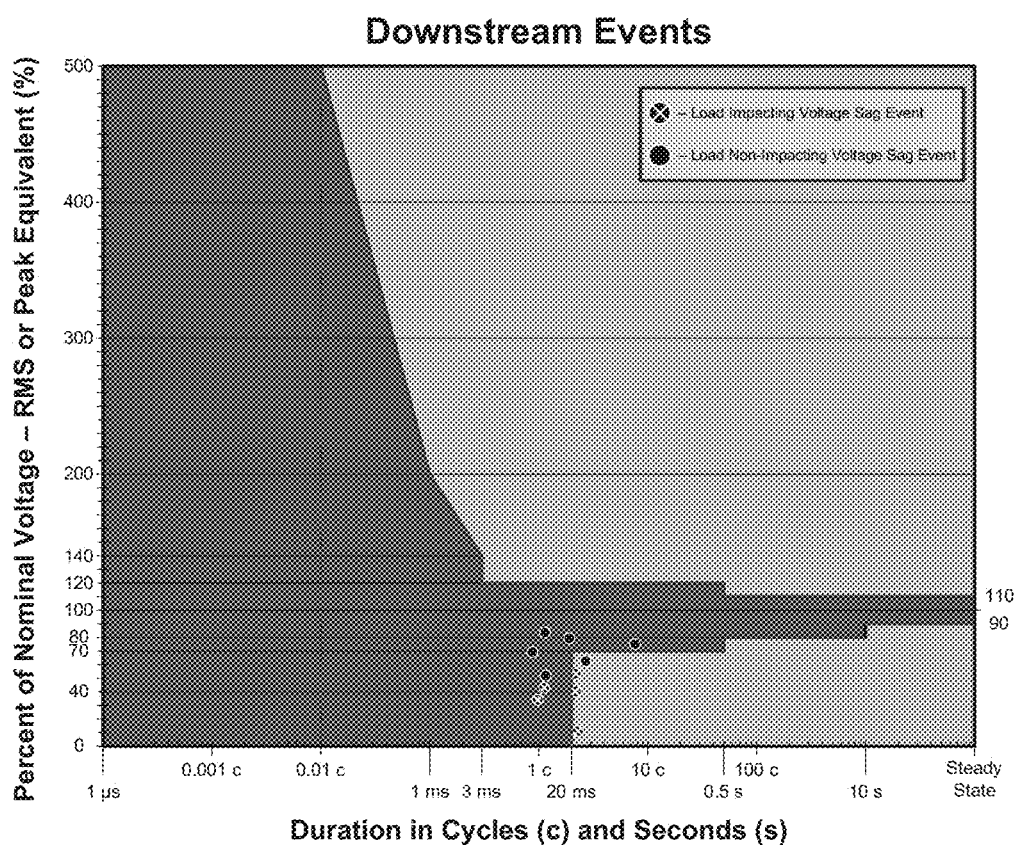
FIG. 19 shows an example customized tolerance curve with a multitude of impactful and non-impactful disaggregated downstream events.

FIG. 17 illustrates a 2-D graph voltage tolerance curve of voltage events captured by an IED similar to FIG. 7 above; however, the upstream and downstream voltage events are uniquely denoted and superimposed/overlaid together. FIG. 18 illustrates a 2-D voltage tolerance curve that shows only the upstream voltage events which are disaggregated from the total set of voltage events shown in FIG. 17. Similarly, FIG. 19 illustrates a 2-D voltage tolerance curve showing only the downstream voltage events as disaggregated from the total set of voltage events shown in FIG. 17. These graphs allow energy consumers (and the systems and methods disclosed herein) to distinguish the upstream events from the downstream events, thus, helping to provide a better visually intuitive view for identifying the primary location of voltage event sources (and perhaps, their causes). Of course, additional or alternative characteristics, parameters, filters, and/or other related information (e.g., electrical data, time, metadata, etc.) may be used, displayed and/or plotted to further effectively and productively embellish the voltage tolerance curves.

Figure 20:
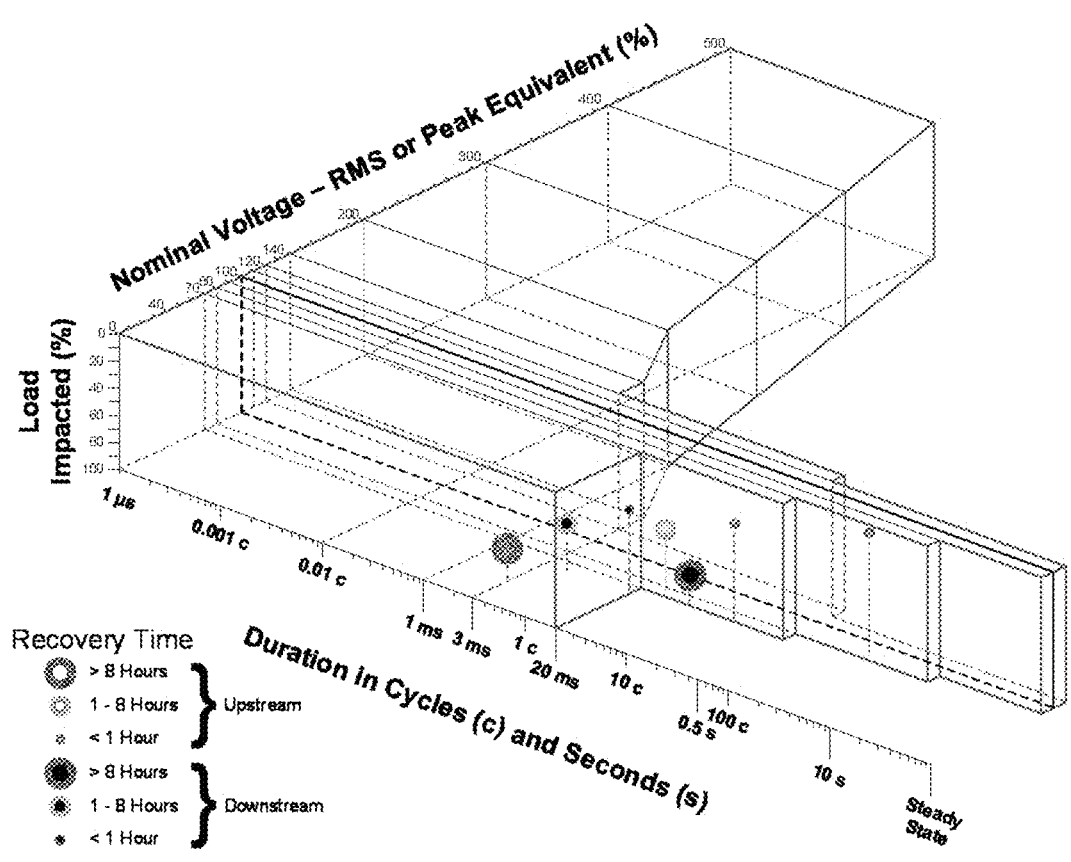
FIG. 20 shows an example 3-D tolerance-impact curve with load impact, recovery time and upstream/downstream event sources indicated for a multitude of events.

For example, FIG. 20 illustrates an exemplary orthographic perspective of a tolerance-impact-source location curve incorporating five parameters: 1) percent of nominal voltage on the y-axis, 2) duration in cycles and seconds on the x-axis, and 3) percent load impacted on the z-axis. While the y-axis is presented in units of percent of nominal voltage in the illustrated embodiment, it is understood that the y-axis units may also be in absolute units (e.g., real values such as voltage), or substantially any other descriptor of the y-axis parameter's magnitude. Additionally, while the x-axis is logarithmic in the illustrated embodiment, it is understood that the x-axis does not have to be logarithmic (for example, it can be linear as well). Additional dimensions are also included in FIG. 20 such as the recovery time (size of data point) and whether a particular event was upstream or downstream from the metering point (data point center is white or black, respectively). Moreover, the z-axis could be made to show the recovery time while the size of the data point could be used to indicate the percent load impacted. It is understood that many other parameters/dimensions may be incorporated as makes sense and/or is useful.

e. Mitigation of Sag/Swell/Transient Impact Using Dynamic Tolerance Curves

As noted above, electrical systems are typically sensitive to voltage events in varying degrees. For some energy consumers, voltage events may just be a nuisance (no significant impact); for other energy consumers, any voltage event may be catastrophic. As previously discussed, quantifying the impact of voltage events helps energy consumers determine the severity, prevalence, and influence of these events on their operation. If voltage events have an impact the energy consumer's operation, the next step should be identifying the problem so it can be reduced or eliminated altogether.

Figure 21:
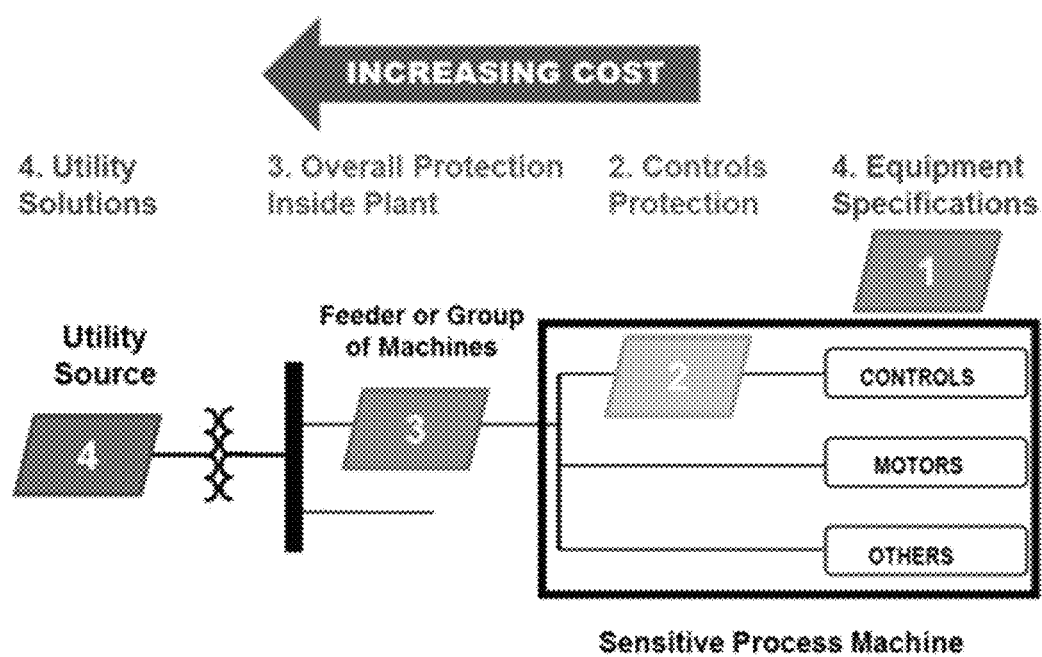
FIG. 21 is a diagram showing an example progression of costs to mitigate voltage events.

In embodiments, eliminating or reducing the impact of voltage sags/swells/transients (and momentary, temporary and instantaneous interruptions) for the various embodiments discussed throughout the disclosure, can be generally accomplished in three ways: 1) removing the source of the voltage events, 2) reducing the number or severity of voltage events produced by the source, or 3) minimizing the effects of the voltage events on impacted equipment. In some embodiments, it is substantially difficult to remove the source (or sources) of voltage events because these same sources are usually an integral component or load within the facility's electrical infrastructure, process, and/or operation. Additionally, the voltage event's source may be located on the utility, and thus, hamper the ability to directly address a problem. If the voltage event's source is located inside the energy consumer's facility, it may be possible to minimize voltage events at the source by using different techniques or technologies (e.g., "soft-start" motors instead of "across the line" motor starting). In some embodiments, removing or replacing the source (or sources) of voltage events may cost-prohibitive and require an extensive redesign of an electrical system or subsystem. It is also possible to "desensitize" equipment against the effects of voltage events such as sags, swells, and transients. As always, there are economic trade-offs when considering the best approach to reduce or eliminate voltage issues. FIG. 21 is a generally recognized illustration showing the progression in cost to mitigate voltage events and other PQ-related issues, which tends to increase as the solution moves closer to the source. A thorough economic evaluation may include both the initial and total life cycle costs for a given solution. Furthermore, it may be very important to consider the response of any prospective solution to both internal and external sources of system voltage perturbations.

As an example, motors are an important electrical apparatus used in most processes. Standard (across the line) motor starts typically produce voltage sags due to the impedance between the source and motor and the motor's inrush current, which is typically 6-10 times the full-load current rating. Removing the motor from the process would most likely be impractical; however, reducing the voltage sag or minimizing its effects on adjacent equipment may be viable alternatives. A few example solutions may include using different motor technologies such as variable speed drives or to employ motor soft-start techniques to control or limit the inrush current (and thus, reduce or eliminate the voltage sag at start-up). Another example solution is to deploy one or more of several mitigative devices or equipment to reduce the voltage event's impact on sensitive equipment. Again, each electrical system is unique, so the cost to mitigate power quality disturbances may vary from location to location, system to system, and customer to customer.

This embodiment includes evaluating the ride-through characteristics of a multitude of mitigative devices against the dynamic tolerance-impact curves provided by each capable IED. The output of the evaluation may indicate the additional ride-through benefits of applying any particular mitigative device to any specific metering location. Moreover, a comparison of the economic, operational, and/or other benefits between two or more ride-through technologies or techniques for a specific system or sub-system may also be provided. In embodiments, in order to perform the evaluation, a managed collection (or library) of mitigative devices' ride-through characteristics may be assessed. The managed collection (or library) of mitigative devices may include (but not be limited to) characteristics and/or capabilities such as type, technology, magnitude vs. duration behavior, load constraints, typical applications, purchase costs, installation costs, operational costs, availability, purchase sources, dimensions/form factors, brands, and so forth for each known variety. In embodiments, the characteristics and capabilities described in the managed collection of mitigative devices will be considered (as required and as available) for application at every (or substantially every) discretely metered point (or sub-system) where data is obtainable and assessible. One or more ride-through characteristics curves (indicating magnitude vs. duration ride-through capabilities) for any or every mitigative device found in the managed collection (library) may be superimposed/overlaid on the dynamic tolerance curve for at least one or more discrete metering point(s). Alternatively, the evaluation may be provided through some other means accordingly. One or more characteristics and/or capabilities of the mitigative device(s) may be included in the evaluation against the dynamic tolerance curve based on factors such as those listed and available in the managed collection (or library). In embodiments, this evaluation may be alarm-driven, manually or automatically triggered, scheduled, or otherwise initiated.

The dynamic tolerance-impact curves provided by each capable IED for the electrical system's hierarchy (or portions of its hierarchy) may be evaluated against the ride-through characteristics of one or more mitigative devices. In embodiments, it may be more feasible, cost-effective, or otherwise beneficial to provide ride-through improvements as part of a system, sub-system process, and/or discrete location. Whereas it may be economical/practical/feasible to apply one type of ride-though mitigative solution for one device or one sub-system/zone, it may be more economical/practical/feasible to provide a different ride-through mitigative solution for another device or subsystem/zone within the electrical system. In short, the most economical/practical/feasible ride-through mitigative solution may be provided for the entire (or portion of the) electrical system based on the information available. In embodiments, other factors may be considered when determining ride-through improvements for one or more locations within an electrical system; however, this application emphasizes the importance of leveraging discretely established dynamic tolerance curves from one or more IEDs.

Figure 22:
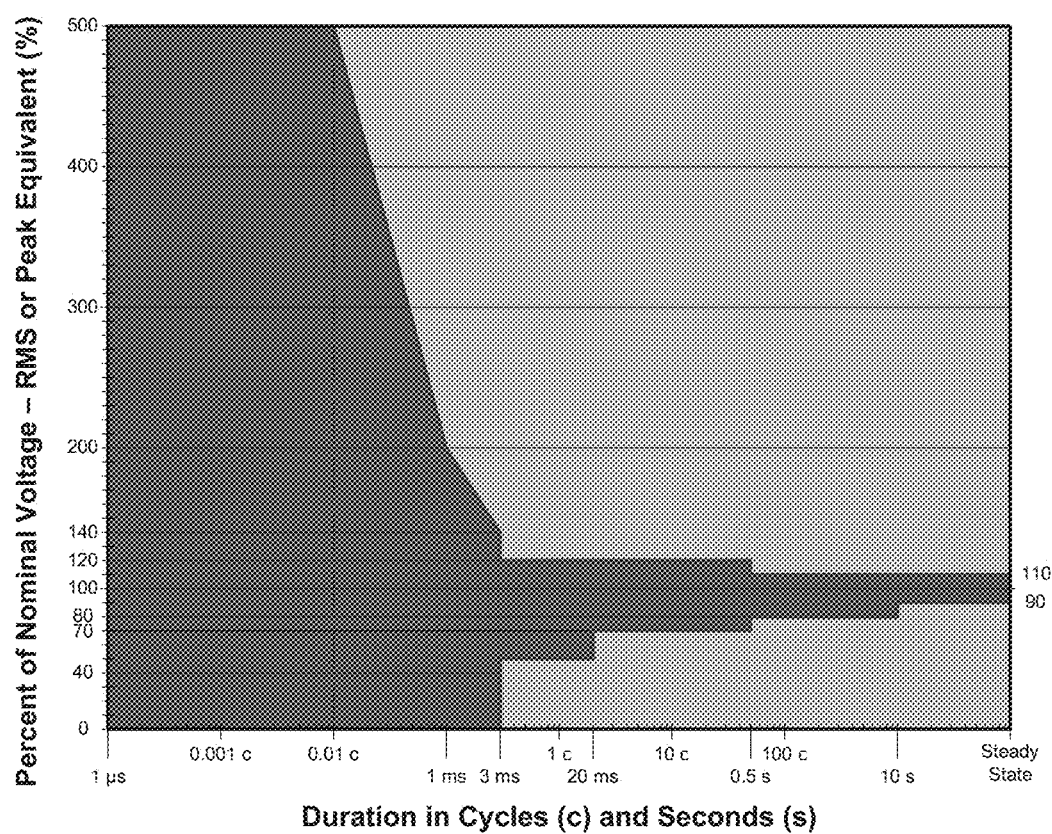
FIG. 22 shows an example customized and updated tolerance curve for the voltage sag event illustrated in FIG. 4.
Figure 23:
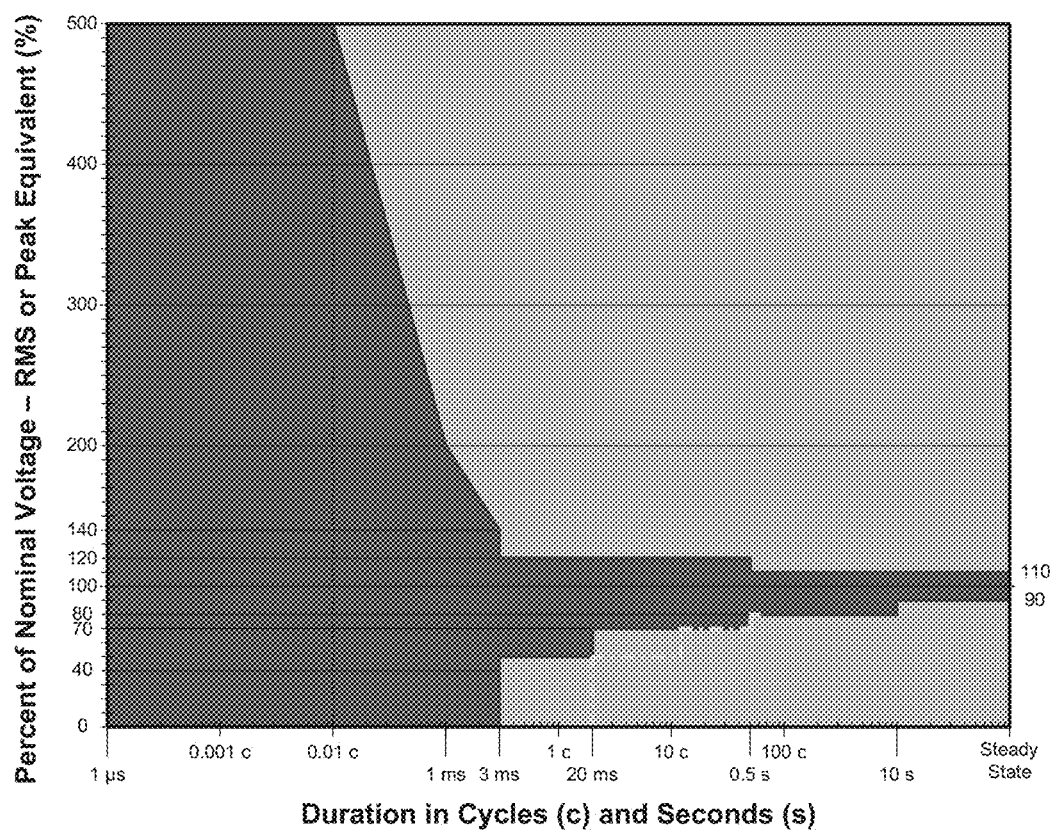
FIG. 23 shows the SEMI F47 curve superimposed on the plot illustrated in FIG. 22.
Figure 24:
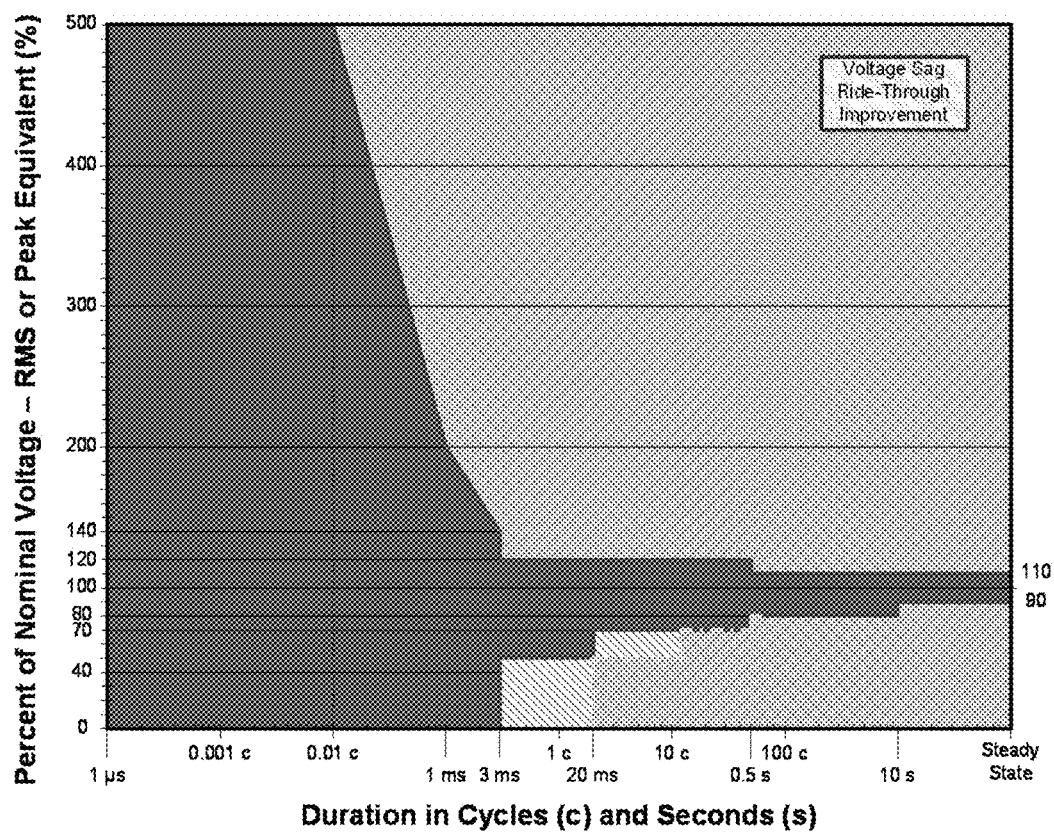
FIG. 24 shows example ride-through benefits of a sag mitigation device in an electrical system, one example of which is SagFighter® by Schneider Electric.

FIG. 22 illustrates the 2-D dynamic tolerance curve from FIG. 5. Again, this example shows a tolerance curve that has been customized and updated based on a single 50% voltage sag lasting 3 milliseconds and having a 20% load impact. An evaluation may be performed to ascertain the most economic/practical/feasible approach in order to improve the ride-through performance for this particular location in the electrical system. The managed collection (library) of mitigative devices may be assessed against suitable options and viable solutions. FIG. 23 shows the ride-through characteristics (magnitude vs. duration) of SagFighter® by Schneider Electric, which claims to meet SEMI F47, superimposed/overlaid on top of the updated dynamic tolerance curve. FIG. 24 provides the energy consumer with a graphical indication of SagFighter's ride-through benefits at this particular location in the electrical system (as indicated by the shaded area in FIG. 24, for example). Of course, the final mitigation device recommendation provided to the energy consumer may be dependent on more than the ride-through characteristic of the mitigative device (e.g. economical/practical/feasible/etc.). Additionally, this approach may be provided to multiple metered points across the electrical system or subsystems.

f. Determining Opportunity Costs for Ride-Through Mitigative Solutions Using Dynamic Tolerance Curves As is known, opportunity cost refers to a benefit or gain that could have achieved, but was forgone in lieu of taking an alternative course of action. For example, a facility manager with a fixed budget may be able to invest funds to expand the facility OR to improve the reliability of the existing facility. The opportunity cost would be determined based on the economic benefit of the choice not taken by the facility manager.

In this embodiment of the disclosure, the "opportunity cost" is expanded to include other benefits such as production losses, material losses, recovery time, load impact, equipment losses, third-party losses, and/or any other loss that is quantifiable by some measure. Additionally, an "alternative course of action" may be the decision to take no action at all. A few benefits of taking no action include resource savings, monetary savings, time savings, reduced operational impact, deferral, and so forth. That is to say, decision-makers often consider the benefits of taking no action greater than the benefits of taking specific action(s).

The decision not to take an action is often based on the lack of information related to a given problem. For example, if someone cannot quantify the benefits of taking a particular action, they are less likely to take that action (which may be the wrong decision). Conversely, if someone is able to quantify the benefits of taking a particular action, they are more likely to make the right decision (whether to take action or not take action). Moreover, having quality information available provides the tools to produce other economic assessments such as cost/benefit analyses and risk/reward ratios.

This embodiment of this disclosure may continuously (or semi-continuously) evaluate the impact of voltage events (sags/swells/transients) against the ride-through tolerance characteristics of one or more mitigative devices, apparatuses and/or equipment. The evaluation may consider historical data to continuously track voltage events, associated discrete and combined system impact (e.g., as a relative value, absolute value, demand, energy, or other quantifiable energy-related characteristic), sub-system and/or system perspective, hierarchical impact from two or more devices, zones, cross-zones, or combination thereof. Information taken from the evaluation may be used to provide feedback and metrics regarding the operational repercussions that could have been avoided if one or more mitigative devices, apparatuses, and/or equipment would have been installed at a location (or locations).

Figure 25:
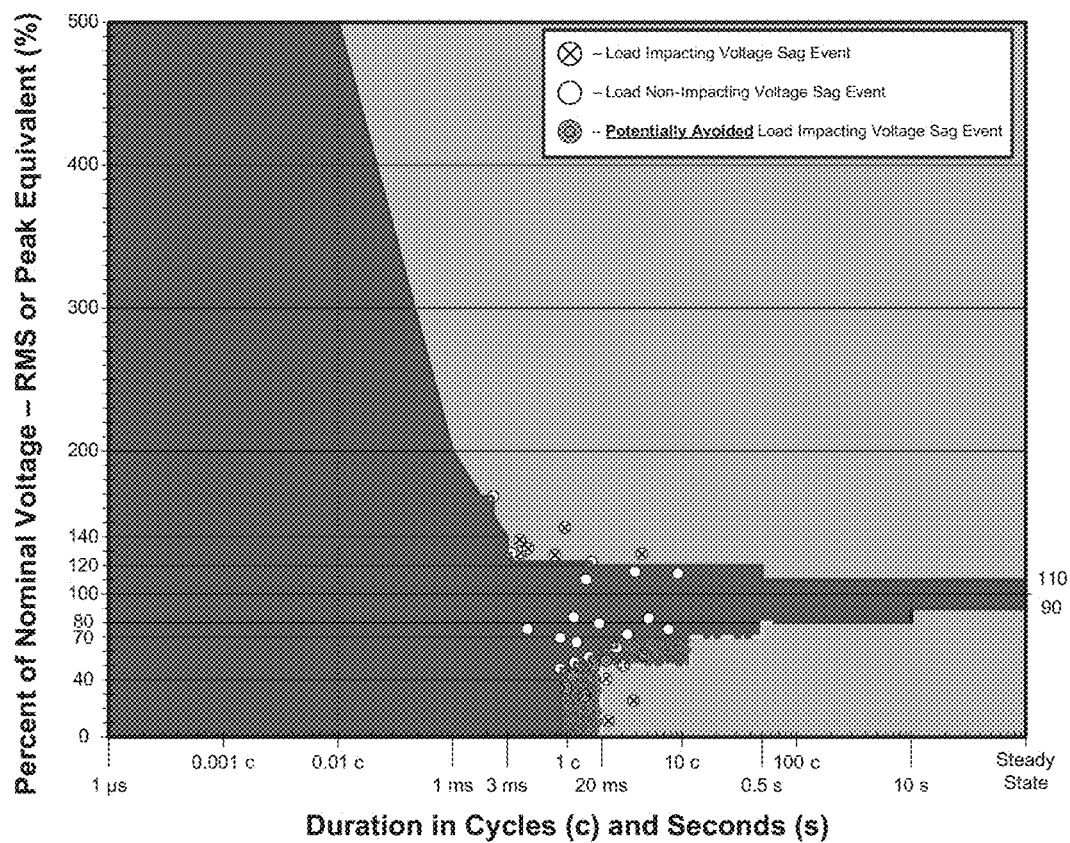
FIG. 25 shows an example of a multitude of potentially avoided load impact events with a sag mitigation device.
Figure 26:
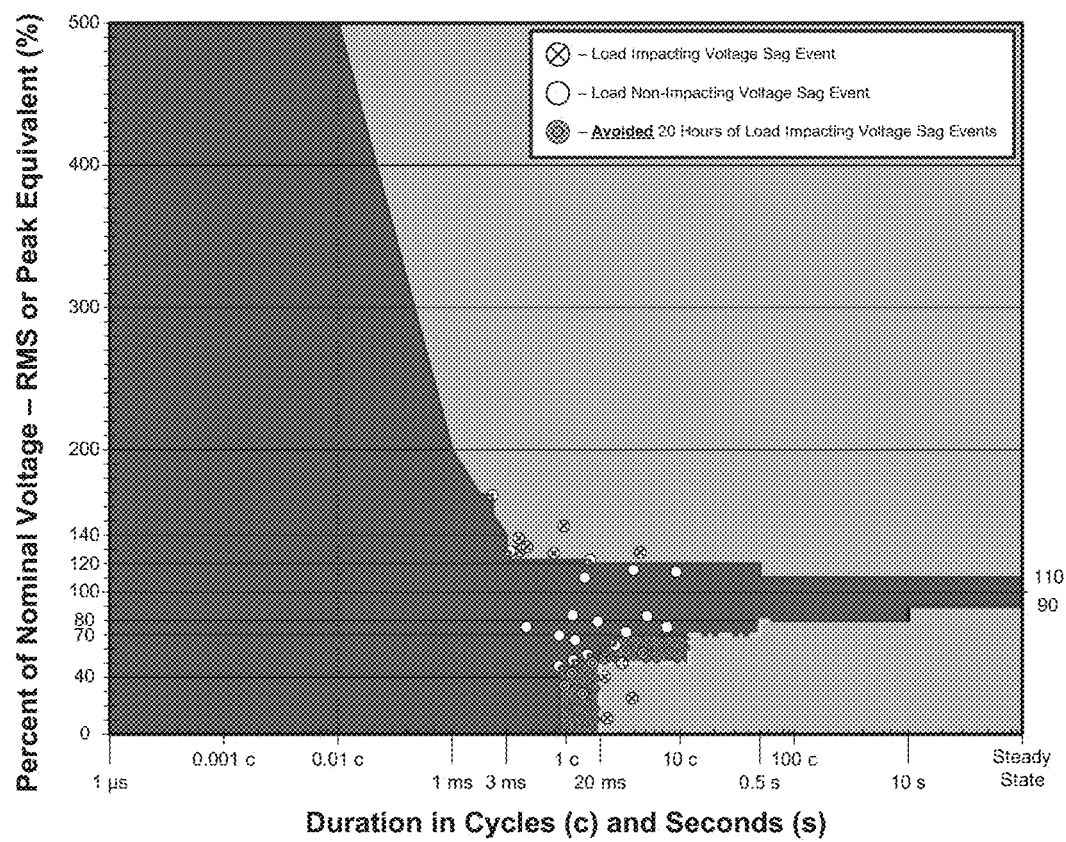
FIG. 26 shows another example of a multitude of potentially avoided load impacting events and their aggregated recovery time with a sag mitigation device.

For example, FIG. 25 provides a 2-D graph that illustrates events (and any associated impacts) that could have been avoided (green circles) if the decision had been made to install SagFighter® prior to the respective voltage event. FIG. 26 illustrates a similar graph as shown in FIG. 25, but also includes the estimated recovery time that could have been avoided had mitigative solutions been implemented prior to the voltage events. Metrics associated with these potentially avoided events (e.g., relative impact (%), absolute impact (W, kW, etc.), recovery time per event, accumulated recovery time, downtime, losses, other quantifiable parameters, etc.) may also be provided to an energy consumer to help justify investments to resolve voltage sag issues. The energy consumer (or systems and methods of the disclosure herein) could also choose what level of mitigation would be justifiable by comparing differing mitigation techniques to the historical tolerance curve data (i.e., the point of diminishing region of interest (ROI)). Metrics may be listed per event or accumulated, provided in a table or graphed, analyzed as a discrete point or from two or more devices (i.e., a system level perspective), or otherwise manipulated to indicate and/or quantify the impact and/or opportunity cost for not installing voltage event mitigation. The same information could be displayed a 3-D orthographic perspective of a tolerance-impact curve incorporating at least three parameters such as: 1) percent of nominal voltage on the y-axis, 2) duration in cycles and seconds on the x-axis, and 3) percent load impacted (or recovery time in days, hours or minutes) on the z-axis. While the y-axis is presented in units of percent of nominal voltage in the illustrated embodiment, it is understood that the y-axis units may also be in absolute units (e.g., real values such as voltage), or substantially any other descriptor of the y-axis parameter's magnitude. Additionally, while the x-axis is logarithmic in the illustrated embodiment, it is understood that the x-axis does not have to be logarithmic (for example, it can be linear as well). Other parameters, characteristics, metadata, and/or mitigative apparatus may similarly be incorporated into a graph and/or table.

g. Verifying the Effectiveness of Mitigation Techniques Using Dynamic Tolerance Curves Re-evaluating or reassessing the decision to invest in a facility's infrastructure is often overlooked, presumed, or merely based on speculation and supposition. In most cases the benefits of installing mitigative technologies are just assumed, but never quantified. Measurement and Verification (M&V) processes focus on quantifying energy savings and conservation; however, steps to improve reliability and power quality are not considered.

Embodiments of this disclosure periodically or continuously provide the following example benefits:
  Allocate risks between contractors and their customer (e.g., for performance contracts),
  Accurately assess voltage events to quantify savings (in impact, recovery time, uptime, losses, or other economic factors),
  Reduce voltage quality uncertainties to reasonable levels,
  Aid in monitoring equipment performance,
  Identify additional monitoring and/or mitigation opportunities,
  Reduce impact to targeted equipment, and
  Improve operations and maintenance.

The dynamic voltage-impact tolerance curve provides a baseline of voltage events at each discretely metered point that captures impacted or potentially impacted processes, operations or facilities. Post-installation evaluations may be performed using data taken from the areas predicted to experience the benefits. In embodiments, these post-installation evaluations compare "before vs. after" to quantify the real benefits of installing the mitigative equipment. Determined quantities may include reduced event impact, recovery time, operational costs, maintenance costs, or any other operational or economic variable. An exemplary equation to determine the calculated savings due to installing mitigative equipment may be:

$$\text{Savings} = (\text{baseline costs} - \text{reduced downtime costs}) \pm \text{Adjustments}$$

where "reduced downtime costs" may include all or some combination of the following:
  Reduced production losses,
  Reduced restart losses,
  Reduced product/material losses,
  Reduced equipment losses,
  Reduced $3^{rd}$ party costs, and
  . . . and/or some other loss reduction.

Installation costs for the mitigative equipment may need to be considered, likely as an "adjustment," in some embodiments.

Figure 27:
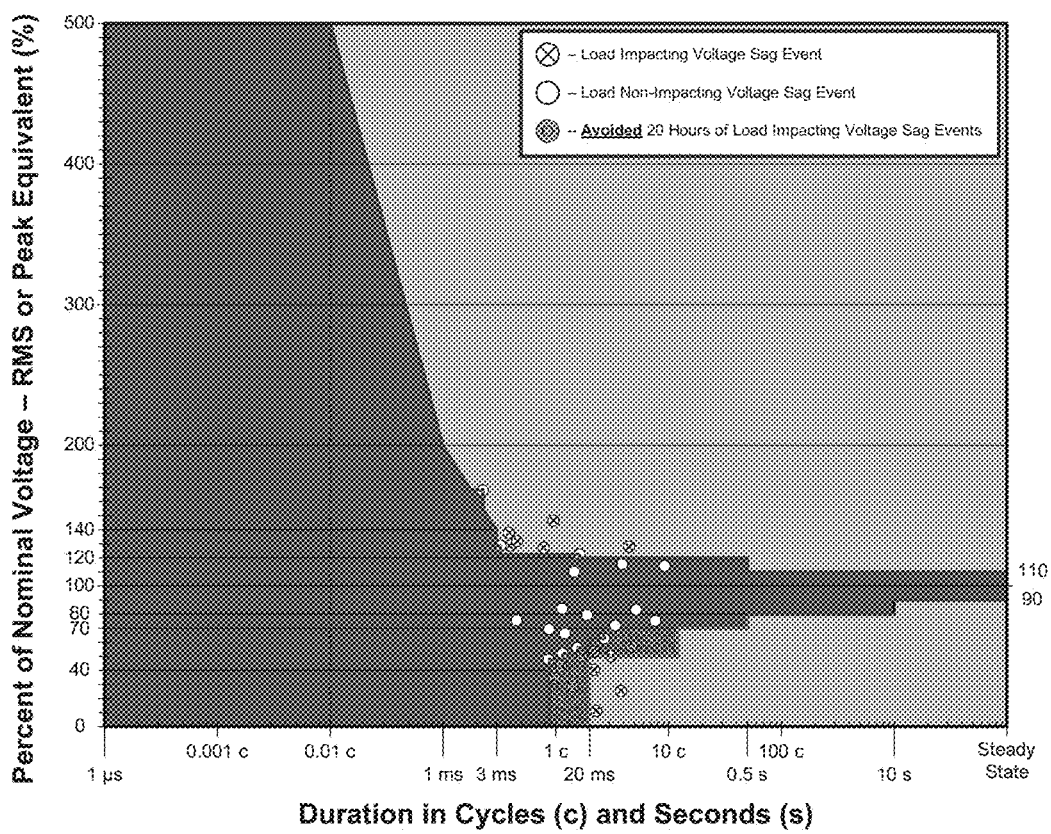
FIG. 27 shows an example of the predicted impact of installing a voltage event mitigation device.
Figure 28:
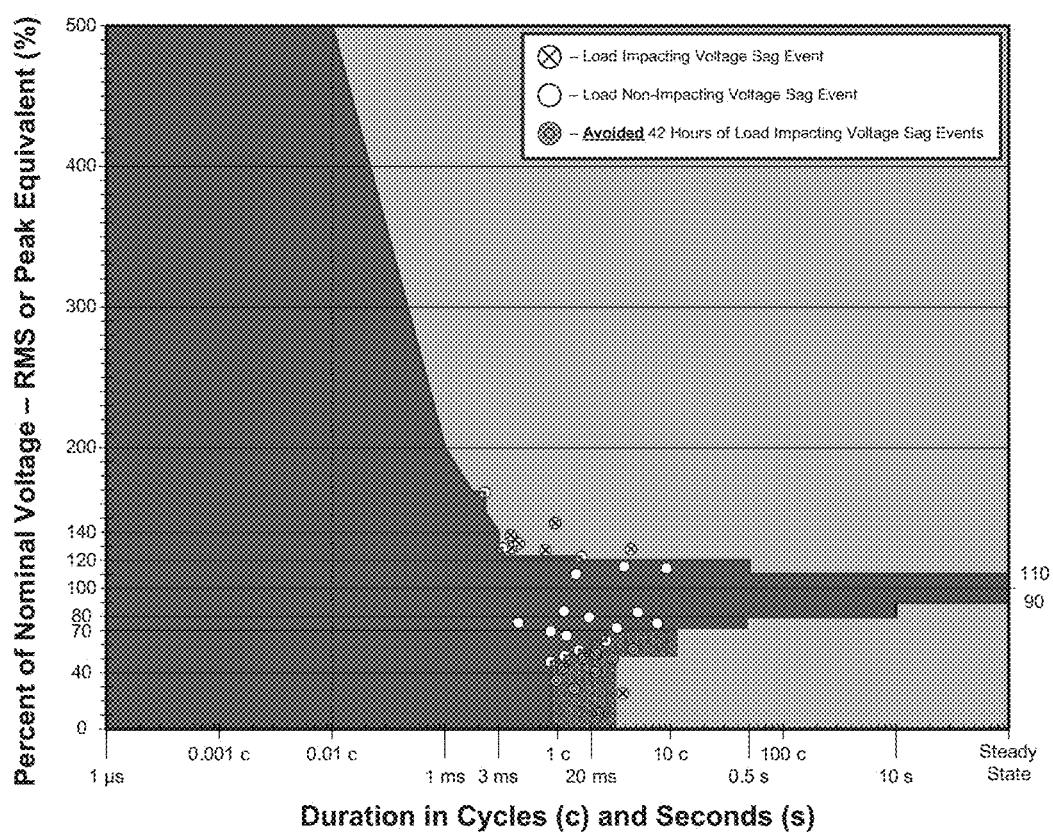
FIG. 28 shows an example of the actual impact of installing a voltage event mitigation device.

FIG. 27 illustrates an example 2-D dynamic voltage tolerance curve according to the disclosure where the blue threshold lines (-) represent the ride-through baseline thresholds at a discretely metered point and the pink line (-) represents the predicted improvement to the voltage event ride-through thresholds by installing a certain type of mitigation equipment. The green circles in FIG. 27 indicate the voltage events (and consequently, the recovery time) expected to be avoided by installing the mitigation equipment. FIG. 28 illustrates an example 2-D dynamic voltage tolerance curve according to the disclosure showing the actual voltage events and recovery time avoided due to the installation of the mitigation equipment. The orange line (-) illustrates the actual improvement to the voltage ride-through thresholds by installing the mitigation equipment. In this example, the mitigation equipment surpassed its expectations by avoiding three additional voltage events and 22 hours (42 actual events-20 predicted events) of additional recovery time.

Each electrical system is unique and will perform differently to some degree. Embodiments of this disclosure use empirical data to characterize the actual performance of the mitigation equipment. For example, the actual thresholds for voltage ride-through (-) may perform better than expected as shown in FIG. 28 because the downstream load on the mitigation equipment was/is less than expected. This allows the mitigation device to ride-through longer than anticipated. Conversely, exceeding the mitigation equipment's load rating would likely result in a worse-than-expected performance. As the mitigation equipment's load continues to be increased beyond its rating, the voltage ride-through thresholds (-) will approach the original voltage ride-through threshold (-) or possibly be even more severe.

A 3-D dynamic tolerance curve similar to the one shown in FIG. 15 may be produced to better demonstrate the effect of mitigation on other parameters such as load impact, recovery time, economic factors, etc. In this case, at least three dimensions would be used to characterize the electrical system at the point of the IED's installation. A 3-D evaluation would provide an even better intuitive understanding of a mitigation equipment's historical, present and/or future performance. It would also make the selection of mitigation equipment for future applications less complicated and more cost-effective.

Metrics associated with the expected (based on historical data) and actually avoided events (e.g., relative impact (%), absolute impact (W, kW, etc.), reduced losses, other quantifiable parameters, etc.) may be provided to an energy consumer to help justify the original or additional investments to resolve voltage sag issues. Metrics may be listed per event or accumulated, provided in a table or graphed, analyzed as a discrete point or from two or more devices (i.e., a system level perspective), or otherwise manipulated to indicate and/or quantify the benefits and/or costs per avoided minute of impact due to the installation of voltage event mitigation. The same information could be displayed as a 3-D orthographic perspective of a tolerance-impact curve incorporating at least three parameters such as: 1) percent of nominal voltage on the y-axis, 2) duration in cycles and seconds on the x-axis, and 3) percent load impacted (or recovery time) on the z-axis. While the y-axis is presented in units of percent of nominal voltage in the illustrated embodiment, it is understood that the y-axis units may also be in absolute units (e.g., real values such as voltage), or substantially any other descriptor of the y-axis parameter's magnitude. Additionally, while the x-axis is logarithmic in the illustrated embodiment, it is understood that the x-axis does not have to be logarithmic (for example, it can be linear as well). Other parameters, characteristics, metadata, and/or mitigative apparatus could similarly be incorporated into a graph and/or table, for example.

II. Using Non-PQ IEDs to Help Quantify Voltage Event Impact

The ability to quantify the impact of a voltage event may be derived from measured changes in energy, current, or power flows (i.e., consumption). An IED may be used to provide these measurements. The measurements may be acquired in real-time (e.g., via direct MODBUS reads), historically (e.g., logged data), or by some other means.

Power monitoring systems often incorporate a diverse array of IEDs that are installed throughout the energy consumer's electrical system. These IEDs may have different levels of capabilities and feature sets; some more and some less. For example, energy consumers often install high-end (many/most capabilities) IEDs at the location where electrical energy enters their premises ($M_1$ in FIG. 29). This is done to acquire the broadest understanding possible of the electrical signals' quality and quantity as received from the source (typically, the utility). Because the budget for metering is usually fixed and the energy consumer often wants to meter as broadly as possible across their electrical system, conventional wisdom stipulates using IEDs with progressively lower capabilities as the installed meter points get closer to the loads (see FIG. 29, for example). In short, the majority of facilities incorporate many more low/mid-range IEDs than high-end IEDs.

"High-end" metering platforms (and some "mid-range" metering platforms) are more expensive and generally capable of capturing PQ phenomena including high-speed voltage events. "Low-end" metering platforms are less expensive and generally have reduced processor bandwidth, sample rates, memory, and/or other capabilities as compared to high-end IEDs. The emphasis of low-end IEDs, including energy measurements taken in most breakers, UPSs, VSDs, etc., is typically energy consumption or other energy-related functions, and perhaps some very basic PQ phenomena (e.g., steady-state quantities such as imbalance, overvoltage, undervoltage, etc.).

This feature leverages (i.e., interrelates, correlates, aligns, etc.) one or more voltage event indicators, statistical derivations and/or other information from a high-end IED with one or more similar and/or disparate measured parameters from a low-end IED with the goal of quantifying the impact, recovery time, or other event characteristic at the low-end IED. One exemplary method to do this is by using the voltage event timestamp (indicator of the moment a voltage event occurs) from the high-end IED as a reference point for evaluating a measurable parameter corresponding with the same timestamp at a low-end that does not inherently have the capability to capture voltage events. Data evaluated at both the high-end, mid-range, and low-end IEDs may include (but not be limited to) the event magnitude, duration, phase or line values, energy, power, current, sequential components, imbalance, timestamp, pre/during/post-event changes, any other measured or calculated electrical parameter, metadata, meter characteristics, and so forth. Again, the measurements may be acquired in real-time (e.g., via direct MODBUS reads), historically (e.g., logged data), or by some other means.

Another example way to leverage non-PQ IEDs is to extend the use of event alarms (including voltage events) derived from high-end IEDs. For example, when a high-end IED detects a voltage event, coincident data from low-end IEDs is analyzed to ascertain the impact, recovery time, or other event characteristic and/or parameter. If analysis of data from the low-end IED indicates some level of impact did occur, a voltage event alarm, impact alarm, and/or other alarm type may be generated by the system performing the analysis of the coincident data. The alarm information may include any relevant parameter and/or information as measured by the low-end IED, high-end IED, metadata, meter characteristics, load impact, recovery time, which one or more high-end IEDs triggered the low-end IED alarm, and so forth.

Figure 29:
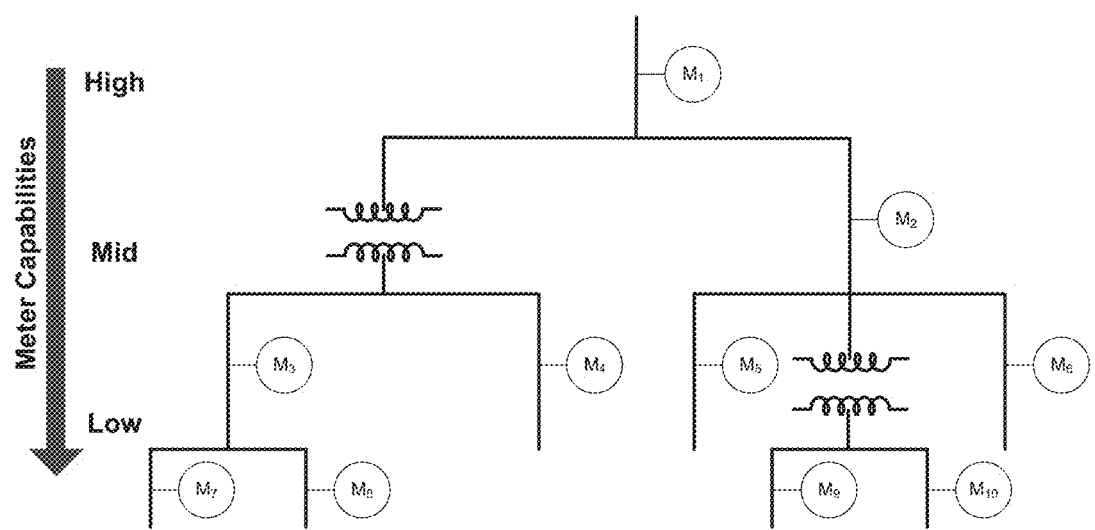
FIG. 29 shows an example of a simple electrical system with a plurality of IEDs.
Figure 30:
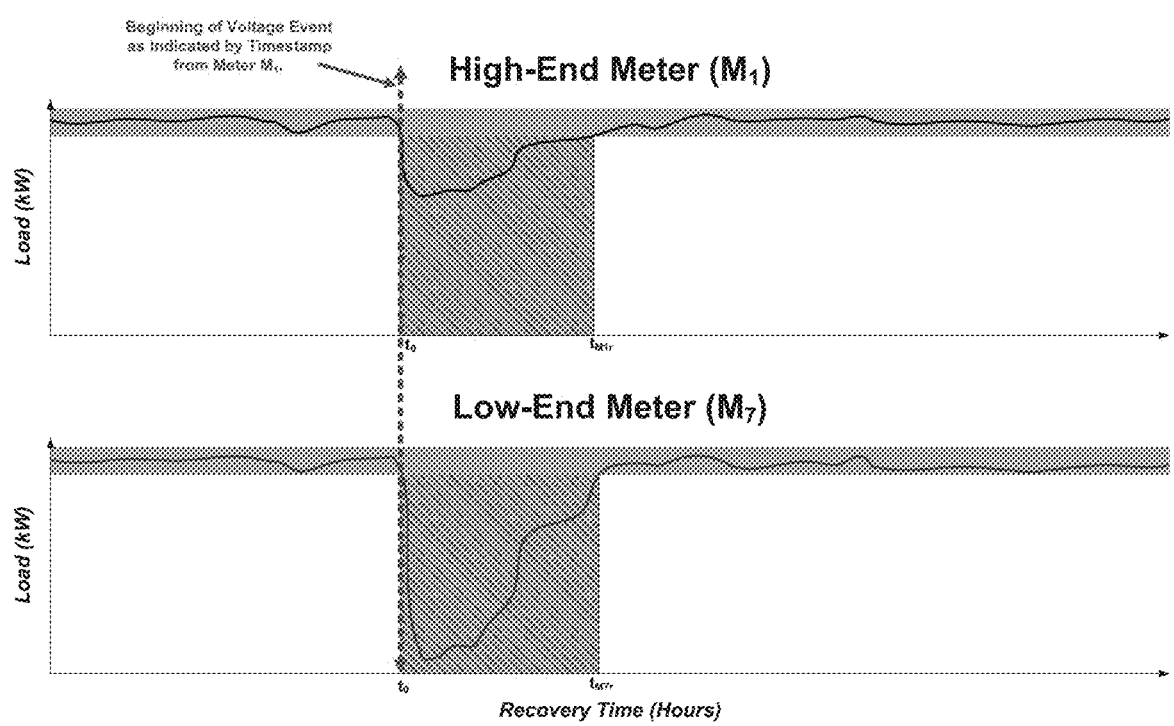
FIG. 30 shows an example recovery timeline for a plurality of IED types experiencing a voltage event.

FIGS. 29 and 30 illustrate a relatively simple example of this embodiment of the disclosure. At time $t_0$, a high-end IED installed a respective metering point or location $M_1$ indicates the beginning of a voltage event. The pre-event load is measured and the recovery time clock begins for the IED installed at the metering location $M_1$. Other relevant data, metrics and/or statistically derived information may also be measured or calculated as required. Simultaneously, the software (on-site and/or cloud-based) and/or hardware managing the metering system evaluates the other connected IEDs to determine whether any other IED installed at another respective metering point or location (e.g., $M_2$, $M_3$, $M_4$, $M_5$, $M_6$, $M_7$, $M_8$, $M_9$, $M_{10}$) concurrently experienced an impactful event. In this example, the IED installed at metering location $M_7$ is found to have experienced a coincident impactful event (the other devices are ignored in this example for the sake of simplicity). The pre-event load is determined from $M_7$ and the recovery time clock begins for $M_7$ using the voltage event's timestamp as a reference. With the IEDs installed at metering locations $M_1$ and $M_7$ identified as impacted by the voltage event, the impact is quantified based on pre/during/post-event electrical parameters (e.g., power, current, energy, voltage, etc.) with to derived from the IED installed at metering location $M_1$ and used as a reference point for both devices $M_1$ and $M_7$. The IED installed at metering location $M_7$ is located downstream from the IED installed at metering location $M_1$ and experiences a more significant relative impact (i.e., bigger percentage of its pre-event load) due to system impedance and uniquely affected loads. The recovery time counters for the IEDs installed at metering locations $M_1$ and $M_7$ are independent of each other, as will be the case for all IEDs. In this example, the IED installed at metering location $M_7$ experiences approximately the same recovery time as the IED installed at metering location $M_1$ (i.e., $t_{M1,r} \approx t_{M7,r}$); however, that may not always be the case since recovery time may be unique at each metered location.

In embodiments, virtual metering may also be used to identify an impact of a voltage event on unmetered loads. For example, there are two electrical paths downstream from the IED installed at metering location $M_1$ in FIG. 30A. The electrical path on the right is metered through a physical IED (e.g., installed at metering location $M_2$); however, the electrical path on the left is not directly metered by a physical IED. If the load data measured by the IEDs installed at metering locations $M_1$ and $M_2$ are measured synchronously or pseudo-synchronously, it is possible to determine (within the accuracy and synchronization constraints of the IEDs installed at metering locations $M_1$ and $M_2$) the load flowing through the unmetered path, $V_1$, by the following equation: $V_1 = M_1 - M_2$. $V_1$ represents a location of a "virtual meter" or a "virtual IED" in the electrical system, and it signifies the difference between the IEDs installed metering locations $M_1$ and $M_2$ for any synchronous (or pseudo-synchronous) load measurement.

Figure 30A:
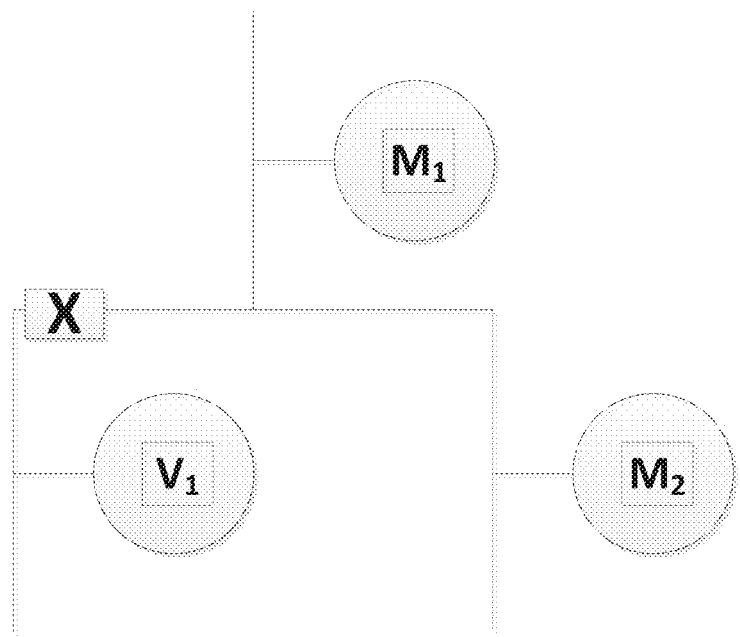
FIG. 30A illustrates an example of virtual metering being used to identify an impact of a voltage event on unmetered loads.

For this example, consider a fault that occurs downstream from the IED installed at metering location $M_1$ and upstream from the virtual meter located at metering location $V_1$ in FIG. 30A. Using the concept of virtual metering as described above, a load change is determined to have occurred in the unmetered path. Because the load data through the unmetered path may be derived from the IEDs installed at metering locations $M_1$ and $M_2$, it is possible to calculate the load impact to the unmetered path due to the fault. In this example, other important parameters related to this embodiment of the disclosure may also be derived from virtual meters including recovery time, economic impact, and so forth.

In one embodiment, the data sample rate (e.g., power, current, energy, voltage, or other electrical parameters) for IEDs installed at metering locations $M_1$, $M_2$, and/or any other IEDs may be dependently or independently increased as required after a voltage event has been indicated in order to provide more accurate results (e.g., recovery time). Data may be shown in a tabular format, graphically in 2-D or 3-D, color coded, as timelines from discrete IEDs, zonally, hierarchically, or as a system (aggregated) view, linearly or logarithmically, or in any other structure or method considered relevant and/or useful. The output of this embodiment may be via report, text, email, audibly, screen/display, or by some other interactive means.

Referring to FIGS. 30B-30I, several example figures are provided to further illustrate the concept of virtual metering in accordance with embodiments of this disclosure. As discussed above, an electrical system typically includes one or more metering points or locations. As also discussed above, one or more IEDs (or other meters, such as virtual meters) may be installed or located (temporarily or permanently) at the metering locations, for example, to measure, protect, and/or control a load or loads in the electrical system.

Figure 30B:
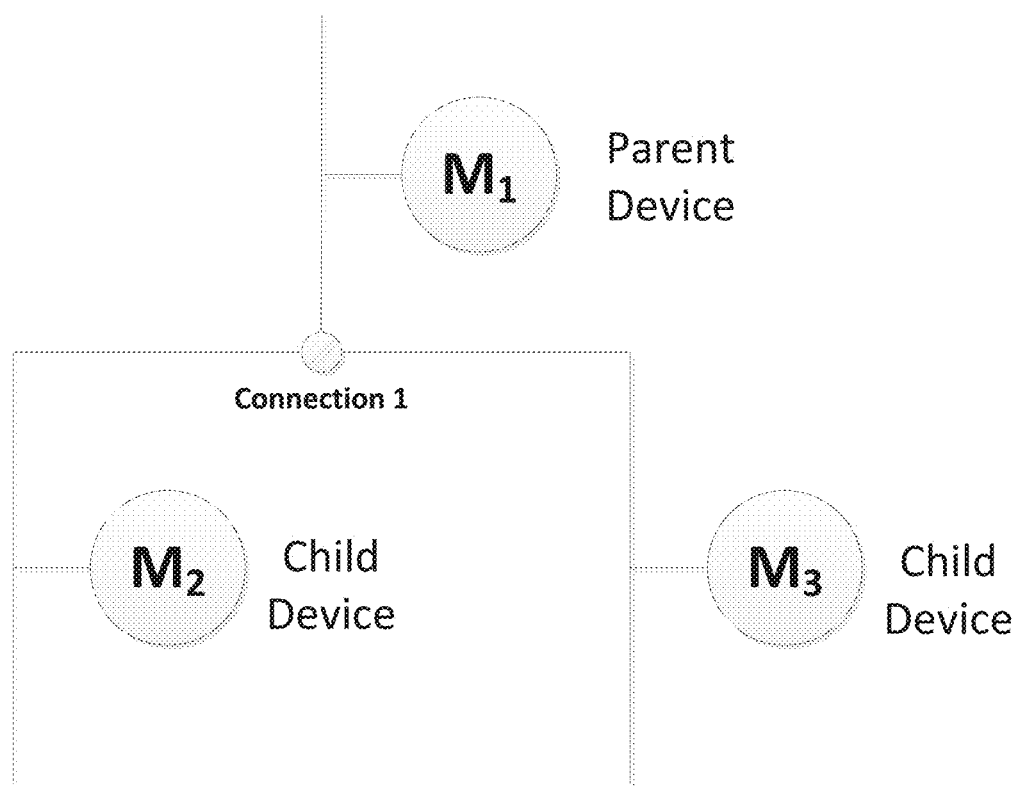
FIG. 30B shows an example electrical system in accordance with embodiments of this disclosure.

Referring to FIG. 30B, an example electrical system including a plurality of metering locations (here, $M_1$, $M_2$, $M_3$) is shown. In the illustrated embodiment, at least one first IED is installed at the first metering location $M_1$, at least one second IED is installed at the second metering location $M_2$, and at least one third IED is installed at the third metering location $M_3$. The at least one first IED is a so-called "parent device(s)," and the at least one second IED and the at least one third IED are so-called "child devices." In the example embodiment shown, the at least one second IED and the at least one third IED are children of the at least one first IED (and, thus siblings with each other), for example, due to the at least one second IED and the at least one third IED both being installed at respective metering locations $M_2$, $M_3$ in the electrical system that "branch" from a common point (here, connection 1) associated with the metering location $M_1$ at which the at least one first IED is installed. Connection 1 is the physical point in the electrical system where the energy flow (as measured at $M_1$ by the at least one first IED) diverges to provide energy to the left and right electrical system branches (as measured at $M_2$ and $M_3$ by the at least one second IED and the at least one third IED, respectively).

Figure 30C:
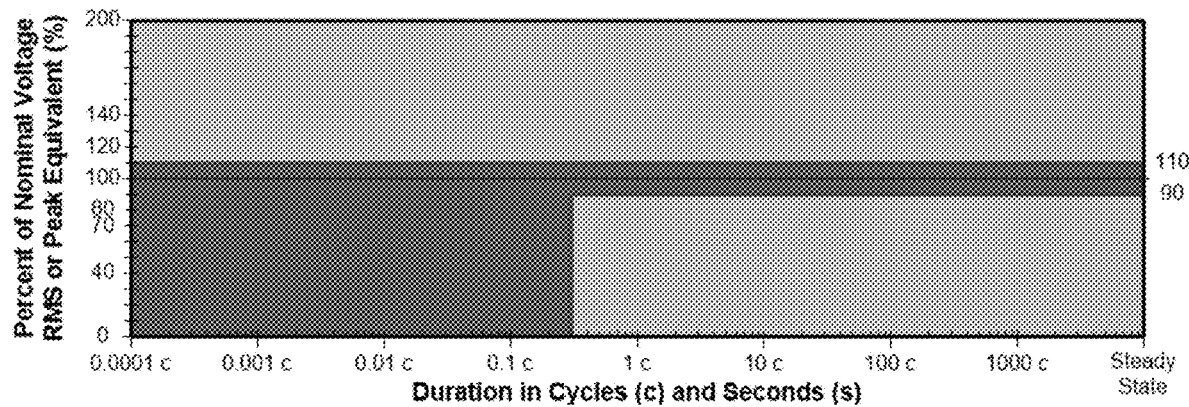
FIGS. 30C-30E show example dynamic tolerance curves in accordance with embodiments of this disclosure.
Figure 30D:
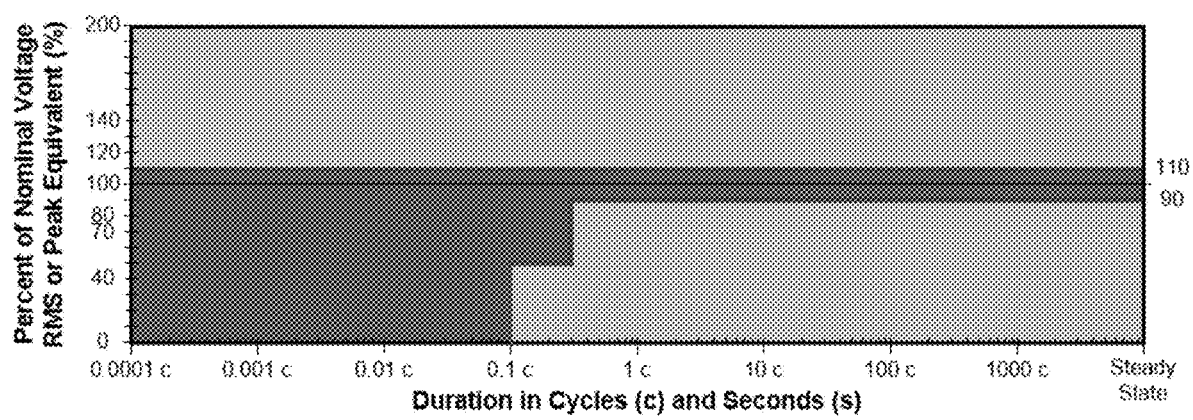
Figure 30E:
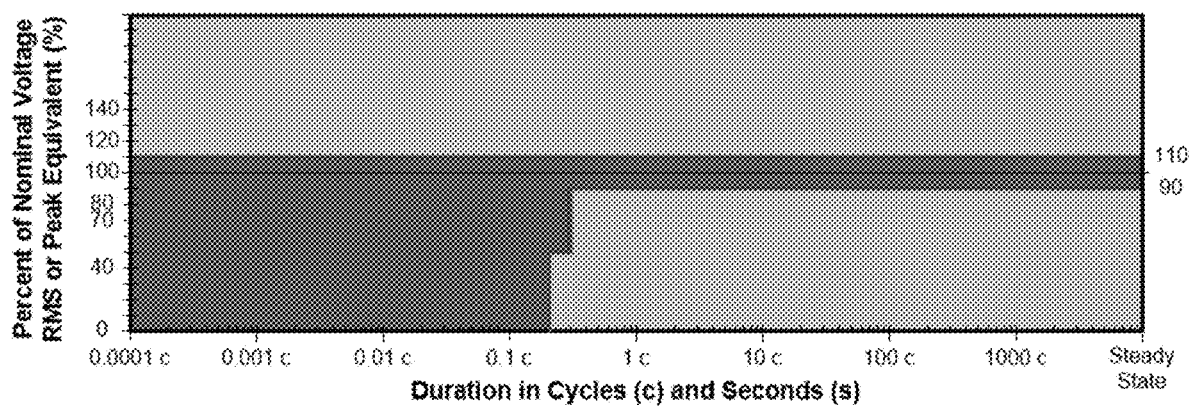

The electrical system shown in FIG. 30B is an example of a "completely metered" system, where all branch circuits are monitored by a physical IED (here, the at least one first IED, the at least one second IED, and the at least one third IED). In accordance with various aspects of this disclosure, dynamic tolerance curves can be independently developed for each discrete metered location ($M_1$, $M_2$, $M_3$) without any dependence on external input(s) from other IEDs. For example, electrical measurement data from energy-related signals captured by the at least one first IED installed at the first metering location $M_1$ may be used to generate a unique dynamic tolerance curve for the metering location $M_1$ (e.g., as shown in FIG. 30C) without any input (or data) from the at least one second IED or the at least one third IED. Additionally, electrical measurement data from energy-related signals captured by the at least one second IED installed at the second metering location $M_2$ may be used to generate a unique dynamic tolerance curve for the metering location $M_2$ (e.g., as shown in FIG. 30D) without any input (or data) from the at least one first IED or the at least one third IED. Further, electrical measurement data from energy-related signals captured by the at least one third IED installed at the third metering location $M_3$ may be used to generate a unique dynamic tolerance curve for the metering location $M_3$ (e.g., as shown in FIG. 30E) without any input (or data) from the at least one first IED or the at least one second IED.

Figure 30F:
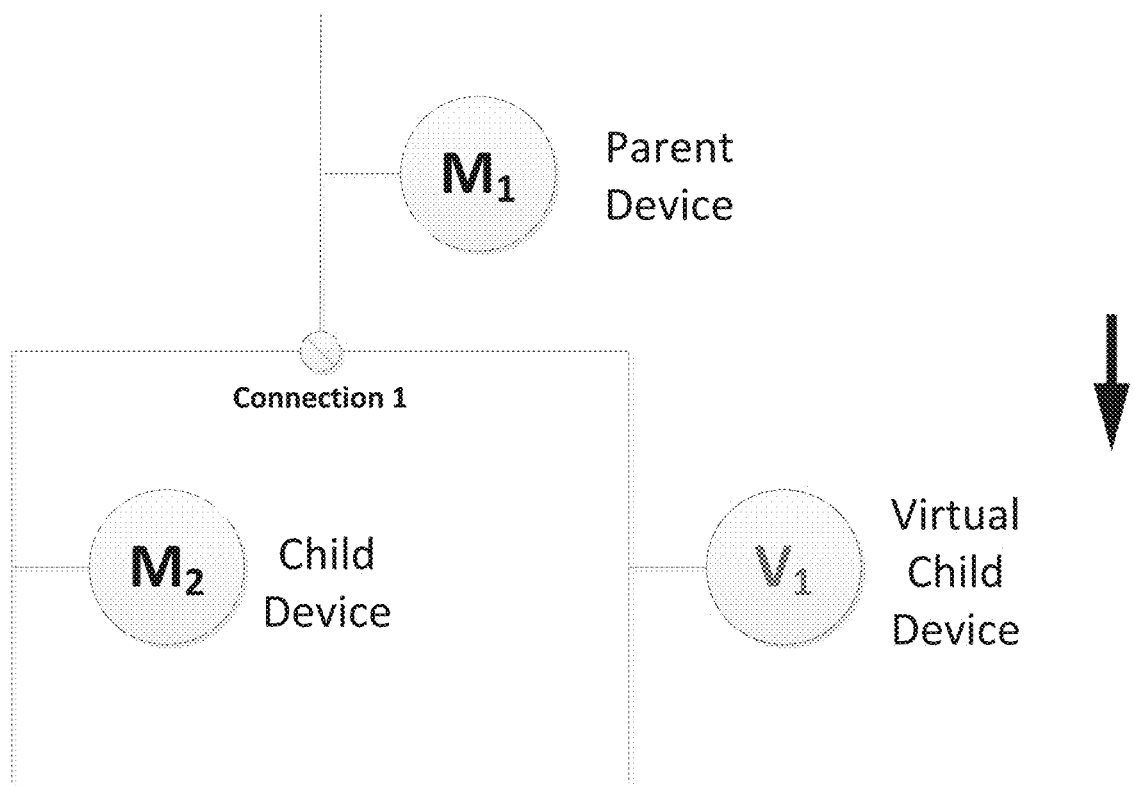
FIG. 30F-30I show further example electrical systems in accordance with embodiments of this disclosure.

Referring to FIG. 30F, in which like elements of FIG. 30B are shown having like reference designations, another example electrical system is shown. Similar to the electrical system shown in FIG. 30B, the electrical system shown in FIG. 30F includes a plurality of metering locations (here, $M_1$, $M_2$, $V_1$). Also, similar to the electrical system shown in FIG. 30B, the electrical system shown in FIG. 30F includes at least one metering device installed or located at each of the metering locations ($M_1$, $M_2$). Here, however, unlike the electrical system shown in FIG. 30B, the electrical system shown in FIG. 30F includes a virtual meter ($V_1$) accordance with embodiments of this disclosure.

In the illustrated embodiment, at least one first IED is installed at a first "physical" metering location $M_1$, at least one second IED is installed at a second "physical" metering location $M_2$, and at least one virtual meter is derived (or located) at a "virtual" (non-physical) metering location $V_1$. The at least one first IED is a so-called "parent device" and the at least one second IED and the at least one virtual meter are so-called "child devices". In the example embodiment shown, the at least one second IED and the at least one virtual meter are children of the at least one first IED (and, thus considered to be siblings with each other). In the illustrated embodiment, the at least one second IED and the at least one virtual meter are installed and derived, respectively, at respective metering locations $M_2$, $V_1$ in the electrical system that "branch" from a common point (here, connection 1) associated with the metering location $M_1$ at which the at least one first IED is installed. Connection 1 is the physical point in the electrical system where the energy flow (as measured at $M_1$ by the at least one first IED)

diverges to provide energy to the left and right branches (as measured at $M_2$ by the at least one second IED, and as calculated for $V_1$ by the at least one virtual meter).

In accordance with embodiments of this disclosure, electrical measurement data associated with the virtual metering location $V_1$ may be created/derived by calculating the difference between the synchronous (or pseudo-synchronous) data from the at least one first IED (here, a parent device) installed at the first metering location $M_1$ and the at least one second IED (here, a child device) installed at the second metering location $M_2$. For example, electrical measurement data associated with the virtual metering location $V_1$ may be derived by calculating the difference between electrical measurement data from energy-related signals captured by the at least one first IED and electrical measurement data from energy-related signals captured by the at least one second IED, at a specific point in time (e.g., $V_1=M_1-M_2$, for synchronous or pseudo-synchronous data). It is understood that virtual meters (e.g., the at least one virtual meter located at virtual metering location $V_1$) may include data from one or more unmetered branch circuits, which are inherently aggregated into a single representative circuit.

The electrical system shown in FIG. 30F is an example of a "partially metered" system, where only a subset of the total circuits is monitored by physical IEDs (here, the at least one first IED and the at least one second IED). In accordance with various aspects of this disclosure, dynamic tolerance curves can be independently developed for each physically metered point ($M_1$, $M_2$) without any dependence on external input(s) from other IEDs. Additionally, in accordance with various aspects of this disclosure, the dynamic tolerance curve for a virtually metered point ($V_1$) is derived using select synchronous (or pseudo-synchronous) and complementary data (e.g., power, energy, voltage, current, harmonics, etc.) from physical IEDs (here, the at least one first IED, and the at least one second IED), and is dependent (sometimes, completely dependent) on these devices (here, the at least one first IED, and the at least one second IED). For example, returning briefly to FIGS. 30C-30E, the dynamic tolerance curve for virtual metered point $V_1$ may be derived from the dynamic tolerance curve data for physical metered points $M_1$, $M_2$ (e.g., as shown in FIGS. 30C and 30D, respectively). Because of this dependency, it is understood that issues (e.g., accuracy, missing data, non-synchronous data, etc.) with the at least one first IED and the at least one second IED will be reflected in the resulting virtual meter data in the illustrated embodiment. In the illustrated embodiment, the dynamic tolerance curve for virtual metered point $V_1$ may be the same as (or similar to) the dynamic tolerance curve shown in FIG. 30E as an example.

Figure 30G:
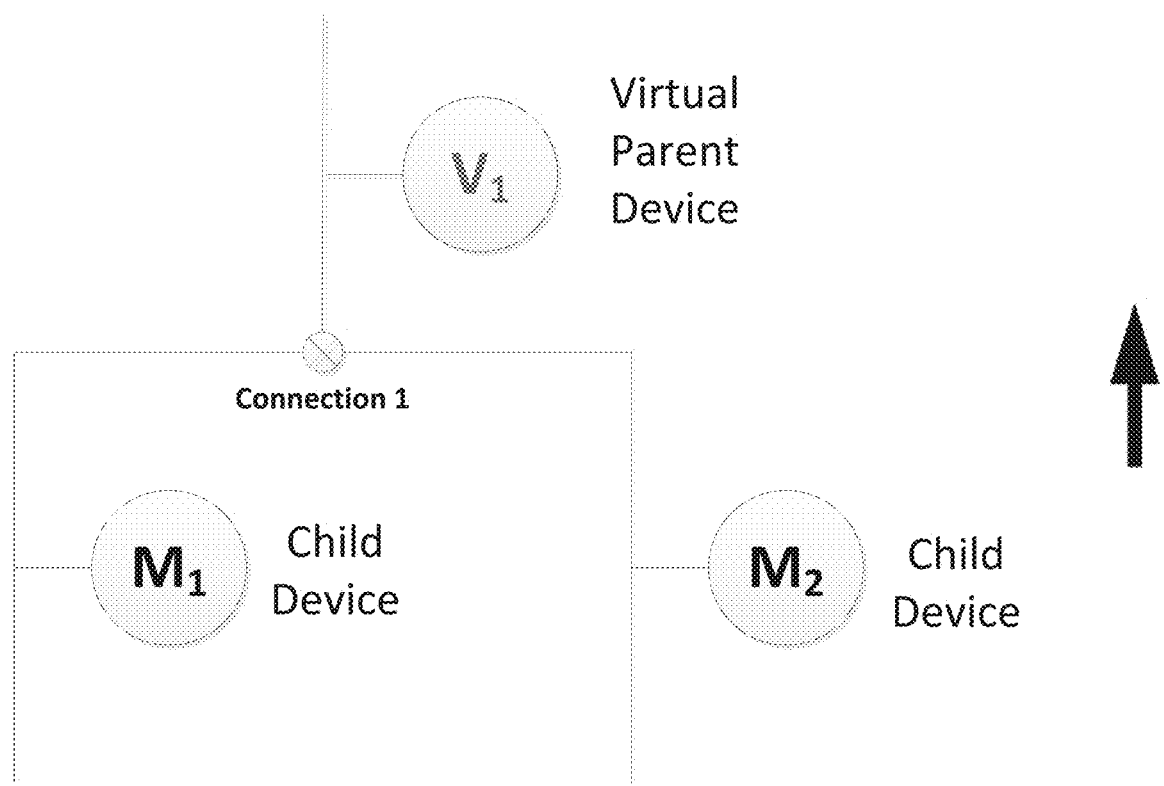

Referring to FIG. 30G, a further example electrical system includes at least one virtual meter located at a "virtual" metering location $V_1$, at least one first IED installed at a first "physical" metering location $M_1$, and at least one second IED installed at a second "physical" metering location $M_2$. The at least one virtual meter is a so-called "parent device" or "virtual parent device," and the at least one first IED and the at least one second meter are "child devices." In the example embodiment shown, the at least one first IED and the at least one second IED are children of the at least one virtual meter (and, thus considered to be siblings with each other).

As illustrated, the at least one first IED and the at least one second IED are both installed (or located) at respective metering locations $M_1$, $M_2$ in the electrical system that "branch" from a common point (here, connection 1) associated with the virtual metering location $V_1$ at which the at least one virtual meter is derived (or located). Connection 1 is the physical point in the electrical system where the energy flow (as calculated at $V_1$) diverges to provide energy to the left and right branches (as measured at $M_1$ and $M_2$ by the at least one first IED and the at least one second IED, respectively).

In accordance with embodiments of this disclosure, electrical measurement data associated with the first metering location $V_1$ is created/derived through a slightly different approach than described above in connection with FIG. 30F, for example. In particular, the electrical measurement data associated with the first metering location $V_1$ may be determined by calculating the summation of synchronous (or pseudo-synchronous) data from the at least one first child IED installed at metering location $M_1$ and the at least one second child IED device installed at metering location $M_2$ (e.g., $V_1=M_1+M_2$, for synchronous or pseudo-synchronous data).

The electrical system shown in FIG. 30G is an example of a "partially metered" system, where only a subset of the total circuits is monitored by physical IEDs. In accordance with various aspects of this disclosure, dynamic tolerance curves can be independently developed for each physically metered point ($M_1$, $M_2$) without any dependence on external input(s) from other IEDs. Additionally, in accordance with various aspects of this disclosure, the dynamic tolerance curve for the virtual parent meter ($V_1$) is derived using select complementary data (e.g., power, energy, voltage, current harmonics, etc.) from physical IEDs ($M_1$, $M_2$), and is completely dependent on these devices ($M_1$, $M_2$). Because of this dependency, it is understood that any issue (e.g., accuracy, missing data, non-synchronous data, etc.) with meters $M_1$ and $M_2$ will be reflected in virtual parent device $V_1$.

Figure 30H:
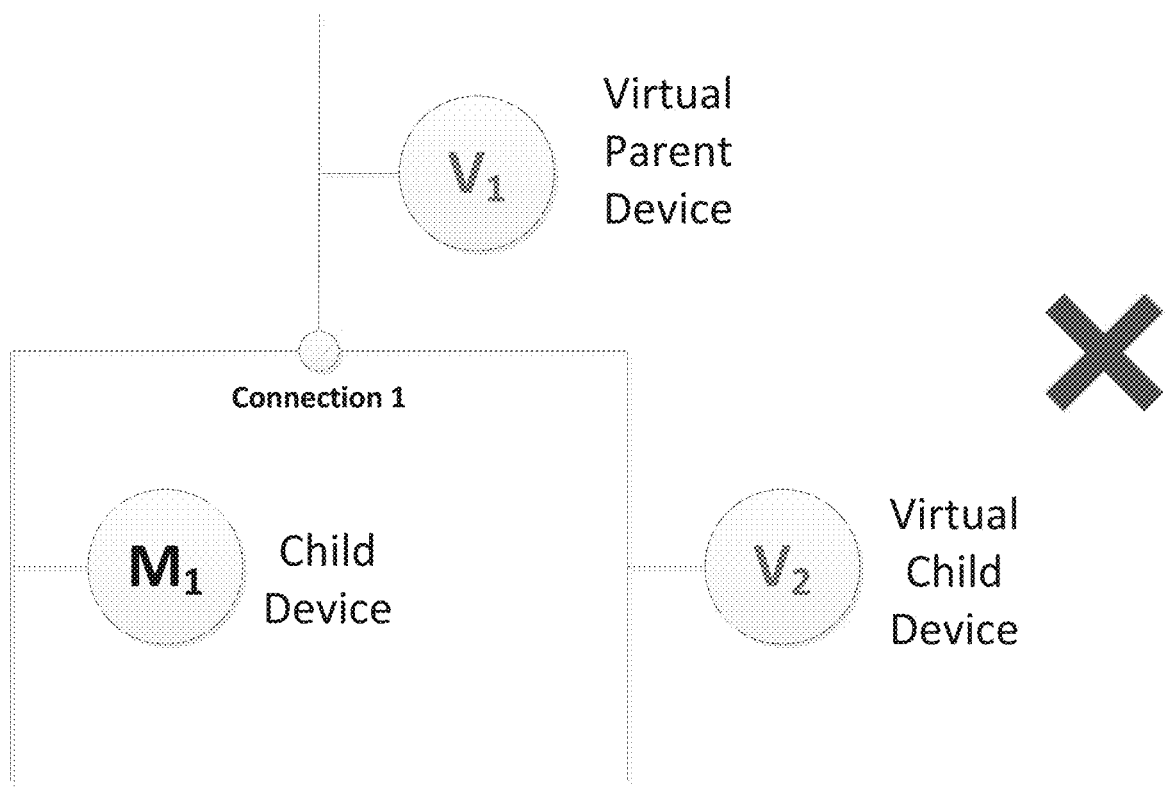

Referring to FIG. 30H, another example electrical system includes at least one first virtual meter located at a first "virtual" metering location $V_1$, at least one first IED installed at a first "physical" metering location $M_1$, and at least one second virtual meter installed at a second "virtual" metering location $V_2$. The at least one virtual meter is a "parent device" or a "virtual parent device", and the at least one first IED and the at least one second virtual meter are "child devices". In the example embodiment shown, the at least one first IED and the at least one second virtual meter are children of the at least one first virtual meter (and, thus considered to be siblings with each other).

As illustrated, the at least one first IED and the at least one second virtual meter are installed and derived, respectively, at respective metering locations $M_1$, $V_2$ in the electrical system that "branch" from a common point (here, connection 1) associated with the first virtual metering location $V_1$ at which the at least first one virtual meter is located (or derived). Connection 1 is the physical point in the electrical system where the energy flow (as calculated at $V_1$) diverges to provide energy to the left and right branches (as measured at $M_1$ by the at least one first IED, and as calculated at $V_2$).

In accordance with some embodiments of this disclosure, the electrical system shown in FIG. 30H is mathematically and probabilistically indeterminate because there are too many unknown values from necessary inputs. Assumptions may be made regarding the occurrence of power quality events (e.g., voltage events) on the virtual devices ($V_1$, $V_2$); however, the impact of the power quality events may impossible (or extremely hard) to define in this case. As is appreciated from discussions above and below, virtual metering data is derived from data taken from physical IEDs. In the embodiment shown in FIG. 30H, there are too few physical IEDs to derive the "virtual" data. FIG. 30H is shown to illustrate some constraints related to virtual IED derivations.

Figure 30I:
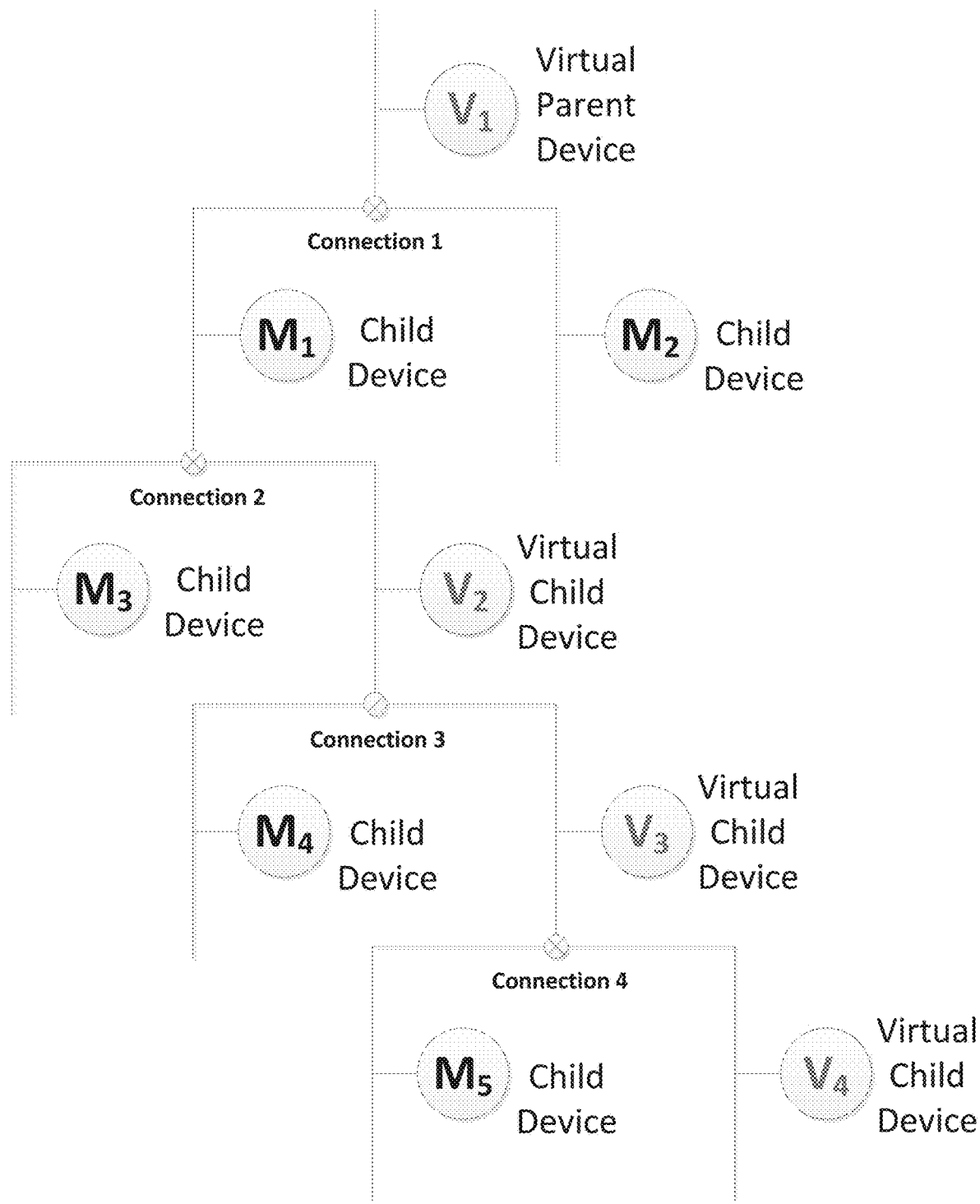

Referring to FIG. 30I, a further example electrical system includes at least four virtual meters (or IEDs) located (or derived) at respective "virtual" metering locations ($V_1$, $V_2$, $V_3$, $V_4$) in the electrical system, and at least five IEDs installed at respective "physical" metering locations ($M_1$, $M_2$, $M_3$, $M_4$, $M_5$) in the electrical system. In particular, the electrical system includes at least one first "parent" virtual meter located at a first "virtual" metering location $V_1$, at least one first "child" IED installed at a first "physical" metering location $M_1$, and at least one second "child" IED installed at a second "physical" metering location $M_2$ (with the at least one first IED at metering location Wand the at least one second IED at metering location $M_2$ being children of the at least one first virtual meter at metering location/position $V_1$). The electrical system also includes at least one third "child" IED installed at a third "physical" metering location $M_3$ and at least one second "child" virtual meter located at a second "virtual" metering location $V_2$ (with the at least one third IED at metering location $M_3$ and the at least one second virtual meter at metering location $V_2$ being children of the at least one first IED at metering location $M_1$).

The electrical system further includes at least one fourth "child" IED installed at a fourth "physical" metering location $M_4$ and at least one third "child" virtual meter located at a third "virtual" metering location $V_3$ (with the at least one fourth IED at metering location $M_4$ and the at least one third virtual meter at metering location $V_3$ being children of the at least one second virtual meter at metering location $V_2$). The electrical system also includes at least one fifth "child" IED installed at a fifth "physical" metering location $M_5$ and at least one fourth "child" virtual meter located at a fourth "virtual" metering location $V_4$ (with the at least one fifth IED at metering location $M_5$ and the at least one fourth virtual meter at metering location $V_4$ being children of the at least one third virtual meter at metering location $V_3$). As illustrated, there are essentially five layers in the metering hierarchy from the first virtual metering location $V_1$, to the fifth "physical" metering location $M_5$ and the fourth "virtual" metering location $V_4$.

The electrical system shown in FIG. 30I illustrates a partially metered system, where only a subset of the total circuits is monitored by physical devices/IEDs. In accordance with various aspects of this disclosure, dynamic tolerance curves can be independently developed for each physically metered location ($M_1$, $M_2$, $M_3$, $M_4$, $M_5$) without any dependence or interdependence on external input(s) from other IEDs. The dynamic tolerance curves for the virtual metering locations $V_1$, $V_2$, $V_3$, $V_4$ may be derived from complementary and synchronous (or pseudo-synchronous) data (e.g., power, energy, voltage, current, harmonics, etc.) as measured by physical IEDs installed at the discretely metered locations $M_1$, $M_2$, $M_3$, $M_4$, $M_5$. Additionally, electrical measurement data from energy-related signals captured by the at least one second IED installed at the second metering location $M_2$ may be used to generate a dynamic tolerance curve for the metering location $M_2$ without any input (or data) from the at least one first IED or the at least one third IED.

In particular, the electrical measurement data associated with the first virtual metering location $V_1$ may be determined (and used to help generate a dynamic tolerance curve for the first virtual metering location $V_1$) by calculating the summation of synchronous (or pseudo-synchronous) data from the at least one first child IED installed at metering location $M_1$ and the at least one second child IED device installed at metering location $M_2$ (e.g., $V_1=M_1+M_2$, for synchronous or pseudo-synchronous data). Additionally, the electrical measurement data associated with the second metering location $V_2$ may be determined (and used to help generate a dynamic tolerance curve for the second virtual metering location $V_2$) by calculating the difference between synchronous (or pseudo-synchronous) data from the at least one first child IED installed at metering location $M_1$ and the at least one third child IED device installed at metering location $M_3$ (e.g., $V_2=M_1-M_3$, for synchronous or pseudo-synchronous data).

The electrical measurement data associated with the third virtual metering location $V_3$ may be determined (and used to help generate a dynamic tolerance curve for the third virtual metering location $V_3$) by first calculating the difference between synchronous (or pseudo-synchronous) data from the at least one first child IED installed at metering location $M_1$ and the at least one third child IED device installed at metering location $M_3$, and then calculating the difference between the first calculated difference and synchronous (or pseudo-synchronous) data from the at least one fourth child IED installed at metering location $M_4$ (e.g., $V_3=M_1-M_3-M_4$, for synchronous or pseudo-synchronous data).

Additionally, the electrical measurement data associated with the fourth virtual metering location $V_4$ may be determined (and used to help generate a dynamic tolerance curve for the fourth virtual metering location $V_4$) by first calculating the difference between synchronous (or pseudo-synchronous) data from the at least one first child IED installed at metering location $M_1$ and the at least one third child IED device installed at metering location $M_3$, and then calculating the difference between the synchronous (or pseudo-synchronous) data from the at least one fourth child IED installed at metering location $M_4$ and the at least one fifth child IED installed at metering location $M_5$. The difference between the first calculated difference and the calculated difference between the synchronous (or pseudo-synchronous) data from the at least one fourth child IED installed at metering location $M_4$ and the at least one fifth child IED installed at metering location $M_5$ may be used to determine the electrical measurement data associated with the fourth virtual metering location $V_4$ (e.g., $V_4=M_1-M_3-M_4-M_5$, for synchronous or pseudo-synchronous data).

As will be further appreciated from discussions below, using event triggers or alarms from one or more of the physical IEDs ($M_1$, $M_2$, $M_3$, $M_4$, $M_5$), it is possible to use pre-event and post-event data from the physical IEDs to develop dynamic tolerance curves, determine event impacts, quantify recovery times, and assess other associated costs at the virtual meters (and metering locations $V_1$, $V_2$, $V_3$, $V_4$). Again, validity of the derived information for the virtual meter ($V_1$, $V_2$, $V_3$, $V_4$) is dependent on the veracity, accuracy, synchronicity, and availability of data from the physical IEDs ($M_1$, $M_2$, $M_3$, $M_4$, $M_5$). In this particular case, there are many interdependencies used to derive data for the virtual meters (and metering locations $V_1$, $V_2$, $V_3$, $V_4$), so it is understood that some deficiency may be experienced for one or more derivations.

It is understood that the above-described examples for determining, deriving, and/or generating dynamic tolerance curves for virtual meters in an electrical system may also apply to aggregation of zones and systems. In spirit of the concepts describing "operational impact," "recovery time," "recovery energy costs," and so forth, it is understood that aggregation may only make sense when it is 1) directly useful to the customer/energy consumer, 2) and/or useful to be leveraged for additional customer and/or business-centered benefits (present or future). That is why the best approach to aggregation is typically to focus on the worst-case scenario (i.e., event impact, event recovery time, other associated event costs, etc.). If aggregation is performed and it does not reflect the customers experience in trying to resolve the event in question, then it is difficult to achieve any usefulness from the aggregation. In short, just because something is mathematically and/or statistically feasible does not necessarily make it useful.

III. Evaluating Load Impact and Recovery Time Using Hierarchy and Dynamic Tolerance Curve Data In embodiments, when a load impacting voltage event occurs, it is important for the energy consumer (or the systems and methods disclosed herein) to prioritize the "what, when, why, where, who, how/how much/how soon, etc." of the response. More specifically: 1) what happened, 2) when did it happen, 3) why did it happen, 4) where did it happen, 5) who's responsible, 6) how do I resolve the issue, 7) how much is it going to cost, and 8) how soon can I get it resolved. Embodiments described herein assist energy consumers with answering these questions.

Understanding and quantifying the impact of voltage (and/or other) events from a IED, zone, and/or system perspective is extremely important for energy consumers to understand their electrical system and facility's operation in its entirety, and to respond to electrical events accordingly. Because each load has unique operating characteristics, electrical characteristics and ratings, functions, and so forth, the impact of a voltage event may differ from one load to the next. This can result in unpredictable behavior, even with comparable loads connected to the same electrical system and located adjacent to each other. It is understood that some aspects of the embodiments described below may refer to or overlap with previously discussed ideas presented herein.

Figure 31:
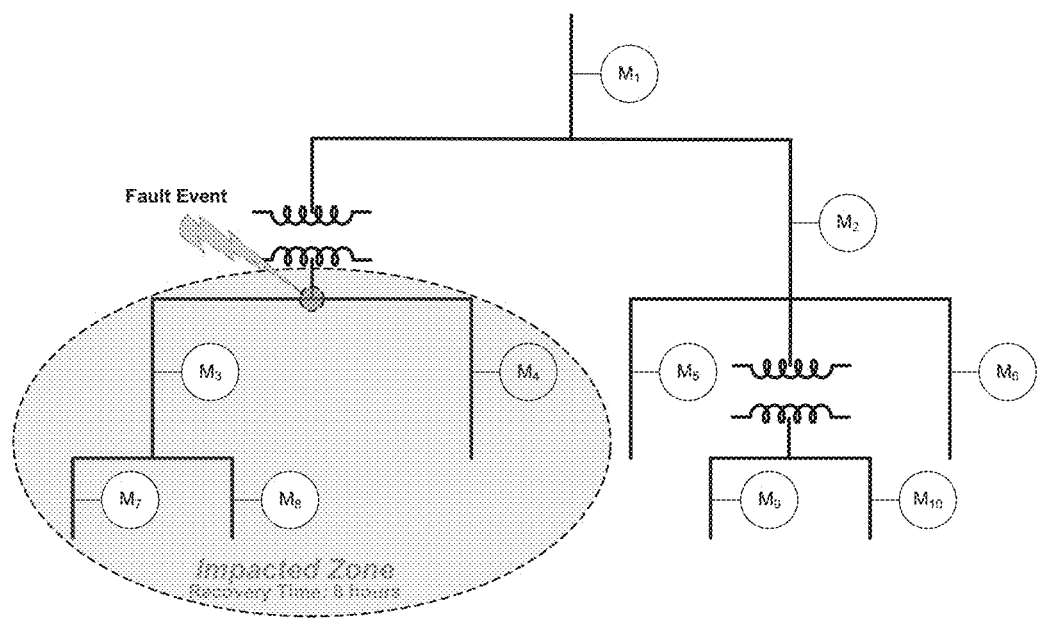
FIG. 31 shows an example fault on the simple electrical system of FIG. 29.

System (or hierarchical) perspectives show how an electrical system or metering system is interconnected. When a voltage event occurs, its impact is strongly influenced by the system impedance and sensitivity of a given load. For example, FIG. 31 illustrates a relatively simple fully-metered electrical system experiencing a voltage event (e.g., due to a fault). In general, the system impedance will dictate the magnitude of the fault, protective devices will dictate the duration of the fault (clearing time), and location of the fault will be an important factor in the scope of the fault's impact to the electrical system. In FIG. 31, its possible (even likely) the shaded area will experience a significant voltage sag followed by an interruption (due to the operation of protective device(s)). In embodiments, the duration of the event's impact will be from the onset time of the fault until the system is again operating normally (note: this example states a recovery time of 8 hours). The unshaded area of the electrical system in FIG. 31 may also experience a voltage event due to the fault; however, the recovery time for the unshaded area will likely be briefer than the shaded area.

In embodiments, both the shaded and unshaded areas of the electrical system shown in FIG. 31 may be impacted by the fault; however, both may exhibit different recovery time durations. If the processes served by both the shaded and unshaded areas are critical to the facility's operation, then the system recovery time will be equal to the greater of the two recovery times.

Figure 32:
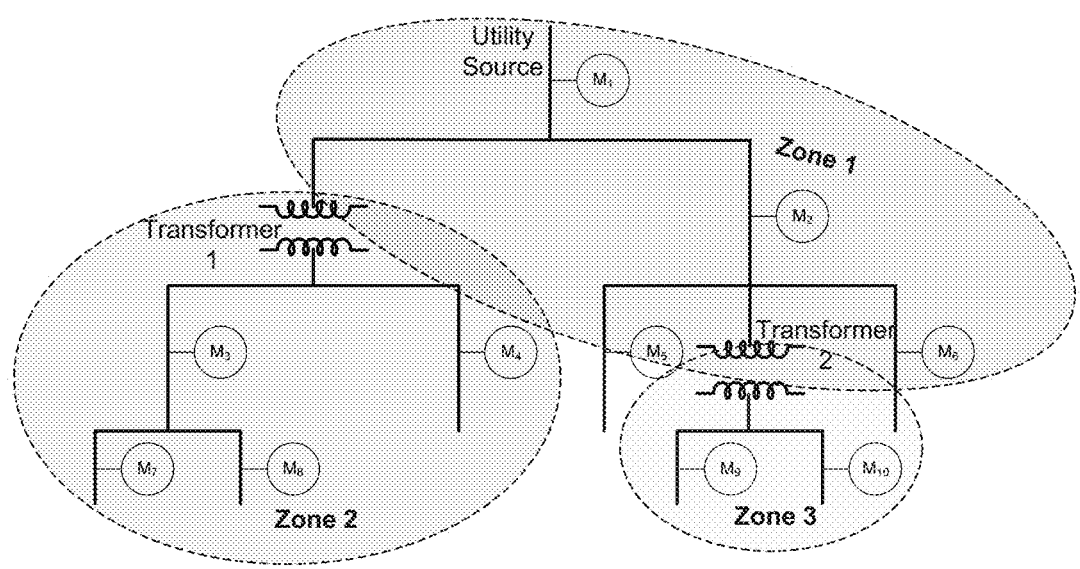
FIG. 32 shows example zones of the simple electrical system of FIG. 29, for example, based on step-down transformer locations.
Figure 33:
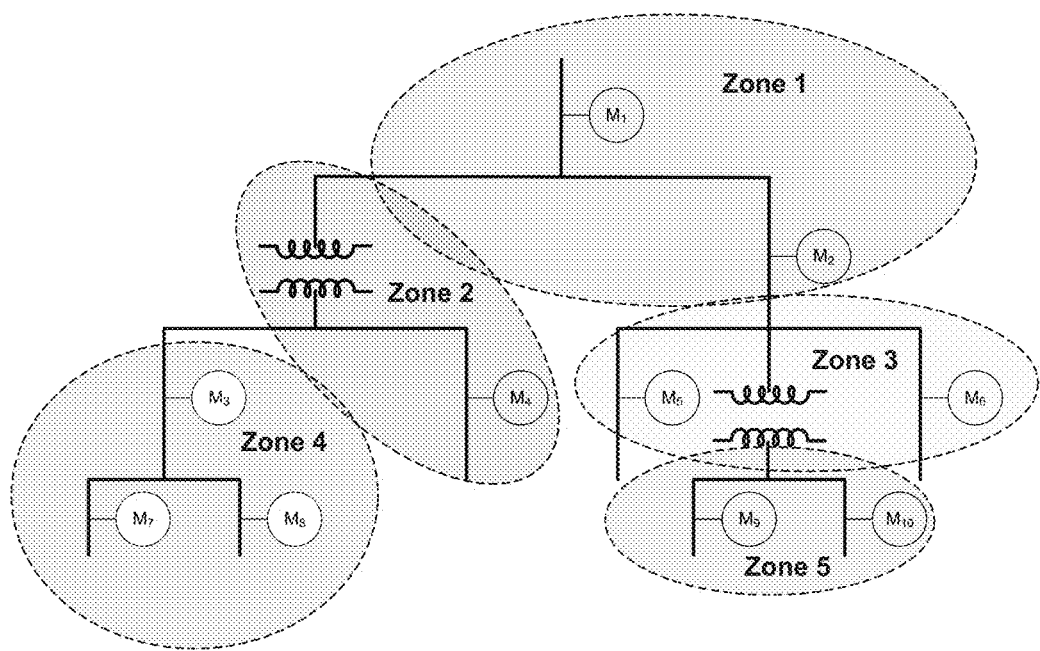
FIG. 33 shows an example customized zone configuration of the simple electrical system of FIG. 29.

In embodiments, it is important to identify and prioritize IEDs, zones, and/or systems. Zones may be determined within the electrical system hierarchy based on: protection schemes (e.g., each breaker protects a zone, etc.), separately derived sources (e.g., transformers, generators, etc.), processes or sub-systems, load types, sub-billing groups or tenants, network communications schemes (e.g., IP addresses, etc.), or any other logical classification. Each zone is a subset of the metering system's hierarchy, and each zone may be prioritized by type and each zone may be assigned more than one priority if applicable (e.g., high priority load type with low priority process). For example, if a protective device also acts as a IED and is incorporated into the metering system, it and the devices below it could be considered a zone. If the protective devices are layered in a coordinated scheme, the zones would be similarly layered to correspond with the protective devices. In FIG. 32, another method to automatically determine zones involves leveraging hierarchical context to evaluate voltage, current, and/or power data (other parameters may also be used as necessary) to identify transformer locations. FIG. 32 indicates three zones: utility source, transformer 1, and transformer 2. FIG. 33 is an exemplary illustration of an energy consumer's custom zone configuration.

Once the zones are established, prioritizing each zone will help the energy consumer better respond to voltage events (or any other event) and their impact. While there are techniques to automatically prioritize zones (e.g., largest to smallest load, load types, recovery times, etc.), the most prudent approach would be for the energy consumer to rank the priorities of each zone. It is certainly feasible (and expected) for two or more zones to have an equal ranking in priority. Once zone priorities are established, it is then possible to analyze the load impact and recovery time for voltage events from a zonal perspective. Again, all of this may be automated using the techniques described above for establishing zones, prioritizing based on the historical effects of voltage events within the electrical system, and providing the energy consumer with analyses summaries based on these classifications.

Zones are also useful for identifying practical and economical approaches to mitigate voltage events (or other PQ issues). Because mitigation solutions can range from system-wide to targeted schemes, it is beneficial to evaluate mitigation opportunities the same way. As shown in FIG. 21 above, for example, mitigation solutions for voltage events become more expensive as the proposed solution moves closer to the electrical main switchgear.

In embodiments, evaluating zones to identify mitigation opportunities of voltage events can produce a more balanced, economical solution. For example, one zone may be more susceptible to voltage events (e.g., perhaps due to a local motor starting) than another zone. It may be possible to provide electrical service to sensitive loads from another zone. Alternatively, it may be prudent to move the cause of the voltage events (e.g., the local motor) to another service point in another zone.

A further example benefit of evaluating zones is the ability to prioritize capital expenditure (CAPEX) investments for voltage event mitigation based on the prioritization of each respective zone. Assuming the zones have been properly prioritized/ranked, important metrics such as percent load impacted (relative), total load impacted (absolute), worst case severity, recovery time, etc. may be aggregated over time to indicate the best solution and location for mitigative equipment. Using aggregated zonal voltage tolerance data from IEDs within the zone may provide a "best-fit" solution for the entire zone or locate a targeted solution for one or more loads within a zone.

IV. Alarm Management of IEDs Using Dynamic Tolerance Curves and Associated Impact Data As discussed above, each location within an electrical system/network generally has unique voltage event tolerance characteristics. Dynamically (continuously) generating the distinct voltage event tolerance characteristics for one or more metered points in the electrical system provides many benefits including a better understanding of an electrical system's behavior at the metered point, suitable and economical techniques for mitigating voltage anomalies, verification that installed mitigation equipment meets its design criteria, leveraging non-PQ IEDs to help characterize voltage event tolerances, and so forth.

Another example advantage of characterizing a IED point's voltage event tolerance is to customize alarms at the IED's point of installation. Using dynamic voltage event characterization to manage alarms provides several benefits including ensuring 1) relevant events are captured, 2) excessive alarms are prevented (better "alarm validity"), 3) appropriate alarms are configured, and 4) important alarms are prioritized.

Existing approaches to alarm configuration and management often include:
- Manual configuration by energy consumer based on standards, recommendations, or guessing.
- Some form of setpoint learning that necessitated a configuration "learning period" to determine what was normal. Unfortunately, if an event occurred during the learning period, it would be considered normal behavior unless the energy consumer caught it and omitted the data point.
- "Capture Everything" approach that requires the energy consumer to apply filters to distinguish which alarms are important and which are not.

In short, the energy consumer (who may not be an expert) could be required to actively discriminate which event alarms/thresholds are important, either before or after the event alarms are captured in a "live system."

Currently, IED voltage event alarms have two important thresholds that are typically configured: 1) magnitude, and 2) duration (sometimes referred to as alarm hysteresis). Equipment/loads are designed to operate at a given optimal voltage magnitude (i.e., rated voltage) bounded by an acceptable range of voltage magnitudes. Additionally, it may be possible for a load to operate outside the acceptable voltage range, but only for short periods of time (i.e., duration).

For example, a power supply may have a rated voltage magnitude of 120 volts rms±10% (i.e., ±12 volts rms). Therefore, the power supply manufacturer is specifying the power supply should not be operated continuously outside the range of 108-132 volts rms. More precisely, the manufacturer is making no promises regarding the power supply's performance or susceptibility to damage outside their prescribed voltage range. Less evident is how the power supply performs during momentary (or longer) voltage excursions/events outside the prescribed voltage range. Power supplies may provide some voltage ride-though due to their inherent ability to store energy. The length of voltage ride-through depends on a number of factors, primarily the amount/quantity of load connected to the power supply during the voltage excursion/event. The greater the load on the power supply, the shorter the power supply's ability to ride-though the voltage excursion/event. In summary, this substantiates the two parameters (voltage magnitude and duration during the voltage event), which also happen to be the same two parameters exemplified in basic voltage tolerance curves. It further validates load as an additional parameter that may be considered where a voltage event's impact and IED alarm thresholds are concerned.

In embodiments of this disclosure, a IED device's voltage magnitude alarm threshold may be initially configured with a reasonable setpoint value (e.g., the load's rated voltage±5%). The corresponding duration threshold may be initially configured to zero seconds (highest duration sensitivity). Alternatively, the IED device's voltage magnitude alarm threshold may be configured for ANY voltage excursion above or below the load's rated voltage (highest magnitude sensitivity). Again, the corresponding duration threshold (alarm hysteresis) may be initially configured to zero seconds (highest sensitivity).

As the metered voltage deviates beyond the voltage alarm threshold (regardless of its configured setpoint), the IED device may alarm on a voltage disturbance event. The IED may capture characteristics related to the voltage event such as voltage magnitude, timestamp, event duration, relevant pre/during/post-event electrical parameters and characteristics, waveform and waveform characteristics, and/or any other monitoring system indication or parameter the IED is capable of capturing (e.g., I/O status positions, relevant time stamps, coincident data from other IEDs, etc.).

Voltage events may be evaluated to determine/verify whether a meaningful discrepancy exists between a pre-event electrical parameter's value (e.g., load, energy, phase imbalance, current, etc.) and its corresponding post-event value. If a discrepancy does not exist (pre-event vs. post-event), the voltage event may be considered to be "non-impactful" meaning there is no indication the energy consumer's operation and/or equipment was functionally affected by the voltage event. The voltage event data may still be retained in memory; however, it may be classified as non-impactful to the energy consumer's operation at the point where the IED captured the voltage event. The existing voltage alarm magnitude and duration threshold setpoints may then reconfigure to the magnitude and duration of the non-impactful event (i.e., reconfigured to less sensitive setpoints). Ultimately, in embodiments the more severe voltage event that does not indicate any operational and/or equipment functional impact at the IED point will become the new voltage magnitude and duration threshold for the voltage event alarms for that respective IED.

If a pre-event vs. post-event discrepancy does exist, the voltage event may be considered to be "impactful" meaning there is at least one indication the energy consumer's operation and/or equipment was functionally affected by the voltage event. The voltage event data may be retained in memory, including all measured/calculated data and metrics related to the impactful event (e.g., % impacted, absolute impact, voltage magnitude, event duration, etc.). Moreover, additional relevant data associated with the voltage event may be appended to the voltage event data record/file at a later time (e.g., calculated recovery time from event, additional voltage event information from other IEDs, determined event source location, metadata, IED data, other electrical parameters, updated historical norms, statistical analysis, etc.). Because the voltage event is determined to be "impactful," the voltage alarm magnitude and duration threshold setpoints are left unchanged to ensure less severe, yet still impactful, events continue to be captured by the IED at its respective installation point within the electrical system.

In embodiments, the final result of this process is the discrete IED device produces a custom voltage alarm template at the point of installation that indicates voltage events (and their respective characteristics) producing impactful events and/or differentiates impactful voltage events from non-impactful voltage events. As more voltage events occur, the custom voltage alarm template more accurately represents the true voltage event sensitivity at the IED's point of installation. In embodiments, it is possible to capture any (or substantially any) voltage event that exceeds any standardized or custom threshold; however, the energy consumers may choose to prioritize impactful events as a distinctive category of alarms/indicators. This could be used, for example, to minimize the inundation of superfluous voltage alarms in the energy consumer's monitoring system by annunciating only prioritized alarms considered to indicate an impactful had occurred.

As indicated above in connection with other embodiments of this disclosure, the tailored voltage tolerance curve built for customized voltage event alarm annunciation could also be used to recommend mitigation equipment to improve ride-through characteristics at the IED's point of installation. Should the energy consumer install mitigation equipment, a manual or automatic indication can be provided/detected by the system so a new version of the voltage tolerance template can be created based on the system modification (e.g., mitigation equipment installation). In embodiments, a practical approach may be a manual indication of supplemental mitigation equipment being added to the system; however, an automatic indication could also be provided based on "uncharacteristic changes" in the electrical system's response to voltage events at the point of the IED's installation, for example. These "uncharacteristic changes" could be established, for example, by statistically evaluating (e.g., via analytics algorithms) one or more electrical parameters (i.e., voltage, current, impedance, load, waveform distortion, and so forth). In embodiments, they may also be identified by any sudden change in voltage event ride through at the point of the IED's installation. A query may be made of the energy consumer or electrical system manager to validate any additions, eliminations or changes to the electrical network. Feedback from the energy consumer could be used to better refine any statistical evaluations (e.g., analytics algorithms) related to voltage events (or other metering features). Historical information (including customized voltage tolerance curves) would be retained for numerous assessments such as verification of the effectiveness of mitigation techniques, impact of new equipment installation to voltage ride-through characteristics, and so forth.

As part of this embodiment, more than two event parameters may be used to configure thresholds to trigger alarms for voltage events. In the description above, the magnitude of voltage deviation and the duration of the voltage event are used configure and trigger voltage event alarms. In embodiments, it is also possible to include more dimensions such as load impact and/or recovery time to configure voltage event alarms. Just as it is possible to set voltage event setpoint thresholds to alarms only when any load is impacted, it is also possible to configure voltage event setpoint thresholds to allow some level of impact to the load. Through load identification, either manually or automatically (based on electrical parameter recognition), it is possible to alarm when only certain types of loads experience an impact due to a voltage event. For example, some loads have certain signatures such as elevated levels of specific harmonic frequencies. In embodiments, it would be possible to trigger a voltage event alarm if those specific harmonic frequencies are no longer evident.

It is possible to use other parameters to customize the alarm templates. For example, the energy consumer may only be interested in voltage events with a recovery times greater than 5 minutes. Voltage event characteristics that typically produce recovery times shorter than 5 minutes could be filtered by using historical event data to configure the alarm templates accordingly. Moreover, energy consumers may only be interested in voltage events that generate monetary losses greater than $500. Again, voltage event characteristics that typically produce monetary losses less than $500 could be filtered using historical data to configure the alarm templates accordingly. As is apparent, any other useful parameter derived from voltage event characteristics may be similarly used to tailor and provide practical alarm configurations. Multiple parameters may also be concurrently used (e.g., recovery times>5 minutes AND monetary losses>$500) to provide more complex alarm schemes and templates, and so forth.

In embodiments, as more voltage events occur, additional voltage pre/during/post-event attributes and parameters are captured at both the discrete and system level and integrated into typical historical characterizations (historical norms). This additional characterization of voltage events can be used, for example, to estimate/predict the expected recovery time from both a discrete and system level. Additionally, recommendations can be made to energy consumers on how to achieve a faster recovery time based on historical event data regarding the effective sequencing to reenergize loads.

In embodiments, customer alarm prioritization can be performed (for voltage events or any other event type) based on the level of load measured at one or more discrete metering/IED points within the electrical system. When some indication is received from a metered/virtual/IED point that a load or loads have changed (or are operating atypically), voltage event alarm setpoint thresholds may be reevaluated and modified based on the level of load measured at one or more discrete (or based on the load's atypical operation). For example, it may be advantageous to null, silence or deprioritize the voltage event alarm when one or more IEDs indicate the measure load is low (indicating the facility is off-line). Conversely, raising the priority of the voltage event alarm would be prudent as one or more IEDs indicate additional loads being started.

As mentioned earlier in this section, in embodiments it is possible to use this feature to prioritize alarms (including voltage event alarms). The IED may be configured to capture data related to substantially any perceptible voltage variation from the nominal voltage (or load(s) rated voltage) at the point of installation, and take an action(s) including storing, processing, analyzing, displaying, controlling, aggregating, and so forth. Additionally, the same action(s) may be performed on substantially any alarms (including voltage event alarms) that exceed some pre-defined setpoint/threshold such as those defined by a dynamic voltage tolerance curve, standard(s), or other recommendations (as derived from any number or combination of electrical parameters, I/O, metadata, IED characteristics, etc.). In embodiments, any or all captured events (including voltage events) may then be analyzed to automatically prioritize the alarms at a discrete, zone and/or system level based on any number of parameters including: alarm type, alarm description, alarm time, alarm magnitude, affected phase(s), alarm duration, recovery time, waveform characteristics, load impact associated with an alarm, location, hierarchical aspects, metadata, IED characteristics, load type, customer type, economic aspects, relative importance to operation or load, and/or any other variable, parameter or combination thereof related to the event (including voltage events) and the energy consumer's operation. Prioritizing may be relevant for the inherent characteristics of discrete events or involve comparisons of more than one event (including voltage events), and may be performed as events originate, deferred to a later time, or dependent on the aforementioned parameters. In embodiments, prioritization may be interactive with the energy consumer, automated, or both with the goal being to facilitate the energy consumer's preferences.

In embodiments, parameters to be considered may include at least electrical data (from at least one phase), control data, time data, metadata, IED data, operational data, customer data, load data, configuration and installation data, energy consumer preferences, historical data, statistical and analytical data, economic data, material data, any derived/developed data, and so forth.

Figure 34:
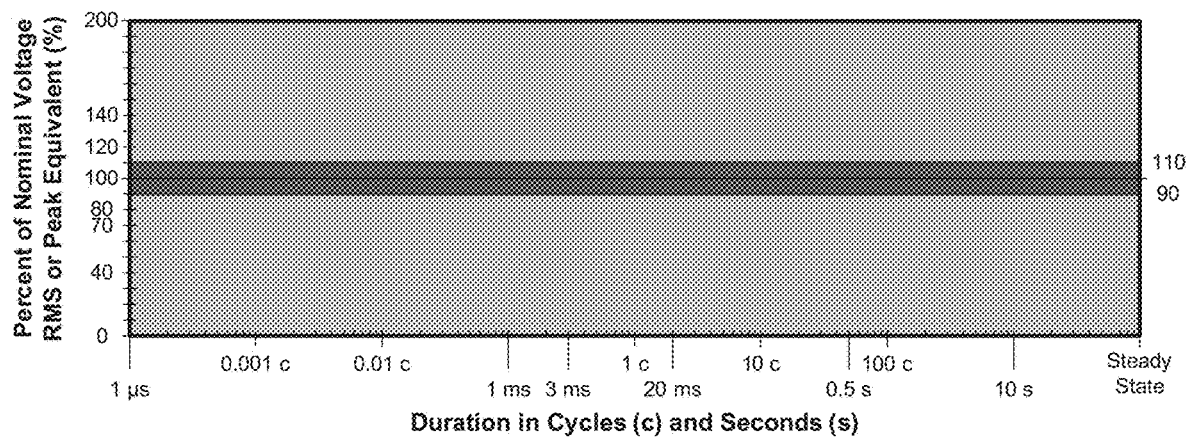
FIG. 34 shows an example of a simple voltage tolerance curve (also sometimes referred to as a power acceptability curve)
Figure 35:
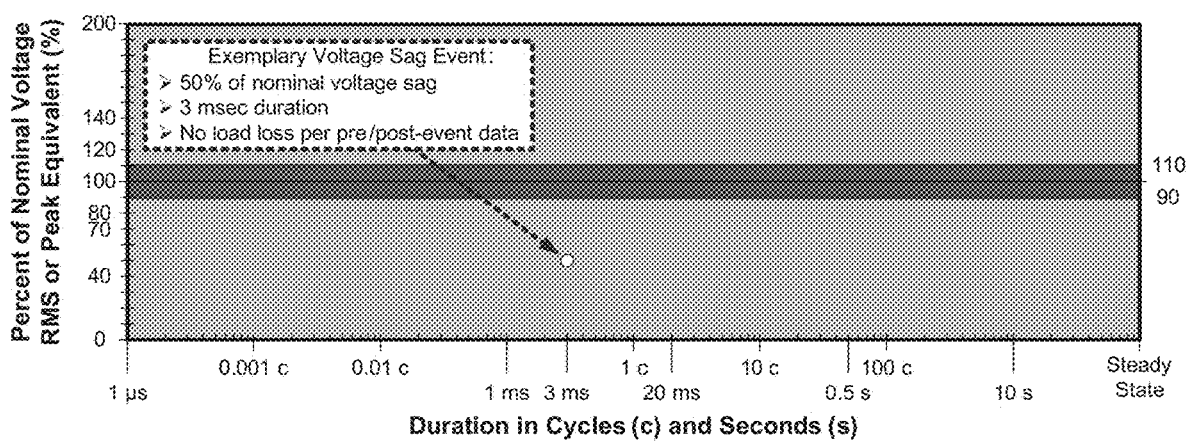
FIG. 35 shows an example voltage sag event shown on the simple voltage tolerance curve of FIG. 34.
Figure 36:
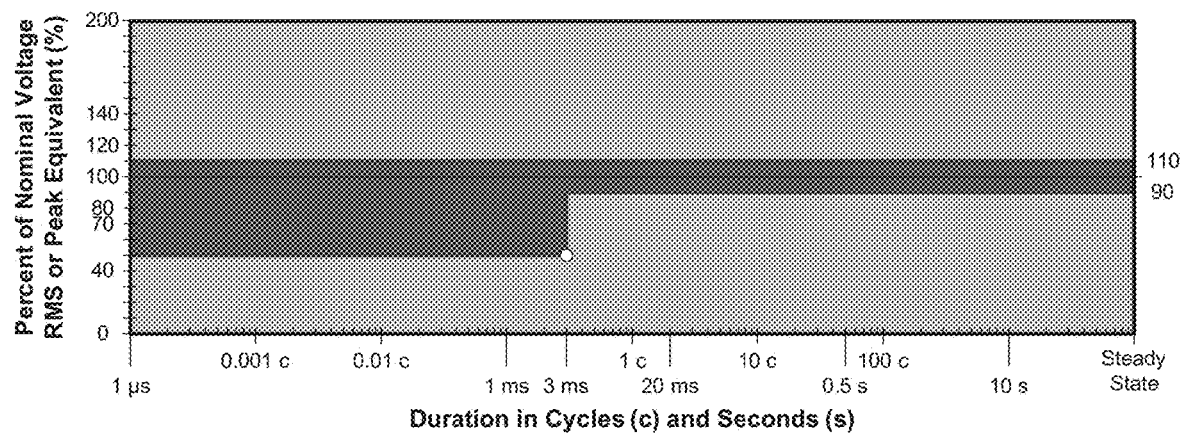
FIG. 36 shows an example updated voltage tolerance curve after the voltage sag event illustrated in FIG. 35.
Figure 37:
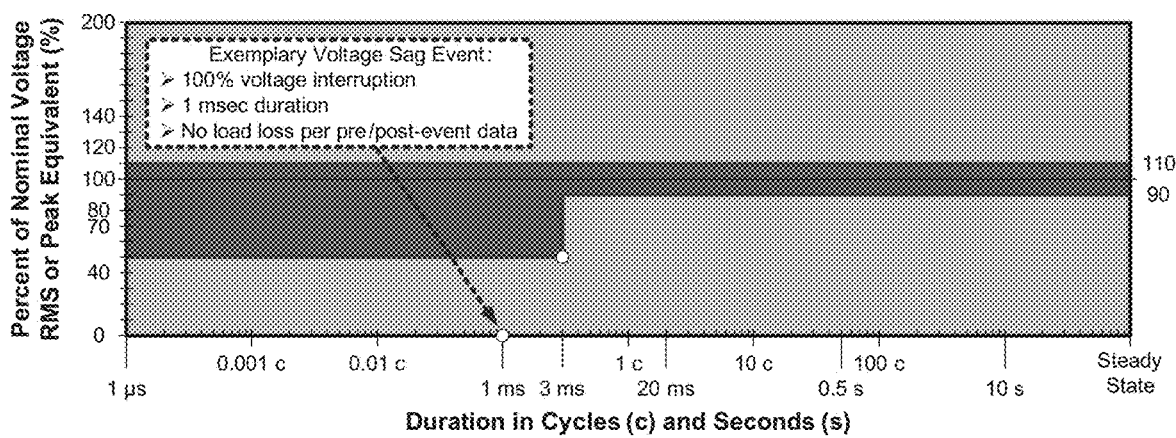
FIG. 37 shows an example second voltage sag event on the voltage tolerance curve illustrated in FIG. 36.
Figure 38:
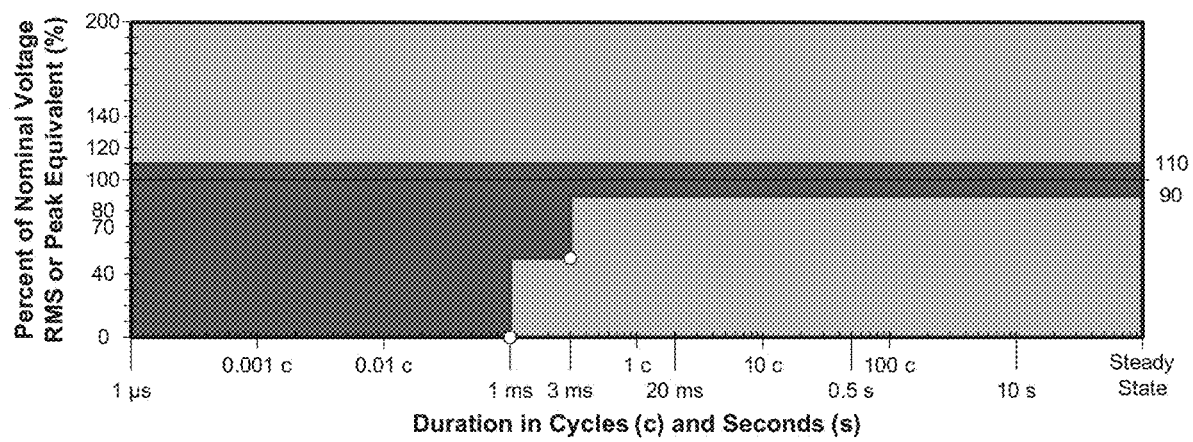
FIG. 38 shows an example updated voltage tolerance curve after the second voltage sag event illustrated in FIG. 37.

For example, FIG. 34 illustrates a relatively simple voltage tolerance curve for an IED with voltage alarm thresholds set at ±10% of the nominal voltage for events arbitrarily ranging from 1 usec to steady-state. In FIG. 35, a voltage sag event occurs on this IED that sags to 50% of the nominal voltage and lasts for 3 milliseconds in duration. Pre/during/post-event analysis of this event indicates no load was impacted. In embodiments, because no load was impacted, the alarm setpoint thresholds in the IED are reconfigured to indicate/prioritize the occurrence of a voltage event when (sometimes, only when) the magnitude and duration of a voltage event are more severe than the event described in FIG. 35. FIG. 36 illustrates changes made to the original voltage-tolerance curve. In short, voltage events occurring in the red area of the graph are expected to be non-impactful and voltage events occurring in the green area of the graph may or may not be impactful. In FIG. 37, another voltage event occurs and is captured by the same IED. In this second voltage event, a voltage interruption (to 0% of the nominal voltage) occurs and lasts for 1 millisecond in duration. Again, pre/during/post-event analysis of the second event indicates no load was impacted. And again, the alarm setpoint thresholds in the IED are reconfigured to indicate/prioritize the occurrence of a voltage event when (sometimes, only when) the magnitude and duration of the voltage event are more severe than the event described in FIG. 36. FIG. 38 illustrates changes made to the original voltage-tolerance curve.

Figure 39:
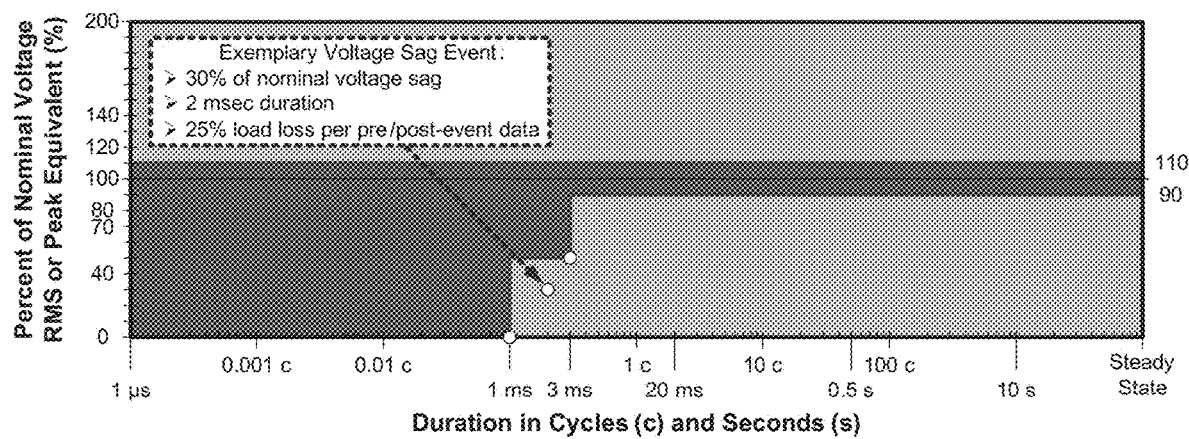
FIG. 39 shows a third example voltage sag event on the voltage tolerance curve illustrated in FIG. 38.
Figure 40:
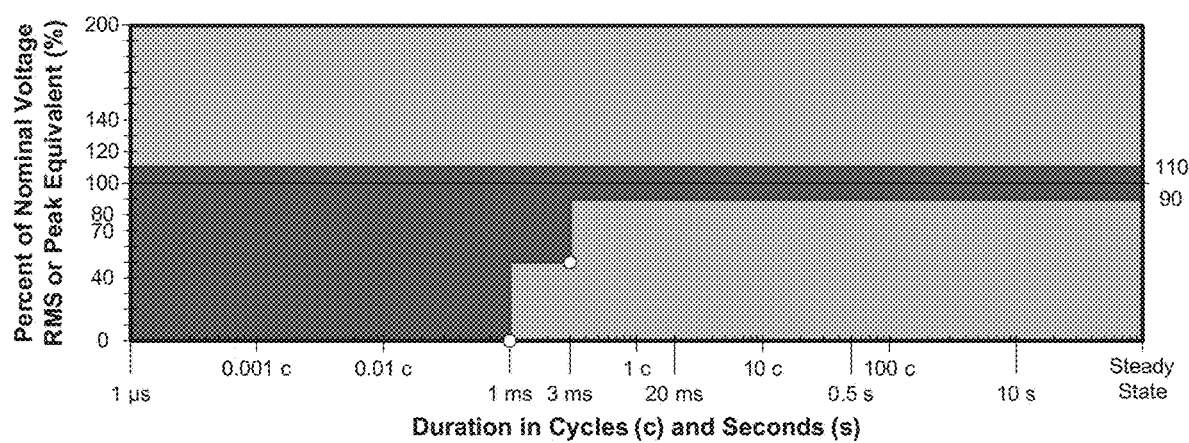
FIG. 40 shows an example voltage tolerance curve after the third voltage sag event illustrated in FIG. 39.

In FIG. 39, a third voltage event occurs and is captured by the IED. In this third voltage event, the voltage sags to 30% of the nominal voltage and lasts for 2 milliseconds in duration. This time the pre/during/post-event analysis of the third event indicates 25% of the load was impacted. Subsequently, the alarms setpoint thresholds are left unchanged because of the 25% impact to the load (i.e., a load impact occurred where it was expected to occur). FIG. 40 illustrates the final settings of the voltage event alarm threshold after these three voltage events. Note that the third event is not shown on the graph because the purpose of this embodiment of the disclosure is to reconfigure/modify voltage event setpoint thresholds. The energy consumer may be notified of the third event occurrence, and the voltage event data, calculations, derivation and any analyses may be stored for future reference/benefits.

V. Evaluating and Quantifying Voltage Event Impact on Energy and Demand

Establishing the losses incurred due to voltage events is often complicated; however, embodiments of this disclosure provide an interesting metric (or metrics) to help quantify the energy and demand contribution to the total losses. When a voltage event occurs, facility processes and/or equipment may trip off-line. The activity of restarting processes and/or equipment consumes energy and can (in some cases) produce a peak demand for the facility. Although these costs are frequently overlooked, they may be considerable over time while contributing little to the actual production and profitability of a facility's operation. There may be ways to recoup some of these costs through insurance policy coverage, tax write-offs in some jurisdictions, and even peak demand "forgiveness" from the utility. Perhaps most importantly, quantifying the financial impact of voltage events to utility bills can provide incentives to mitigate the voltage events leading to these unexpected and potentially impactful losses.

When a voltage event occurs, the analyses described above may be performed to determine the level of impact to the load or operation. If no evidence is found of an impact on a load, process, and/or system, this aspect of this embodiment of the disclosure may be disregarded. If the voltage event is found to have impacted a load, process, and/or system, the pre/during/post-event analyses of electrical parameters are performed. The recovery time clock starts and this embodiment of the disclosure categorizes the energy consumption, demand, power factor, and any other parameter related to the utility billing structure as associated with the recovery time interval. Evaluation and analyses may be performed on these parameters to determine discrete, zonal and/or system metrics (including aggregation), comparisons to historical event metrics, incremental energy/demand/power factor costs and so forth. These metrics may be evaluated against local utility rate structures to calculate the total energy-related costs for recovery, discrete, zonal, and/or systems most susceptible and most costly during the recovery period for targeted mitigation, expectations based on historical voltage event data (e.g., number of events, recovery period of events, energy costs for events, etc.), opportunities to operationally/procedurally improve voltage event response time, and so forth.

In embodiments, the data and analyses collected before, during and/or after the recovery period may be filtered, truncated, summarized, etc. to help the energy consumer better understand the impact of the voltage event (or other event) on their electrical system, processes, operation, response time, procedures, costs, equipment, productivity or any other relevant aspect of their business's operation. It can also provide a useful summary (or detailed report) for discussions with utilities, management, engineering, maintenance, accounting/budgeting, or any other interested party.

VI. Disaggregation of Typical and Atypical Operational Data Using Recovery Time

It is important to recognize a facility's operation during a recovery period is often aberrant or atypical as compared to non-recovery times (i.e., normal operation). It is useful to identify, "tag" (i.e., denote), and/or differentiate aberrant or atypical operational data from normal operational data (i.e., non-recovery data) for performing calculations, metrics, analytics, statistical evaluations, and so forth. Metering/monitoring systems do not inherently differentiate aberrant operational data from normal operational data. Differentiating and tagging operational data as either aberrant (i.e., due to being in recovery mode) or normal provides several advantages including, but not limited to:

1. Analyses (such as the aforementioned) may assume operational uniformity throughout all the data; however, it is useful to disaggregate aberrant or atypical operational patterns from normal operational patterns to better evaluate and understand the significance of the data being analyzed. Data analysis is improved by providing two different categories of operations; normal and aberrant/abnormal/atypical. Each may be analyzed automatically and independently to provide unique and/or more precise information regarding each operational mode within a facility or system. Differentiating normal operational data from atypical operational data (i.e., due to a voltage event) further bolsters decisions made based on the conclusions of analyses.

2. Differentiating normal and aberrant operational modes makes it possible to provide discrete baseline information for each operational mode. This provides the ability to better normalize operation data because atypical data can be excluded from analysis of system data. Additionally, aberrant operational modes may be analyzed to help understand, quantify and ultimately mitigate impacts associated with impactful voltage events. In the case of event mitigation, data analysis of aberrant operational periods will help identify possible more effective and/or economical approaches to reducing the impact of voltage events.

3. Losses incurred due to voltage events are generally difficult to establish; however, evaluations of data tagged (i.e., partitioned, denoted, etc.) as abnormal/aberrant/atypical may be used to identify energy consumption outliers associated with voltage events. This information may be used to help quantify the energy and demand contribution of events to the total losses. When a voltage event occurs, equipment may unintentionally trip off-line. The process of restarting equipment and processes consumes energy and can (in some cases) produce a new peak demand for the facility. Although these costs are frequently overlooked/missed, they may be considerable over time while contributing little to the actual production and profitability of the operation. There may be ways to recoup some of these costs through insurance policy coverage, tax write-offs in some jurisdictions, and even peak demand "forgiveness" from the utility. Perhaps most importantly, quantifying the financial impact of voltage events to utility bills can provide incentive to mitigate the voltage events leading to these unexpected and potentially impactful losses.

VII. Other Evaluations and Metrics Related to Voltage Event Impact and Recovery Time As is known, voltage events including outages are a leading global cause of business interruption-related losses. The annual estimated economic loss for medium and large businesses is estimated to be between $104 billion and $164 billion based on a study by Allianz Global. In embodiments, by incorporating additional economic metadata, it is possible to evaluate individual voltage events to determine the monetary impact of these events. Additionally, in embodiments it is possible to totalize the voltage event impacts by aggregating data and information from individual events. Some example useful financial information to help quantify the economic impact of voltage events include: average material loss/event/hour, utility rate tariffs (as discussed above), average production loss cost/event/hour, estimated equipment loss/event/hour, average $3^{rd}$ party costs/event/hour, or any other monetary metric related to the cost of downtime on a per event or daily/hourly/minutely basis. Using the recovery time from the calculations described above, metrics may be determined for substantially any loss that has been monetarily quantified. These metrics may be determined at a discrete IED, zone and/or system level accordingly.

A number of new voltage event-related indices are set forth herein as useful metrics for qualifying and quantifying voltage events and anomalies. While these new indices focus on voltage sags, in embodiments they may also be considered for any other voltage event or category of power quality event. Example indices include:

Mean Time Between Events (MTBE). As used herein, the term "MTBE" is used to describe the average or expected time a system or portion of a system is operational between events and their subsequent recovery time. This includes both impactful and non-impactful events, so there may or may not be a quantity of recovery time associated with each event.

Mean Time Between Impactful Events (MTBIE). As used herein, the term "MTBIE" is used to describe the average or expected time a system or portion of a system is operational between events and their subsequent recovery time. In embodiment, this metric is limited to only impactful events and will likely have some quantity of recovery time associated with each event.

Mean Time to Restart (MTTR). As used herein, the term "MTTR" is used to describe the average time it takes to restart production at a system or portion of a system (e.g., load, zone, etc.) level. This "average time" includes all (or substantially all) factors involved in restarting production including (but not limited to): repairs, reconfigurations, resets, reinitializations, reviews, retests, recalibrations, restarts, replacing, retraining, relocating, revalidations, and any other aspect/function/work effecting the recovery time of an operation.

Sag rate. As used herein, the term "sag rate" is used to describe the average number of sag-events of a system or portion of a system over a given time period such as hours, months, years (or other time period).

Production Availability. As used herein, the term "production availability" generally refers to the immediate readiness for production, and is defined as the ability of a facility to perform its required operation at a given time or period. This metric focuses on event-driven parameter(s) and may be determined by:

$$PA_i = \frac{MTBIE}{MTBIE + MTTR}$$

In embodiments, systems, zones, and/or discrete IED points may be characterized by their "Number of 9's Production Up-Time," which is an indication of the production availability exclusive of the recovery time duration. Similar to the number of 9's in the usual connotation, this metric may be determined annually (or normalized to an annual value) to provide an indication or metric of the impact of voltage events (or other events) on an operation's productivity. This metric may be useful to help identify mitigation investment opportunities and to prioritize those opportunities accordingly.

In embodiments, it is possible to use the metrics set forth above to estimate/predict recovery time based on historical recovery time information. A voltage event's magnitude, duration, location, metadata, IED characterization, or other calculated/derived data and information, for example, may be used to facilitate these estimations and predictions. This measure may be performed and provided to energy consumers at the discrete IED point, zone, and/or system level as one or more reports, texts, emails, audible indications, screens/displays, or through any other interactive means.

A few examples of supplementary metrics that may be unique to an energy consumer's operation and assist in prioritizing mitigation equipment considerations for placement, investment, etc. include:

Average Zonal Interruption Frequency Index (AZIFI). AZIFI is an example metric that can be used to quantify zones experiencing "the most" interruptions in an electrical system. As used herein, AZIFI is defined as:

$$AZIFI = \frac{\text{number of zone impacts within facility}}{\text{total number of zones in the system}}$$

Zonal Impact Average Interruption Frequency Index (ZIAIFI). ZIAIFI is an example metric that can be used to show trends in zone interruptions along with number of zones affected in electrical system. As used herein, ZIAIFI is defined as:

$$ZIAIFI = \frac{\text{number of zone impacts}}{\text{number of zones that had at least one imapct}}$$

Average Zonal Interruption Duration Index (AZIDI). AZIDI is an example metric that can be used to indicate an overall reliability of the system based on an average of zone impacts. As used herein, AZIDI is defined as:

$$AZIDI = \frac{\text{sum of the recovery time durations of all impacted zones}}{\text{total number of zones in the system}}$$

Zonal Total Average Interruption Duration Index (ZTAIDI). ZTAIDI is an example metric that can be used to provide an indication of the average recovery period for zones that experienced at least one impactful voltage event. As used herein, ZTAIDI is defined as:

$$ZTAIDI = \frac{\text{sum of the durations of all zone impacts}}{\text{number of zones that experienced at least one imapct}}$$

While the foregoing metrics focus on zone-related impacts, in embodiments some or all concepts may be reused for discrete IED points or (in some cases) system impact metrics. It is understood that the purpose here is to document examples of the ability to create useful metrics for energy consumers and their operations; not to define every possible metric or combination thereof.

It is also understood that each of the metrics discussed above may be further determined and partitioned for upstream, downstream, internal (e.g., facility), and external (e.g., utility) voltage event sources as appropriate. The latter two mentioned (internal/external) may require some level of hierarchical classification of the IED and/or electrical system. Other classifications of hierarchies (e.g., protection layout schemes, separately derived sources, processes or sub-systems, load types, sub-billing groups or tenants, network communications schemes, etc.) may be used to create/derive additional useful metrics as needed to better evaluate the impact of voltage events on a facility's operation, for example. Outputs from embodiments of this disclosure may be provided by one or more reports, texts, emails, audible indications, screens/displays, or through any other interactive means. Indications may be provided at the IED, on-site software, cloud, gateway, or other monitoring system component and/or accessory. In embodiments, the outputs and indications may be generated by circuitry and systems according to the disclosure in response to the circuitry and systems receiving and processing respective inputs.

VIII. Voltage Event Recovery Status Tracking

An example method according to the disclosure for reducing recovery time periods includes providing a method of tracking the recovery as it progresses. By identifying and monitoring the recovery periods through discrete IEDs, zones, hierarchies, and/or the system in real-time, the energy consumer (and the systems and methods disclosure herein) is/are better able to identify, manage, and expedite the recovery process for an event throughout their facility. Event recovery tracking allows energy consumers to understand the status of the recovery and make better and quicker decisions to facilitate its recovery. This embodiment would also allow the energy consumer to review historical data to make recovery improvements, produce and/or update recovery procedures, identify zonal recovery constrictions, troublesome equipment, and so forth to improve future event recovery situations (and thus, increase system uptime and availability). Alarming capabilities may be incorporated into recovery situations to provide indications of constraining locations within zones or the facility. Historical recovery metrics or some other configured setpoints may be used to determine recovery alarm threshold settings for IEDs, system software, and/or cloud, and outputs from embodiments of this disclosure may be provided by one or more reports, texts, emails, audible indications, screens/displays, or through any other interactive means.

IX. Developing Various Baselines Related to Voltage Events

Another example method for determining expected recovery times uses factors such as market segments and/or customer types, processes-based evaluations, and/or load and equipment types to determine the expected recovery times. By defining recovery times based on these and other factors, for example, a recovery time baseline or reference can be developed with respect to a voltage event's magnitude, duration, percent load impacted, and/or any other electrical parameter, metadata, or IED specification. The baselines/references may be used to set recovery alarm thresholds, assess recovery time performance and identify opportunities for improvement, estimate actual vs. expected recovery time and costs, improve accuracy of estimates for impactful voltage events, and so forth. Actual historical voltage event impact and recovery time data may be used to produce relevant models through various means including statistical analyses (and/or analytics) and evaluations, simple interpolation/extrapolation, and/or any other method that produces a reasonable typical value(s). Baseline/reference models may range from simple to complex, and may be created or determined for discrete IED locations, zones, or entire systems, and outputs from embodiments of this disclosure may be provided by one or more reports, texts, emails, audible indications, screens/displays, or through any other interactive means.

X. Evaluating Voltage Event for Similarities to Identify Repetitive Behavior

In embodiments, evaluating voltage events across an electrical system to examine event similarity may be useful for energy consumers. Similarities may be in event time of occurrence, seasonality, recovery time characteristics, behavior of electrical parameters, behavior of zonal characteristics, behavior of operational processes, and/or any other notable behaviors or commonalities. Identifying repetitive behaviors and/or commonalities may be an important tactic for prioritizing and resolving voltage event effects. Moreover, analysis/analytics of historical data may provide the ability to predict the system impact and recovery time due to a voltage event after the initial onset of said voltage event.

XI. Voltage Event Forecasting

As mentioned in previous embodiments of the disclosure, it is important to be able to identify beneficial opportunities for energy consumers to mitigate voltage events. Another metric that may be considered is forecasting an estimated number of interruptions, estimated impact, and total recovery time (and associated costs). In embodiments, this metric may be extremely useful for planning purposes, support of capital investment opportunities in voltage event mitigation equipment, and even to forecast expected savings for installing said mitigation equipment. These forecasts may be evaluated at a later point in time to ascertain their accuracy and to fine-tune forecasts and expectations going forward.

XII. Other Graphs and Diagrams Related to Voltage Event Impact and Recovery Time Aside from the various plots (or graphs) discussed in connection with the embodiments described above, there are other additional useful methods to display data related to voltage events. The graphs described below in connection with FIGS. 41-44, for example, are only a few examples of displaying data in a useful format; there may be many other methods to present voltage event data in a meaningful way that can benefit energy consumers. Graphs, charts, tables, diagrams, and/or other illustrative techniques, for example, may be used to summarize, compare, contrast, validate, order, trend, demonstrate relationships, explain, and so forth. These data types may be real-time, historical, modeled, projected, baseline, measured, calculated, statistical, derived, summarized, and/or estimated. Graphs may also be any dimension (e.g., 2-D, 3-D, etc.), color, shade, shape (e.g., line, bar, etc.), etc. to provide a unique and useful perspective.

Figure 41:
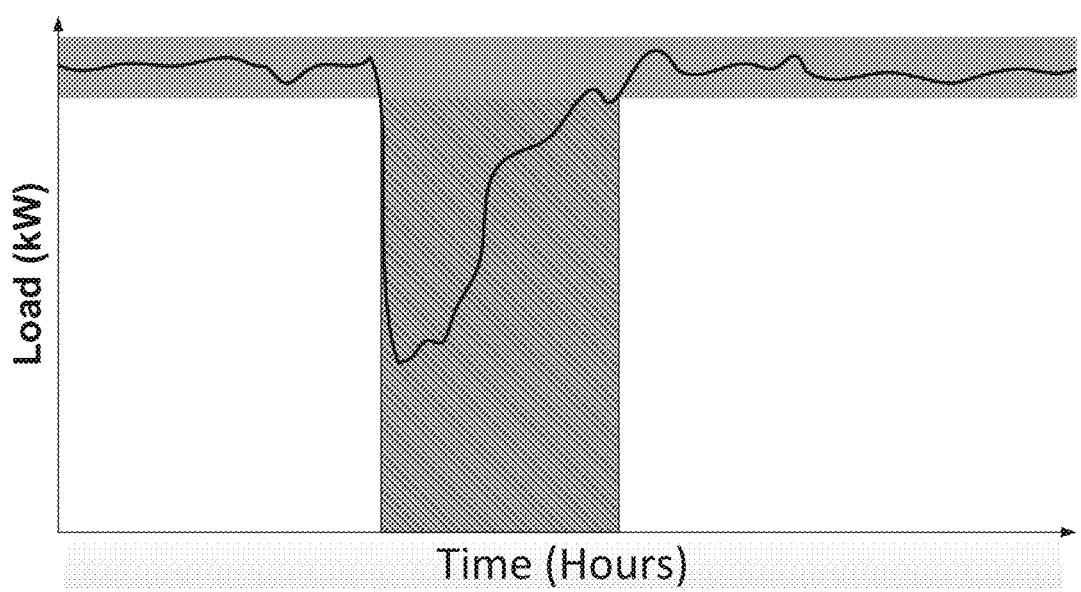
FIG. 41 is a plot showing measured load(s) versus time for an example impactful voltage event.
Figure 42:
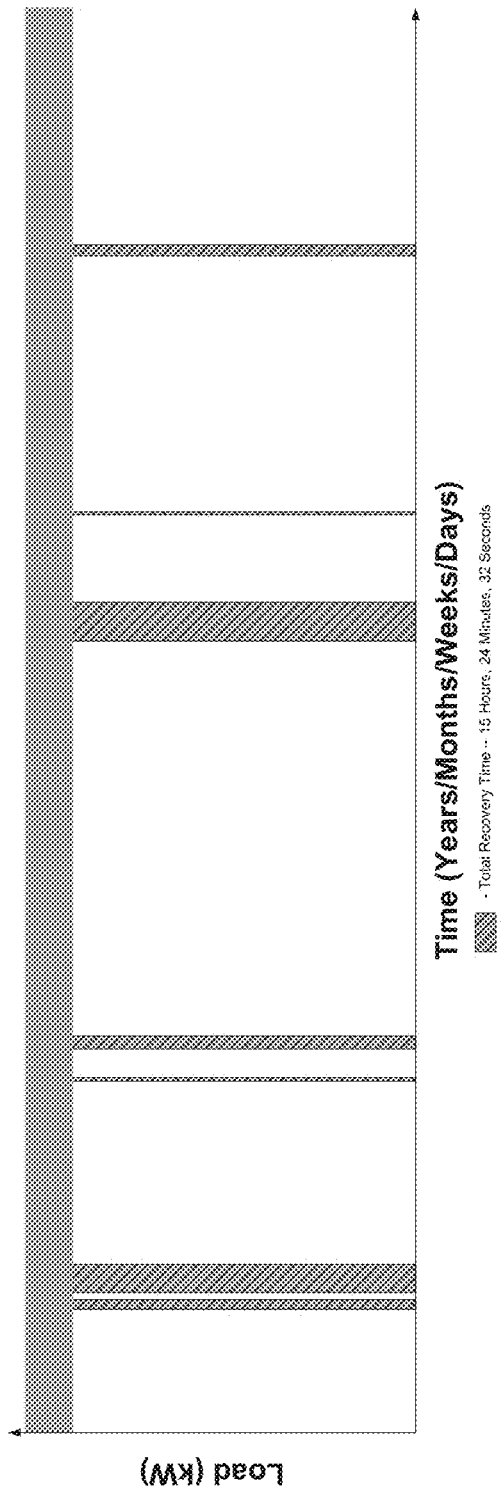
FIG. 42 is a plot showing measured load(s) versus time for multiple example impactful voltage events.
Figure 43:
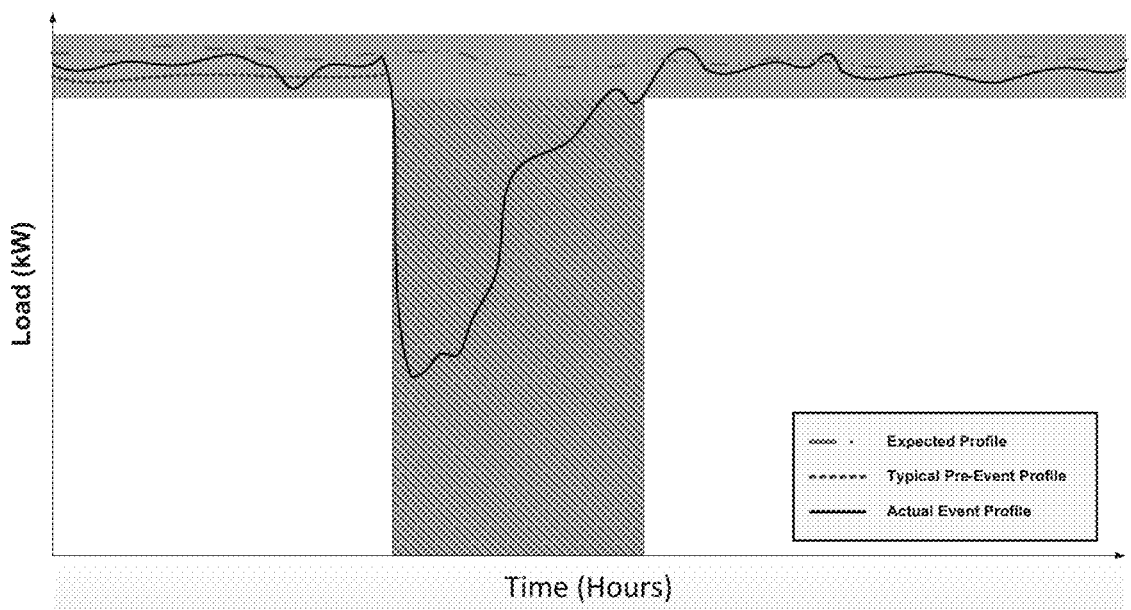
FIG. 43 is a plot showing measured, typical and expected load(s) versus time for an example voltage event.
Figure 44:
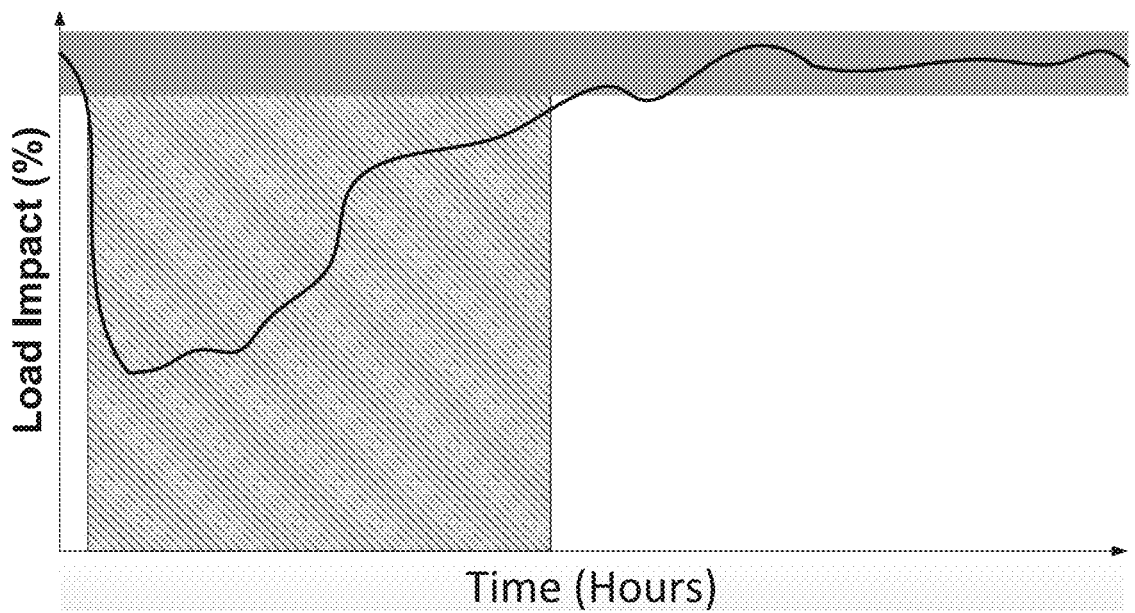
FIG. 44 is a plot showing percent load impact versus time.

FIG. 41 illustrates an example of the load impact versus recovery time for a single event. The green area is indicative of normal or expected range of operational parameters, the shaded orange area is highlighting the recovery time period, and the black line is the load as a function of time. FIG. 42 illustrates an example of a series of impactful events versus their recovery time from a single IED (multiple IEDs could also be used here). In this example, the green area is indicative of normal or expected operational parameters, and the shaded orange highlights the periods when the system has experienced an impactful event and experienced a recovery period. FIG. 43 illustrates an example of additional data being integrated with the data shown in FIG. 41. In this example, the green area is indicative of normal or expected range of operational parameters, the shaded orange is highlighting the recovery time period, the black line is showing the load as a function of time, the dashed pink line is showing the expected load as a function of time, and the dashed blue line shows a typical pre-event profile. As a rule of thumb, the behavior of upstream events may be more unpredictable than downstream events over time. FIG. 44 illustrates an example of pre/during/post-event percent of load impact versus recovery time for a voltage event. Again, different variables, metrics parameters, characteristics, etc. may be graphed, illustrated, etc. shown as needed or useful.

XIII. Aggregation/consolidation of Voltage Event Impact and Recovery Time Data

As is known, voltage events are often extensive, impacting multiple loads, processes, and even the entire system concurrently. In embodiments, metering systems according to the disclosure may exhibit multiple alarms from different IEDs located across the facility. Source events generally impact the entire system, for example, resulting in every (or substantially every) capable IEDs indicating an event has occurred.

In embodiments, aggregating/consolidating the multitude of voltage event data, alarms and impacts across a system is important for several reasons. First, many energy consumers have a tendency to ignore "alarm avalanches" from monitoring systems, so aggregating/consolidating voltage event data decreases the number alarms the energy consumer has to review and acknowledge. Second, the data from a flurry of alarms is often the result of one voltage event coming from the same root cause. In this case, it is much more efficient to reconcile all coincident voltage events captured by multiple IEDs into a single event for reconciliation. Third, bundled voltage events are much easier to analyze than independent voltage events as most of the relevant data and information is available in one place. For the sake of brevity, there are many other reasons to aggregate/consolidate voltage events not listed here.

The ability to aggregate/consolidate the impact of voltage events and their often-accompanying recovery times is important because it helps avoid redundancy of event data. Redundant event data can skew metrics and exaggerate conclusions, which may results in flawed decisions. This disclosure focuses on three layers of aggregation/consolidation within electrical systems: IED, zonal and system.

In embodiments, the first layer (IED) requires minimal aggregation/consolidation because data is acquired from a single point/device and (hopefully) the device shouldn't be producing redundant information within itself from voltage events. In some cases, there may be somewhat superfluous alarm information from a single device. For example, a three-phase voltage event may provide one alarm for each of the three phases experiencing the voltage event. Moreover, an alarm may be triggered for both the event pickup and dropout, resulting in six total voltage event alarms (a pickup and dropout alarm for each of the three phases). While this example of alarm abundance may be bothersome and confusing, many devices and monitoring systems already aggregate/consolidate multiple event alarms as just described into a single event alarm. In some embodiments, a single voltage event alarm may be provided from each IED for each voltage event that occurs in the electrical system.

It was mentioned above that a voltage event often impacts multiple IEDs within a monitoring system; specifically, those that are capable of capturing anomalous voltage conditions. Since zones and systems typically consist of multiple IEDs, the need to aggregate/consolidate the impact and subsequent repercussions of voltage events lies with these two (zones and systems). Although a zone may encompass an entire system, zones are configured as a subset/subsystem of the electrical and/or metering system. However, because zones and systems both generally consist of multiple devices, they will be treated similarly.

In embodiments, there are different methods/techniques to aggregate/consolidate zones. A first example method includes evaluating the voltage event impact and recovery time from all IEDs within a particular zone and attributing the most severe impact and recovery time from any single IED within that zone to the entire zone. Because the event impact and recovery time are independent variables, and therefore may be derived from different IEDs, these two variables should be treated independently from each other. Of course, it would be important to track which zonal device was considered/recognized as having experienced the most severe impact and which zonal device experienced the longest recovery time. This same approach could be used for systems by leveraging the conclusions generated from the zone evaluations. Ultimately, the recovery time for a system is not completed until all relevant IEDs indicate that is the case.

A second example method includes assessing a voltage event within a zone by using statistical evaluations (e.g., average, impact and average recovery time, etc.) from all IEDs with a particular zone. In this case, the severity of a voltage event may be determined for the entire zone by statistically appraising data from all IEDs and providing results to represent the entire zone for each particular voltage event. Statistical determinations including means, standard deviations, correlations, confidence, error, accuracy, precision, bias, coefficients of variation, and any other statistical methods and/or techniques may be employed to aggregate/consolidate the data from multiple IEDs to a representative value or values for the zone. The same statistical approach may be used to combine zones into representative metrics/values for system impact and recovery time. Again, the recovery time for a system will be contingent on each relevant IED indicating that is the case.

Another example method to evaluate voltage events is by load-type. In embodiments, the energy consumer (or systems and method disclosed herein) may choose to categorize and aggregate/consolidate loads by similarity (e.g., motors, lighting, etc.) regardless of their location within the facility's electrical system, and evaluate the impact and recovery time of those loads accordingly. It would also be possible to evaluate voltage events by their respective processes. By aggregating/consolidating loads (regardless of type, location, etc.) associated with the same process, the impact and recovery time could be quantified for said process. Another method to aggregate/consolidate voltage events is by sources and/or separately derived sources. This approach would help quantify the impact and recovery time of a voltage event as it related to the energy source within the facility (or out on the utility network). Other useful and logical methods to aggregate/consolidate voltage event information from two or more IEDs may be considered as well (e.g., by building, by product, by cost, by maintenance, and so forth).

In embodiments, a fundamental purpose of aggregating/consolidating voltage event data is to identify opportunities to decrease these events' overall impact on the energy consumer's business to reduce downtime and make it more profitable. One or more of the methods (or combinations of methods) described herein may be used to meet this objective. It may be useful or even required to have one or more of these methods configured by the energy consumer (or surrogate), or the system and methods disclosed herein. The ability to consider the voltage event impact and recovery time at discrete IEDs is not mutually exclusive from any approach to consider and evaluate aggregated/consolidated voltage event impact and recovery time.

Another interesting prospect would be evaluating the performance of the energy consumer's operation after the initial voltage event occurs. For example, a voltage event may result in one load tripping off-line. Shortly after, another related load may also trip off-line as a result of the first load tripping; not due to another voltage event. The extent of this chain reaction/propagation would be of interest when determining consequences of providing ride-through mitigation for the first load. In this example, providing a timeline of load reactions over the recovery period due to the original voltage event may be prudent to help minimize the overall impact of voltage events on the energy consumer's operation.

In embodiments, outcomes from analyses of the voltage and current data apply to the point in the network where the IED capturing the data is connected. Each IED in the network may typically yield distinct analyses of the event, assuming each IED is uniquely placed. As used herein, the term "uniquely placed" generally refers to the location of the installation within the electrical system, which impacts impedance, metered/connected loads, voltage levels, and so forth. In some cases, it may be possible to interpolate or extrapolate voltage event data on a case-by-case basis.

In embodiments, in order to accurately characterize power quality events (e.g., voltage sags) and their subsequent network impact(s), it is important to measure the voltage and current signals associated with the event. Voltage signals can be used to characterize the event, current signals can be used to quantify the event's impact, and both voltage and current can be used to derive other relevant electrical parameters related to this disclosure. Although outcomes from analyses of the voltage and current data apply to the point in the network where the IED capturing the data is connected, it may be possible to interpolate and/or extrapolate voltage event data on a case-by-case basis. Each IED in the network typically yields distinct analyses of the event, assuming each IED is uniquely placed.

In embodiments, there are multiple factors that can influence the impact (or non-impact) of a voltage sag. The impedance of the energy consumer's electrical system may cause voltage events to produce more severe voltage sags deeper into the system hierarchy (assuming a radial-fed topology). Voltage event magnitudes, durations, fault types, operational parameters, event timing, phase angles, load types, and a variety of other factors related to functional, electrical, and even maintenance parameters can influence the effects of voltage sag events.

It is understood that any relevant information and/or data derived from IEDs, customer types, market segment types, load types, IED capabilities, and any other metadata may be stored, analyzed, displayed, and/or processed in the cloud, on-site (software and/or gateways), or in a IED in some embodiments.

Referring to FIGS. 45-48, several flowcharts (or flow diagrams) are shown to illustrate various methods of the disclosure. Rectangular elements (typified by element 4505 in FIG. 45), as may be referred to herein as "processing blocks," may represent computer software and/or IED algorithm instructions or groups of instructions. Diamond shaped elements (typified by element 4525 in FIG. 45), as may be referred to herein as "decision blocks," represent computer software and/or IED algorithm instructions, or groups of instructions, which affect the execution of the computer software and/or IED algorithm instructions represented by the processing blocks. The processing blocks and decision blocks can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, features from one of the flowcharts described below may be combined with features of other ones of the flowcharts described below, for example, to capture the various advantages and aspects of systems and methods associated with dynamic tolerance curves sought to be protected by this disclosure.

Figure 45:
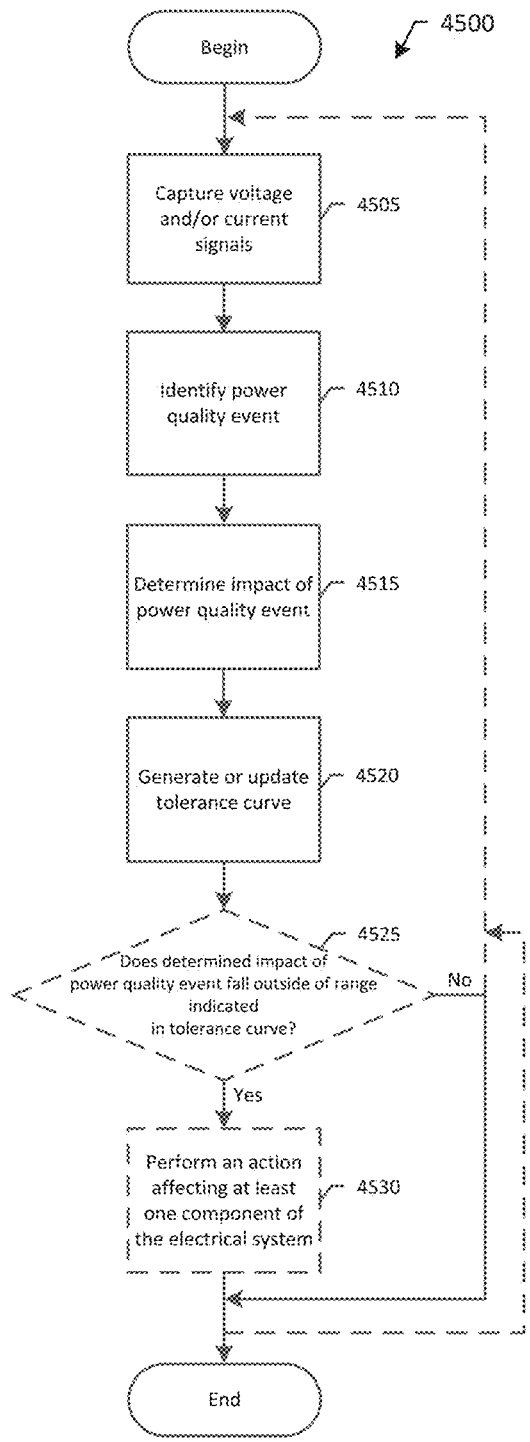
FIG. 45 is a flowchart illustrating an example method for managing power quality events (or disturbances) in an electrical system.

Referring to FIG. 45, a flowchart illustrates an example method 4500 for managing power quality events (or disturbances) in an electrical system that can be implemented, for example, on a processor of an IED (e.g., 121, shown in FIG. 1A) and/or a processor of a control system associated with the electrical system. Method 4500 may also be implemented remote from the IED and/or control system in a gateway, cloud, on-site software, etc.

As illustrated in FIG. 45, the method 4500 begins at block 4505, where voltage and/or current signals (or waveforms) associated with one or more loads (e.g., 111, shown in FIG. 1A) in an electrical system are measured and data is captured, collected, stored, etc. by an IED (and/or control system) coupled to the loads.

At block 4510, electrical measurement data from the voltage and/or current signals is processed to identify at least one power quality event associated with one or more of the loads. In some embodiments, identifying the at least one power quality event may include identifying: (a) a power quality event type of the at least one power quality event, (b) a magnitude of the at least one power quality event, (c) a duration of the at least one power quality event, and/or (d) a location of the at least one power quality event in the electrical system, for example. In embodiments, the power quality event type may include one of a voltage sag, a voltage swell, and a voltage transient.

At block 4515, an impact of the at least one identified power quality event on one or more of the loads is determined. In some embodiments, determining the impact of the at least one identified power quality event includes measuring one or more first parameters (e.g., "pre-event" parameters) associated with the loads at a first time (e.g., a time prior to the event), measuring one or more second parameters (e.g., "post-event" parameters) associated with the loads at a second time (e.g., a time after the event), and comparing the first parameters to the second parameters to determine the impact of the at least one identified power quality event on the loads. In embodiments, the power quality event(s) may be characterized as an impactful event or a non-impactful event based, at least in part, on the determined impact of the event(s). An impactful event may, for example, correspond to an event that interrupts operation (or effectiveness) of the loads and/or the electrical system including the loads. This, in turn, may impact an output of the system, for example, the production, quality, rate, etc. of a product generated by the system. In some embodiments, the product may be a physical/tangible object (e.g., a widget). Additionally, in some embodiments the product may be a non-physical object (e.g., data or information). A non-impactful event, by contrast, may correspond to an event that does not interrupt (or minimally interrupts) operation (or effectiveness) of the loads and/or the electrical system including the loads.

At block 4520, the at least one identified power quality event and the determined impact of the at least one identified power quality event are used to generate or update an existing tolerance curve associated with the one or more of the loads. In embodiments, the tolerance curve characterizes a tolerance level of the loads to certain power quality events. For example, the tolerance curve (e.g., as shown in FIG. 4) may be generated to indicate a "prohibited region", a "no damage region" and a "no interruption in function region" associated with the loads (and/or electrical system), with the respective regions corresponds to various tolerance levels of the loads to certain power quality events. The tolerance curve may be displayed on a graphical user interface (GUI) (e.g., 230, shown in FIG. 1B) of the IED and/or or GUI of the control system, for example. In embodiments where a tolerance curve has already been generated prior to block 4520, for example, due to there being an existing tolerance curve, the existing tolerance curve may be updated to include information derived from the at least one identified power quality event and the determined impact of the at least one identified power quality event. An existing tolerance curve may exist, for example, in embodiments in which a baseline tolerance curve exists or in embodiments in which a tolerance curve has already been generated using method 4500 (e.g., an initial tolerance curve generated in response to a first or initial power quality event). In other words, in embodiments a new tolerance curve is typically not generated after each identified power quality event, but rather each identified power quality event may result in updates being made to an existing tolerance curve.

At block 4525, which is optional in some embodiments, it is determined if the impact of the at least one identified power quality event exceeds a threshold or falls outside of a range or region (e.g., "no interruption in function region") indicated in the tolerance curve. If it is determined that the impact of the at least one identified power quality event falls outside of the range indicated in the tolerance curve (e.g., the event results in an interruption to the function of a load as measured by an electrical parameter or indicated by some external input), the method may proceed to block 4530. Alternatively, if is determined that the impact of the at least one identified power quality event does not fall outside of a range indicated in the tolerance curve (e.g., the event does not result in an interruption in a function of a load), the method may end in some embodiments. In other embodiments, the method may return to block 4505 and repeat again. For example, in embodiments in which it is desirable to continuously (or semi-continuously) capture voltage and/or current signals and to dynamically update the tolerance curve in response to power quality events identified in these captured voltage and/or current signals, the method may return to block 4505. Alternatively, in embodiments in which it is desirable to characterize power quality events identified in a single set of captured voltage and/or current signals, the method may end.

Further, in embodiments the event information may be used to adjust (e.g., expand) the "no interruption in function" region, for example, to generate a custom tolerance curve for the specific IED location (similar to FIG. 2). It is to be appreciated that characterizing the electrical system at certain points is extremely useful to users because they can better understand the behavior of their system.

In some embodiments, the range indicated in the tolerance curve is a predetermined range, for example, a user configured range. In other embodiments, the range is not predetermined. For example, I may choose to have no "no interruption in function" region and say anything deviating from a nominal voltage needs to be evaluated. In this case, the voltage may range all over the place and I may have dozens of power quality events; however, my load may not experience any interruptions. Thus, these events are not considered impactful. In this case, I widen/expand my "no interruption" region from basically the nominal voltage outwards to the point where these events do start to perturbate my loads (based on measured load impact pre-event vs. post event).

In other words, the invention is not limited to the ITIC curve (or any other predetermined range or curve(s)). Rather, embodiments of the invention call for "creating" a custom voltage tolerance curve for a specific location (i.e., where the IED is located) within the electrical system or network. The curve may be based on the ITIC curve, the SEMI curve, or any number of other curves. Additionally, the curve may be a custom curve (i.e., may not be based on a known curve, but rather may be developed without an initial reference or baseline). It is understood that a predetermined tolerance curve is not required for this invention, rather it just used to explain the invention (in connection with this figure, and in connection with figures described above and below).

At block 4530, which is optional is some embodiments, an action affecting at least one component of the electrical system may be automatically performed in response to the determined impact of the at least one identified power quality event being outside of the range indicted in the tolerance curve. For example, in some embodiments a control signal may be generated in response to the determined impact of the at least one identified power quality event being outside of the range, and the control signal may be used to affect the at least one component of the electrical system. In some embodiments, the at least one component of the electrical system corresponds to at least one of the loads monitored by the IED. The control signal may be generated by the IED, a control system, or another device or system associated with the electrical system. As discussed in figures above, in some embodiments the IED may include or correspond to the control system. Additionally, in some embodiments the control system may include the IED.

As another example, an action that may be affected at block 4530 is starting and stopping a timer to quantify a length (or duration) of the impact to production, for example, in a facility with which the impact is associated. This will help a user make better decisions regarding operation of the facility during atypical conditions.

Subsequent to block 4530, the method may end in some embodiments. In other embodiments, the method may return to block 4505 and repeat again (for substantially the same reasons discussed above in connection with block 4525). In some embodiments in which the method ends after block 4530, the method may be initiated again in response to user input and/or a control signal, for example.

Figure 46:
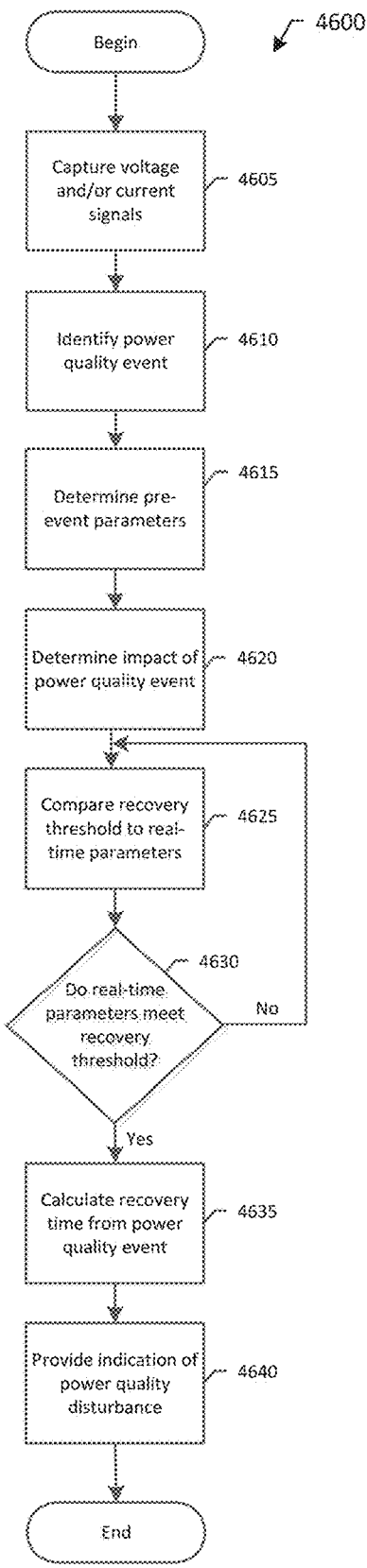
FIG. 46 is a flowchart illustrating an example method for quantifying power quality events (or disturbances) in an electrical system.

Referring to FIG. 46, a flowchart illustrates an example method 4600 for quantifying power quality events (or disturbances) in an electrical system that can be implemented, for example, on a processor of an IED (e.g., 121, shown in FIG. 1A) and/or a processor of a control system. Method 4600 may also be implemented remote from the IED in a gateway, cloud, on-site software, etc. This method 4600 evaluates voltage and/or current signals measured and captured by the IED to determine whether the electrical system was impacted (e.g., at the IED(s) level) using pre-event/post-event power characteristics. In embodiments, it is possible to determine a recovery time using a threshold (e.g., the post-event power is 90% of the pre-event power). This allows us to quantify the impact of a power quality disturbance to a load(s), process(es), system(s), facility(ies), etc.

As illustrated in FIG. 46, the method 4600 begins at block 4605, where voltage and/or current signals (or waveforms) are measured and captured by an IED.

At block 4610, the voltage and/or current signals are processed to identify a power quality event associated with one or more loads (e.g., 111, shown in FIG. 1A) monitored by the IED. In some embodiments, pre-event, event and post-event logged data may also be used to identify the power quality event. The pre-event, event and post-event logged data may, for example, be stored on a memory device associated with the IED and/or gateway, cloud and/or on-site software application.

At block 4615, pre-event parameters are determined from the voltage and/or current signals. In embodiments, the pre-event parameters correspond to substantially any parameters that can be directly measured and/or derived from voltage and current including, but not limited to, power, energy, harmonics, power factor, frequency, event parameters (e.g., time of disturbance, magnitude of disturbance, etc.), etc. In embodiments, pre-event data can also be derived from "statistical norms." Metadata may also be used to help derive additional parameters accordingly.

At block 4620, an impact of the power quality event is determined, measured or calculated. In embodiments, the event impact is calculated based on pre-event vs. post-event parameters. In embodiments, this includes both the characteristics of the event (i.e., magnitude, duration, disturbance type, etc.) and its impact to load(s), process(es), system(s), facility(ies), etc. at the metered point in the system.

At block 4625, recovery thresholds (or conditions) are compared to real-time parameters. In embodiments, the recovery thresholds may correspond to a percent of pre-event conditions to be considered as a system, sub-system, process, and/or load recovery condition. In embodiments, industry standards, market segment recommendations, historical analysis, independently determined variables, and/or load characteristics may be used to provide the recovery thresholds. Additionally, statistical norms may be used to provide the recovery thresholds. In embodiments, the recovery thresholds are configured (e.g., pre-configured) recovery thresholds that are stored on a memory device associated with the IED. An alternative approach is to pass all voltage event information to the cloud or on-site software and then filter it there using recovery thresholds. In this case, the recovery thresholds would be stored in the cloud or on-site and not in the IED.

At block 4630, the IED determines if the real-time parameters meet the recovery thresholds (or conditions). If the IED determines that the real-time parameters meet the recovery thresholds, the method proceeds to block 4635. Alternatively, if the IED determines that the real-time parameters do not meet the recovery thresholds, the method may return to block 4625, and block 4625 may be repeated again. In embodiments, the output here is to determine the recovery time; therefore, it may stay in the loop until the post-event levels meet a predetermined threshold.

At block 4635, the IED calculates a recovery time from the power quality event. In embodiments, the recovery time is calculated from a time associated with the power quality event (e.g., an initial occurrence of the power quality event) until a time the recovery thresholds are met.

At block 4640, an indication of the power quality disturbance (or event) is provided at an output of the IED. In embodiments, the indication may include one or more reports and/or one or more control signals. The report may be generated to include information from any discrete IED of the electrical system including: recovery time, impact on power, costs associated with the event impact, I/O status changes, time of event/time of recovery, changes in voltages/currents, imbalance changes, areas impacted, etc. In embodiments, recovery time and impact may be based on data from one or more IEDs. The reports may be provided to customer, sales teams, offer management, engineering teams, and/or any other interested party, etc. The control signals may be generated to control one or more parameters or characteristics associated with the electrical system. As one example, the control signals may be used to adjust one or more parameters associated with load(s) which the IED is configured to monitor.

At block 4640, the indication of the power quality disturbance (and other data associated with method 4600) may also be stored. In some embodiments, the indication may be stored locally, for example, on a same site as the IED (or on the IED device itself). Additionally, in some embodiments the indication may be stored remotely, for example, in the cloud and/or on-site software. After block 4640, the method 4600 may end.

Figure 47:
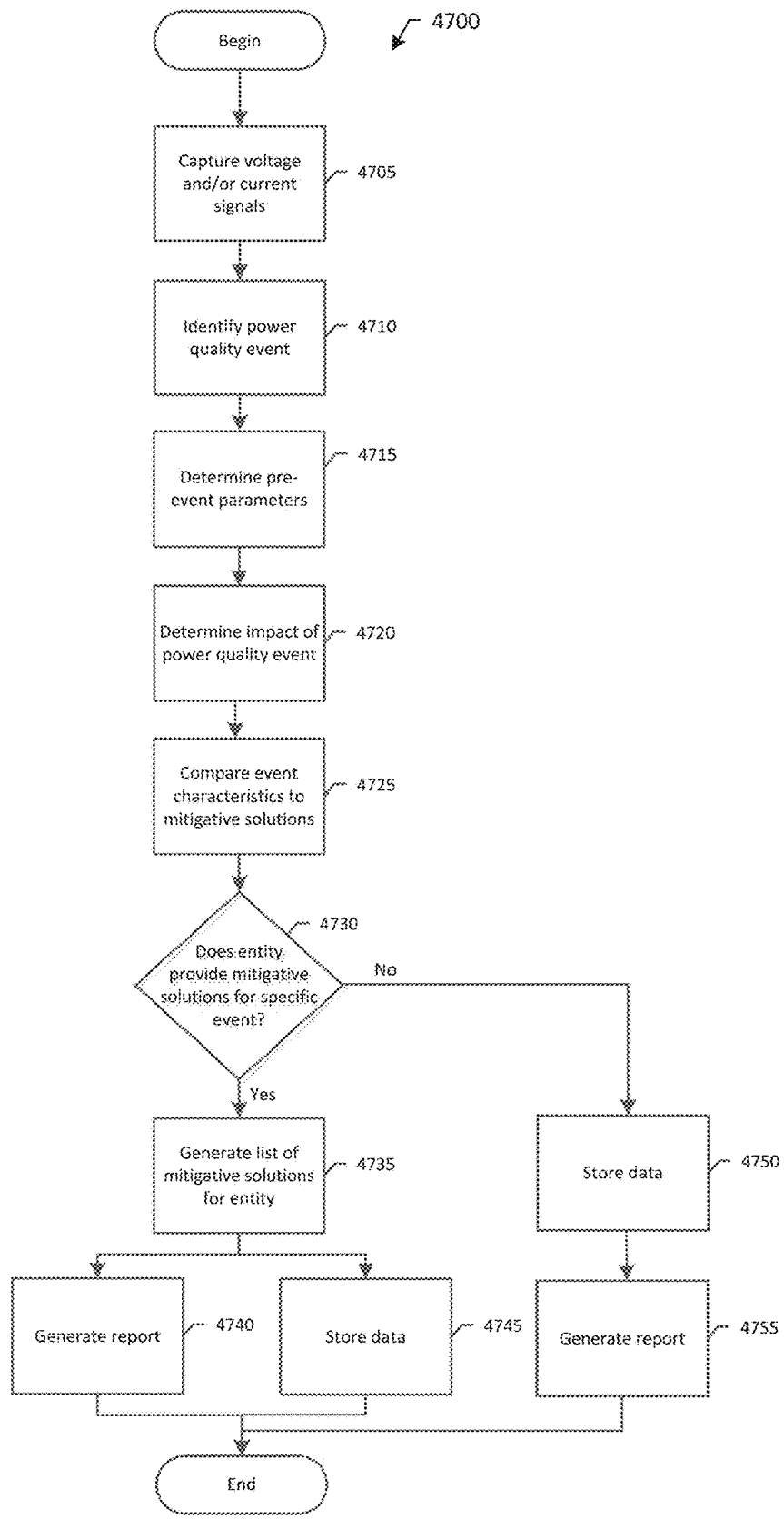
FIG. 47 is a flowchart illustrating an example method for expanded qualified lead generation for power quality.

Referring to FIG. 47, a flowchart illustrates an example method 4700 for expanded qualified lead generation for power quality. Similar to method 4600 described above in connection with FIG. 46, for example, in embodiments method 4700 can be implemented on a processor of an IED and/or a processor of a control system. Method 4700 may also be implemented remote from the IED in a gateway, cloud, on-site software, etc. In embodiments, by evaluating pre-event/post-event power characteristics of power quality events, it is possible to quantify the susceptibility of the electrical system at metered points to power quality disturbances. This information could be used to identify product offerings for mitigative solutions and provide better qualified leads to organizations marketing those solutions. In embodiments, method 4700 may also be used for energy savings opportunities (e.g., power factor correction, increased equipment efficiency, etc.) when a power quality event occurs.

As illustrated in FIG. 47, the method 4700 begins at block 4705, where voltage and/or current signals (or waveforms) are measured and captured by an IED.

At block 4710, the voltage and/or current signals are processed to identify a power quality event associated with one or more loads monitored by the IED. In some embodiments, pre-event, event and post-event logged data may also be used to identify the power quality event. The pre-event, event and post-event logged data may, for example, be stored on a memory device associated with the IED and/or gateway, cloud and/or on-site software application.

At block 4715, pre-event parameters are determined from the voltage and/or current signals. In embodiments, the pre-event parameters correspond to substantially any parameters that can be directly measured and/or derived from voltage and current including, but not limited to, power, energy, harmonics, power factor, frequency, event parameters (e.g., time of disturbance, magnitude of disturbance, etc.), etc. In embodiments, pre-event data can also be derived from "statistical norms." Metadata may also be used to help derive additional parameters accordingly.

At block 4720, an impact of the power quality event is calculated. In embodiments, the event impact is calculated based on pre-event vs. post-event parameters. In embodiments, this includes both the characteristics of the event (i.e., magnitude, duration, disturbance type, etc.) and its impact to load(s), process(es), system(s), facility(ies), etc. at the metered point in the system.

At block 4725, event characteristics are compared to mitigative solutions (e.g., product solutions). In embodiments, there may be a library of design and applications criteria for solutions to mitigate issues associated with a power quality event or disturbance. The library of design and applications criteria for solutions may be stored on a memory device associated with the IED, or accessed by the IED (e.g., remotely, via the cloud). In some embodiments, block 4725 may be performed in the cloud or on-site software. That way the energy consumer is able to see everything from a system level.

At block 4730, the IED determines if a particular entity (e.g., Schneider Electric) provides a mitigative solution for specific event. If the IED determines that the particular entity provides a mitigative solution for the specific event, the method proceeds to a block 4635. Alternatively, if the IED determines that the particular entity does not provide a mitigative solution for the specific event, the method proceeds to a block 4750. In some embodiments, the "IED" may be defined as being in the cloud or on-site (yet remote from the meter). In embodiments, we may want to put the solutions and much of the analysis in the cloud or on-site software because it's easier to update, the energy consumer has easier access to it, and it provides an aggregate system view.

At block 4735, a list of solutions provided by the particular entity is built for the specific event or issue (or type of event or issue). At block 4740, a report is generated and provided to customers, sales teams associated with the particular entity or other appropriate representatives of the entity. In embodiments, the report may include information from any discrete metering device (or as a system) including: recovery time, impact on power, I/O status changes, time of event/time of recovery, changes in voltages/currents, changes in phase balance, processes and/or areas impacted, etc. Report may include information on SE solution (e.g., customer facing literature, features and benefits, technical specifications, cost, etc.), approximate solution size required for given event (or event type), comparisons to external standards, placement, etc. Electrical and/or metering system hierarchy and/or other metadata (e.g., load characteristics, etc.) may be used to assist evaluation.

At block 4745, the report (and other information associated with the method 4700) may be stored. In some embodiments, the report may be stored locally, for example, on a same site as the IED (or on the IED device itself). Additionally, in some embodiments the report may be stored remotely, for example, in the cloud. In embodiment, blocks 4740 and 4745 may be performed substantially simultaneously.

Returning now to block 4730, if it is determined that the particular entity does not provide a mitigative solution for the specified event, the method proceeds to a block 4750. At block 4750, event parameters and/or characteristics (and other information associated with the method 4700) may be stored (e.g., locally and/or in the cloud). At block 4755, a report is generated based, at least in part, on select information stored at block 4750. In embodiments, the report may include an evaluation of energy consumer impacts and needs for potential future solution development, third-party solutions, etc. After block 4755 (or blocks 4740/4745), the method 4700 may end.

Figure 48:
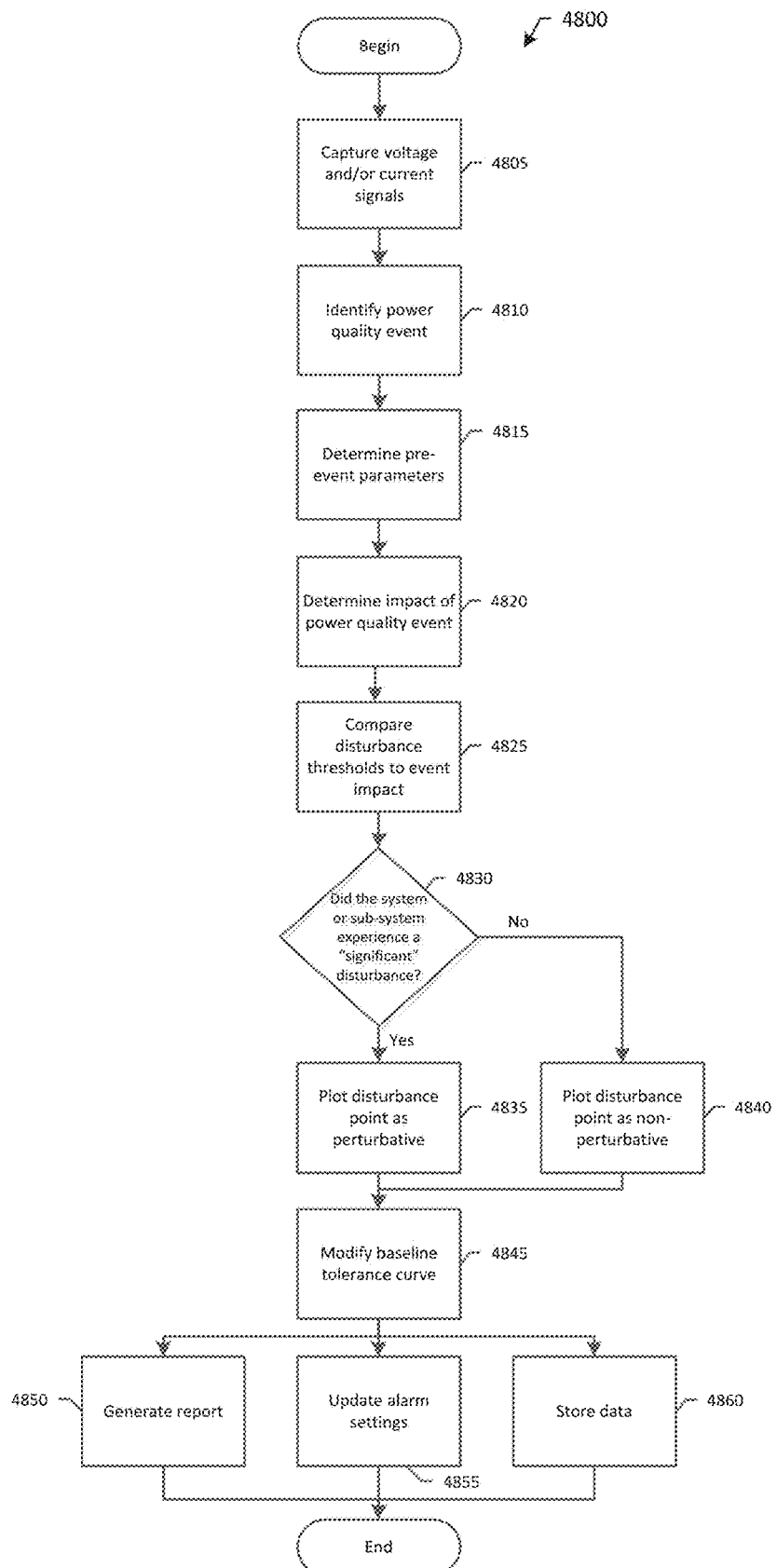
FIG. 48 is a flowchart illustrating an example method for generating a dynamic tolerance curve for power quality.

Referring to FIG. 48, a flowchart illustrates an example method 4800 for dynamic tolerance curve generation for power quality. Similar to methods 4500, 4600 and 4700 described above, in embodiments method 4800 can be implemented on a processor of an IED and/or a processor of a control system. Method 4800 may also be implemented remote from the IED in a gateway, cloud, on-site software, etc. In embodiments, by evaluating pre-event/event/post-event power characteristics of power quality events, it is possible (over time) to automatically develop a custom event tolerance curve for substantially any given energy consumer. This is extremely useful to help energy consumers identify, characterize, analyze and/or desensitize their system to power quality events.

As illustrated in FIG. 48, the method 4800 begins at block 4805, where voltage and/or current signals (or waveforms) are measured and captured by an IED.

At block 4810, the voltage and/or current signals are processed to identify a power quality event associated with one or more loads monitored by the IED. In some embodiments, pre-event, event and post-event logged data may also be used to identify the power quality event. The pre-event, event and post-event logged data may, for example, be stored on a memory device associated with the IED and/or gateway, cloud and/or on-site software application.

At block 4815, pre-event parameters are determined from the voltage and/or current signals. In embodiments, the pre-event parameters correspond to substantially any parameters that can be directly measured and/or derived from voltage and current including, but not limited to, power, energy, harmonics, power factor, frequency, event parameters (e.g., time of disturbance, magnitude of disturbance, etc.), etc. In embodiments, pre-event data can also be derived from "statistical norms." Metadata may also be used to help derive additional parameters accordingly.

At block 4820, an impact of the power quality event is determined. In embodiments, the event impact is calculated based on pre-event vs. post-event parameters. In embodiments, this includes both the characteristics of the event (i.e., magnitude, duration, disturbance type, etc.) and its impact to load(s), process(es), system(s), facility(ies), etc. at the metered point in the system.

At block 4825, disturbance thresholds (or conditions) are compared to the determined impact of the event. In embodiments, the disturbance thresholds may correspond to a percent change between pre-event and post-event conditions to be considered a "significant" system, sub-system, process, and/or load disturbance. For example, a 5% reduction in load due to an electrical (or other) event may be considered "significant." In embodiments, the disturbance thresholds are configured (e.g., pre-configured) disturbance thresholds that are stored on a memory device associated with the IED and/or gateway, cloud and/or on-site software application.

At block 4830, the IED determines if the system, sub-system, process, facility and/or load experienced (or is experiencing) a "significant" disturbance (e.g., based on the comparison at block 4825). If the IED determines that the system, sub-system, process, facility and/or load(s) experienced a "significant" disturbance, the method proceeds to a block 4835. Alternatively, if the IED determines that the system, sub-system, process, facility and/or load(s) has not experienced a "significant" disturbance, the method proceeds to a block 4840.

At block 4835, a disturbance point is generated and plotted as perturbative (e.g., impacting the system, sub-system, process, facility and/or load(s), for example). At block 4845, a baseline tolerance curve (e.g., SEMI-F47, ITIC, CBEMA, etc.) is modified, changed and/or customized) based on characteristics associated with the specific recorded disturbance (here, at block 4835).

Alternatively, at block 4840, in response to the IED determining that the system, sub-system, process, facility and/or load has not experienced a "significant" disturbance, a disturbance point is generated and plotted as non-perturbative (e.g., not impacting the system, sub-system, process, facility and/or load(s), for example). At block 4845, the baseline tolerance curve is modified, changed and/or customized based on the characteristics associated with specific recorded disturbance (here, at block 4840). For example, lines in the curve may be moved between "no interruption region" and "no damage/prohibited region." Alternatively, the lines in the curve may not be moved at all.

At block 4850, a report is generated. In embodiments, the report may include information from substantially any discrete IED (or as a system) including: recovery time, impact on power, I/O status changes, time of event/time of recovery, changes in voltages/currents, imbalance changes, areas and loads impacted, etc. The report may include updated graphs of tolerance curve(s), highlighted changes in curve(s), recommended mitigation solution(s), etc.

At block 4855, which is optional in some embodiments, at least one alarm setting may be updated at discrete metering point(s) to match the new tolerance curve (e.g., generated at block 4845). At block 4860, the new tolerance curve (and other information associated with the method 4800) may be stored (e.g., locally, in a gateway, on-site software, and/or in the cloud). In some embodiments, two or more of blocks 4850, 4855 and 4860 may be performed substantially simultaneously. After blocks 4850, 4855, and 4860, the method 4800 may end.

Figure 49:
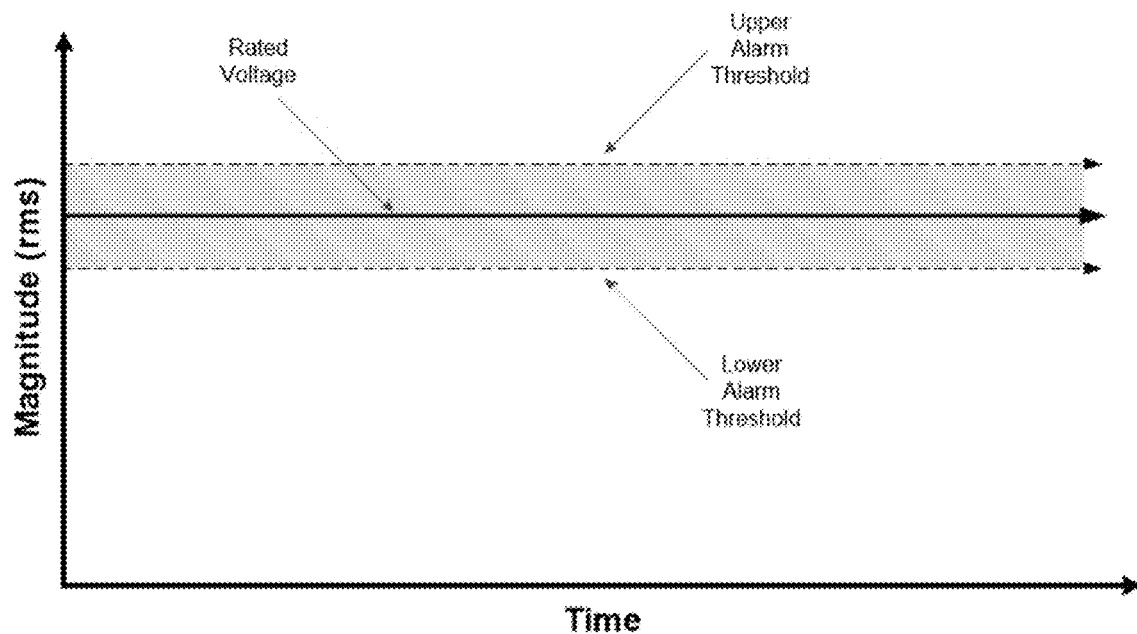
FIG. 49 shows an illustrative waveform.
Figure 50:
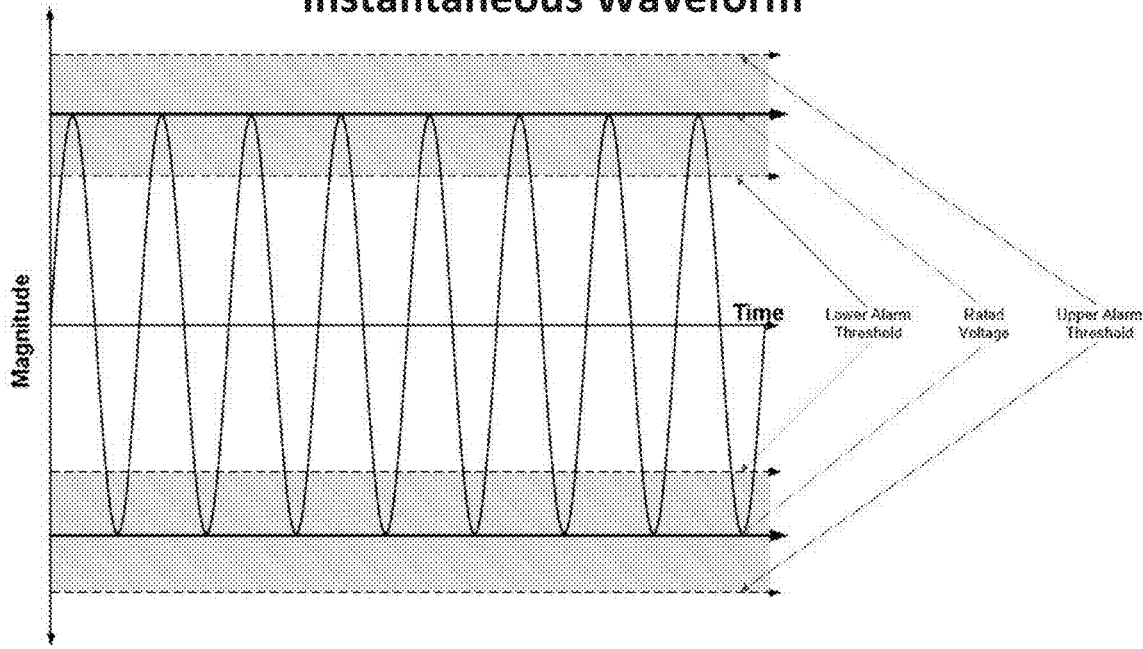
FIG. 50 shows another illustrative waveform.

In general, equipment (e.g., a load or other electrical infrastructure) is designed to have a rated voltage and recommended operational range, as illustrated in FIGS. 49 and 50. The rated voltage is the desired voltage magnitude/level for optimal equipment operation. Additionally, the recommended operational range is the area surrounding the rated voltage (above and below the rated voltage) where the equipment may still successfully operate continuously, although not necessarily optimally (e.g., lower efficiency, additional heating, higher currents, etc.). IED voltage event alarm thresholds (also referred to herein as "alarm thresholds" for simplicity) are typically configured (but not always) to align with the recommended operational range so that excursions beyond the recommended operational range may be measured, captured and stored. This is because a strong correlation exists with excessive voltage excursions and temporary or permanent damage to the equipment experiencing these excursions. Additionally, voltage excursions may lead to operational issues, interruptions, loss of data, and/or any other number of impacts to equipment, processes, and/or operations.

While the "recommended operational range" of loads, processes, and/or systems is typically associated with a voltage magnitude, the duration of these excursions is also an important consideration. For example, a 1-millisecond voltage excursion of +10% outside of the recommended operational range may not adversely impact the operation of a load, process, and/or system, nor impact its expected operational life. Alternatively, a 20-millisecond voltage excursion of +10% outside of the recommended operational range may cause the same load, process, and/or system to experience an interruption and/or reduce its life expectancy (by some extent).

FIGS. 49 and 50 illustrate two representations of the same concept. Namely, FIG. 49 shows a rms waveform and FIG. 50 shows an instantaneous waveform. The rms waveform shown in FIG. 49 is derived from the instantaneous waveform data shown in FIG. 50 using a well-known equation (root-mean-square) calculation. Both waveform representations are useful for analyzing power and energy-related issues and troubleshooting power quality problems. Each respective graphic illustrates an exemplary voltage rating, upper alarm threshold, and lower alarm threshold for a theoretical load, process and/or system. In this case, the recommended operational range (shaded area) is assumed to align with the bounds of the upper and lower alarm thresholds, respectively.

Figure 51:
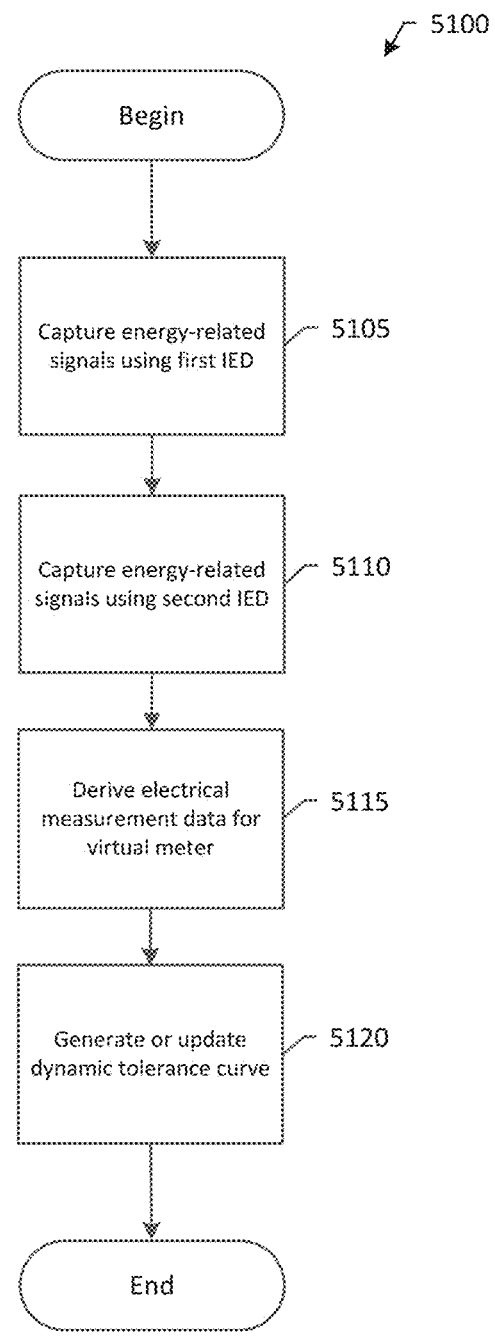
FIG. 51 is a flowchart illustrating an example method for characterizing power quality events in an electrical system.

Referring to FIG. 51, a flowchart illustrates an example method 5100 for characterizing power quality events in an electrical system that can be implemented, for example, on a processor of at least one IED (e.g., 121, shown in FIG. 1A). Method 5100 may also be implemented remote from the at least one IED in a gateway, cloud-based system, on-site software, or another head-end system in some embodiments.

As illustrated in FIG. 51, the method 5100 begins at block 5105, where energy-related signals are measured and data is captured, collected, stored, etc. by at least one first IED of a plurality of IEDs in an electrical system. The at least one first IED is installed at a first metering point (e.g., a physical metering point) in the electrical system (e.g., metering point $M_1$, shown in FIG. 30F).

At block 5110, energy-related signals are measured and data is captured, collected, stored, etc. by at least one second IED of the plurality of IEDs in the electrical system. The at least one second IED is installed at a second metering point (e.g., a physical metering point) in the electrical system (e.g., metering point $M_2$, shown in FIG. 30F).

In some embodiments, the energy-related signals captured by the at least one first IED and the energy-related signals captured by the at least one second IED include at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages.

At block 5115, electrical measurement data for at least one first virtual meter in the electrical system is derived from (a) electrical measurement data from or derived from the energy-related signals captured by the at least one first IED, and (b) electrical measurement data from or derived from the energy-related signals captured by the at least one second IED. In embodiments, the at least one first virtual meter is derived or located at a third metering point in the electrical system (e.g., metering point $V_1$, shown in FIG. 30F). In embodiments, the third metering point (e.g., a virtual metering point) is different from both the first metering point and the second metering point.

In some embodiments, the electrical measurement data for the at least one first virtual meter may be derived based on a known location of the at least one first virtual meter with respect to the at least one first IED and the at least one second IED. For example, as described above in connection with FIGS. 30B-30I, the electrical measurement data for a virtual meter (e.g., the at least one first virtual meter) may be derived based on known locations of, and parent-child relationship(s) between, the virtual meter and other meters (e.g., IEDs) in the electrical system.

At block 5120, the derived electrical measurement data for the at least one first virtual meter is used to generate or update a dynamic tolerance curve associated with the third metering point or location. As discussed in connection with figures above, a dynamic tolerance curve may characterize an impact of a power quality event (or power quality events) in an electrical system. As also discussed in connection with figures above, in some embodiments at least one means for mitigating the impact of the power quality event (or power quality events) may be selected and applied in response to an analysis of the dynamic tolerance curve.

Subsequent to block 5120, the method 5100 may end in some embodiments. In other embodiments, the method 5100 may repeat again, for example, in response to a control signal or user input, or automatically to ensure that the dynamic tolerance curve associated with the third metering point or location is up-to-date.

In some embodiments, the electrical measurement data from or derived from energy-related signals captured by the at least one first IED may also be used to generate or update a dynamic tolerance curve associated with the first metering point. Additionally, in some embodiments the electrical measurement data from or derived from energy-related signals captured by the at least one second IED may also be used to generate or update a dynamic tolerance curve associated with the second metering point.

For example, in some embodiments the electrical measurement data from or derived from the energy-related signals captured by the at least one first IED in the electrical system may be processed to identify a power quality event at the first metering point, and to determine an impact of the identified power quality event at the first metering point. The identified power quality event and the determined impact of the identified power quality event at the first metering point may be used to generate or update the first dynamic tolerance curve associated with the first metering point. In some embodiments, the first dynamic tolerance curve characterizes at least an impact of power quality event(s) on the first metering point.

The at least one first IED may be configured to monitor one or more loads in the electrical system in some embodiments. In these embodiments, the first dynamic tolerance curve may further characterize a response of the one or more loads to the power quality events.

In some embodiments, the at least one second IED may not be configured to capture the power quality event, or the at least one second IED may be incapable of capturing the power quality event. In these embodiments, for example, an impact of the identified power quality event at the second metering point may be determined based on an evaluation of the electrical measurement data from or derived from the energy-related signals captured by the at least one second IED proximate to a time of occurrence of a power quality event identified at the first metering point. The time of occurrence of the identified power quality event at the first metering point may be determined, for example, by processing the electrical measurement data from or derived from the energy-related signals captured by the at least one first IED.

In some embodiments, the identified power quality event and the determined impact of the identified power quality event at the second metering point may be used to generate or update the second dynamic tolerance curve associated with the second metering point. In some embodiments, the second dynamic tolerance curve characterizes at least an impact of power quality event(s) on the second metering point.

The at least one second IED may be configured to monitor one or more loads in the electrical system in some embodiments. In these embodiments, the second dynamic tolerance curve may further characterize a response of the one or more loads to the power quality events.

In the above-described embodiments in which the at least one second IED may not be configured to capture the power quality event, or the at least one second IED may be incapable of capturing the power quality event, at least the determined time of occurrence of the identified power quality event at the first metering point may be communicated from the at least one first IED to at least one of: a cloud-based system, on-site software, a gateway, and another head-end system. The impact of the identified power quality event at the second metering point may be determined on the at least one of: the cloud-based system, the on-site software, the gateway, and the other head-end system in some embodiments.

In some embodiments, communicating the determined time of occurrence from the at least one first IED to the at least one of: the cloud-based system, the on-site software, the gateway, and the other head-end system, includes: producing at least one of a timestamp, alarm, and a trigger indicative of the determined time of occurrence on the at least one first IED; and communicating the at least one of the timestamp, the alarm, and the trigger to the at least one of: the cloud-based system, the on-site software, the gateway, and the other head-end system.

Figure 52:
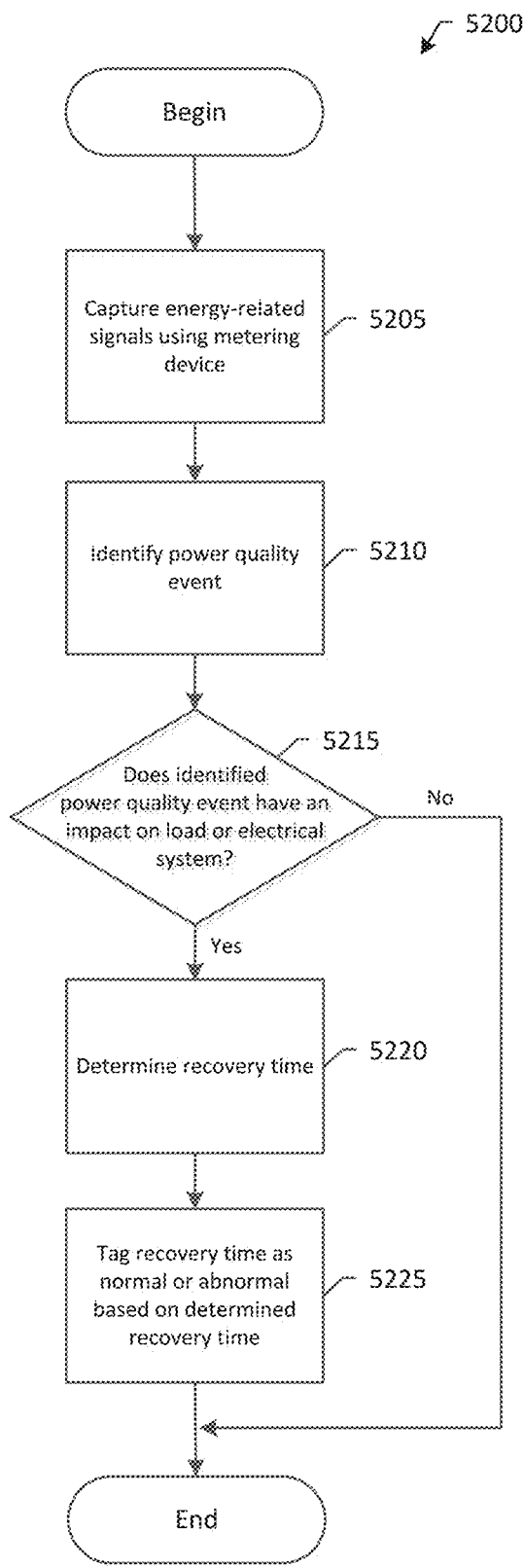
FIG. 52 is a flowchart illustrating an example method for characterizing an impact of a power quality event on an electric system.

Referring to FIG. 52, a flowchart illustrates an example method 5200 for characterizing an impact of a power quality event on an electric system. The method 5200 may be implemented, for example, on a processor of at least one IED (e.g., 121, shown in FIG. 1A) and/or remote from the at least one IED in at least one of: a cloud-based system, on-site software, a gateway, or another head-end system.

As illustrated in FIG. 52, the method 5200 begins at block 5205, where energy-related signals (or waveforms) are measured and data is captured, collected, stored, etc. by at least one metering device in an electrical system. In some embodiments, the at least one metering device includes at least one of an IED and/or a virtual meter. Additionally, in some embodiments the energy-related signals include at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages.

At block 5210, electrical measurement data from or derived from the energy-related signals captured by the at least one metering device at block 5205, is processed to identify a power quality event associated with at least one load (e.g., 111, shown in FIG. 1A) monitored by the at least one metering device. The at least one metering device and the at least one load are installed at respective locations in the electrical system.

At block 5215, it is determined if the identified power quality event has an impact on the at least one load or on the electrical system. If it is determined the identified power quality event has an impact on the at least one load or on the electrical system, the method proceeds to block 5220.

At block 5220, a recovery time for the at least one load or the electrical system to recover from the identified power quality event is determined. Additionally, at block 5225, the data captured, collected, and/or stored during the recovery time is tagged (or otherwise indicated) as atypical or abnormal based on the determined recovery time. In some embodiments, the recovery time is tagged (or otherwise indicated) in a dynamic tolerance curve associated with the at least one load or the electrical system.

Returning briefly now to block 5215, if it is determined the identified power quality event does not have an impact on the at least one load or on the electrical system, the dynamic tolerance curve may be updated and the method may end in some embodiments. Subsequent to block 5225, the method may also end in some embodiments.

In other embodiments, the method may include one or more additional steps. For example, in some embodiments in response to determining that the identified power quality event has an impact on the at least one load or on the electrical system, one or more metrics associated with the electrical measurement data may be compared against local utility rate structures to calculate a total energy-related cost of the identified power quality event, and to identify opportunities for reducing the total energy-related cost. It is understood that in some embodiments the total energy-related cost of the identified power quality event, and the identified opportunities for reducing the total energy-related cost are based on the tagged recovery time data.

Additionally, in some embodiments an economic impact of the identified power quality event may be determined based, at least in part, on one or more metrics associated with the determined recovery time. Example metrics are discussed throughout this disclosure.

Figure 53:
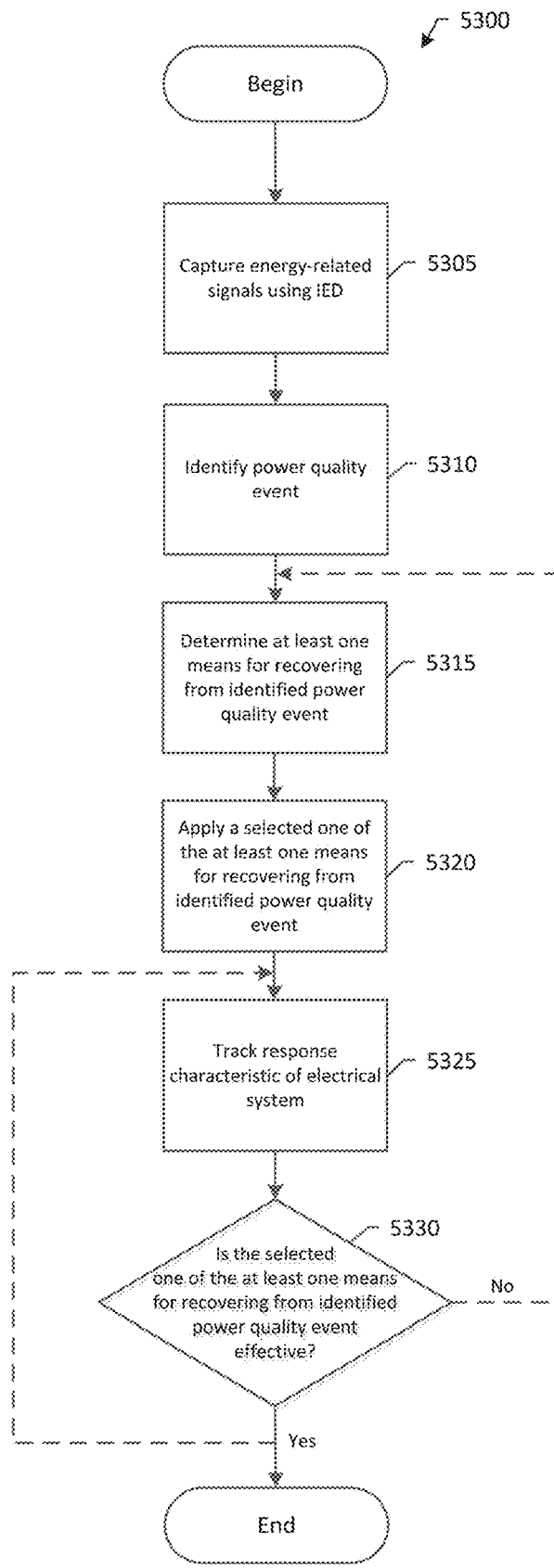
FIG. 53 is a flowchart illustrating an example method for reducing recovery time from a power quality event in an electrical system, for example, by tracking a response characteristic of the electrical system.

Referring to FIG. 53, a flowchart illustrates an example method 5300 for reducing recovery time from a power quality event in an electrical system, for example, by tracking a response characteristic of the electrical system. The method 5300 may be implemented, for example, on a processor of at least one IED (e.g., 121, shown in FIG. 1A) and/or remote from the at least one IED in at least one of: a cloud-based system, on-site software, a gateway, or another head-end system.

As illustrated in FIG. 53, the method 5300 begins at block 5305, where energy-related signals (or waveforms) are measured and data is captured, collected, stored, etc. by at least one IED in an electrical system. In some embodiments, the energy-related signals include at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages.

At block 5310, electrical measurement data from or derived from the energy-related signals captured by the at least one IED at block 5305, is processed to identify a power quality event associated with one or more portions of the electrical system.

At block 5315, at least one means for recovering from the identified power quality event is determined. Additionally, at block 5320 a selected one of the at least one means for recovering from the identified power quality event is applied.

At block 5325, a response characteristic of the electrical system is tracked in response to the selected one of the at least one means for recovering from the identified power quality event being applied. In some embodiments, the response characteristic of the electrical system is tracked with respect to a baseline response of the electrical system. In some embodiments, tracking the response characteristic includes identifying recurring event data. The identified recurring event data may be used, for example, to forecast power quality events in the electrical system.

As discussed above in connection with section VI of this disclosure, entitled "Disaggregation of Typical and Atypical Operational Data Using Recovery Time," it is important to recognize a facility's operation during a recovery period is often aberrant or atypical as compared to non-recovery times (i.e., normal operation). Additionally, it is useful to identify and "tag" (i.e., denote) and differentiate aberrant or atypical operational data from normal operational data (i.e., non-recovery data) for performing calculations, metrics, analytics, statistical evaluations, and so forth. Metering/monitoring systems do not inherently differentiate aberrant operational data from normal operational data. Differentiating and tagging operational data as either aberrant (i.e., due to being in recovery mode) or normal provides several advantages, examples of which are provided in section VI of this disclosure.

At block 5330, the response characteristic of the electrical system is evaluated to determine effectiveness of the selected one of the at least one means for recovering from the identified power quality event. If it is determined that the selected one of the at least one means for recovering from the identified power quality event is not effective, the method may return to block 5315 in some embodiments. Upon returning to block 5315, at least one other means for recovering from the identified power quality event may be determined. Additionally, at block 5320 a selected one of the at least one other means for recovering from the identified power quality event may be applied.

Returning now to block 5330, if it is alternatively determined that the selected one of the at least one means for recovering from the identified power quality event is effective, the method may end in some embodiments. Alternatively, information about the issue and its resolution may be included in and/or appended to a history file, for example. In other embodiments, the method may return to block 5325 (e.g., such that the response characteristic of the electrical system may be further tracked).

As illustrated above, and as will be appreciated by one of ordinary skill in the art, embodiments of the disclosure promote "more and better" metering within facilities. For example, the more IEDs installed in an energy consumer's electrical system, the more beneficial these embodiments may be for the energy consumer. As will also be appreciated by one of ordinary skill in the art, there are significant opportunities for voltage event mitigation products. Further, it will be appreciated by one of ordinary skill in the art that it is important to identify and promote opportunities that would have typically been overlooked, misunderstood, or simply ignored by energy consumers. The ability to quantify voltage events creates a justifiable sense of urgency for the energy consumer to resolve these issues. The various embodiments described in this disclosure should allow services-based organizations to more readily identify opportunities and be retained for designing and installing the most economical solution. By leveraging products to identify opportunities for improving voltage event mitigation and reduced recovery time, for example, energy consumers may improve their operational availability and increase their profitability.

The embodiments described in this disclosure may also create many opportunities for cloud-based services. While the prospect of using on-site software to evaluate, quantify, and mitigate voltage events may be more ideal in some embodiments, direct (or substantially direct) participation/interaction with energy consumers may tend to promote many more services and products sales opportunities. By evaluating the voltage event data in the cloud, active engagement in a timelier manner with relevant information and practical solutions may yield further possibilities.

As illustrated above, voltage sags/dips have a significant impact on industrial equipment, processes, products, and ultimately a customer's bottom-line. In embodiments, voltage sags/dips are the biggest (or close to the biggest) source of power quality issues, and can originate both inside and outside an energy consumer's facility. Using dynamic voltage tolerance curves and the other embodiments described herein will provide the ability to localize, quantify, and rectify the impact of voltage sags/dips and shorten event recovery time. Moreover, dynamic voltage tolerance curves provide the ability to target, design and validate custom mitigative solutions and services, which helps the energy consumer reduce interruptions to their operations, maximize their system performance and availability, increase their equipment life, and reduce their total operating costs. In short, the embodiments disclosed in this application may be incorporated in meters, gateways, on-site software such as PME, and cloud-based offers such as Power Advisor by Schneider Electric.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., power monitoring system applications) but rather, may be useful in substantially any application where it is desired to manage power quality events in an electrical system. While particular embodiments and applications of the present disclosure have been illustrated and described, it is to be understood that embodiments of the disclosure not limited to the precise construction and compositions disclosed herein and that various modifications, changes, and variations can be apparent from the foregoing descriptions without departing from the spirit and scope of the disclosure as defined in the appended claims.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

Accordingly, it is submitted that that scope of the patent should not be limited to the described embodiments but rather should be limited only by the spirit and scope of the following claims.

What is claimed is:

1. A method for characterizing an impact of a power quality event on an electrical system, comprising:
   processing electrical measurement data from or derived from energy-related signals captured by at least one metering device to identify a power quality event associated with at least one load monitored by the at least one metering device, wherein the at least one metering device and the at least one load are installed at respective locations in the electrical system;
   determining if the identified power quality event has an impact on the at least one load or on the electrical system;

in response to determining that the identified power quality event has an impact on the at least one load or on the electrical system, determining a recovery time for the at least one load or the electrical system to recover from the identified power quality event, and tagging the recovery time as normal, or atypical, abnormal or event-related, based on the determined recovery time;

determining a mitigation solution for mitigating or eliminating the impact, wherein the mitigation solution is determined using the tagging of the recovery time; and identifying a probable reduction in at least one of the impact, the recovery time, recovery energy, $CO_2$ emissions related to the recovery energy, and event-related costs associated with the mitigation solution based on an expected ride-through characteristic of the mitigation solution.

2. The method of claim 1, wherein the energy-related signals include at least one of: voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages.

3. The method of claim 1, further comprising:
in response to determining that the identified power quality event has an impact on the at least one load or on the electrical system, comparing one or more metrics associated with the electrical measurement data against local utility rate structures to calculate a total energy-related cost of the identified power quality event, and to identify opportunities for reducing the total energy-related cost.

4. The method of claim 1, further comprising:
determining an economic impact of the identified power quality event based, at least in part, on one or more metrics associated with the determined recovery time.

5. The method of claim 1, wherein the at least one metering device includes at least one of an intelligent electronic device (IED) and a virtual meter.

6. The method of claim 1, further comprising:
determining at least one recovery solution for recovering from the identified power quality event;
applying a selected one of the at least one recovery solution; and
tracking a response characteristic of the electrical system in response to the selected one of the at least one recovery solution being applied.

7. The method of claim 6, further comprising:
evaluating the response characteristic of the electrical system to determine effectiveness of the selected one of the at least one recovery solution from the identified power quality event.

8. The method of claim 6, wherein tracking a response characteristic of the electrical system in response to the selected one of the at least one recovery solution being applied, includes:
tracking the response characteristic of the electrical system with respect to a baseline response of the electrical system in response to the selected one of the at least one recovery solution being applied.

9. The method of claim 8, wherein tracking the response characteristic includes identifying recurring event data.

10. The method of claim 9, wherein the identified recurring event data is used to forecast power quality events in the electrical system.

11. The method of claim 8, wherein tracking the response characteristic of the electrical system with respect to a baseline response of the electrical system includes identifying, tagging and differentiating aberrant or atypical operational data from normal operational data for performing at least one of: calculations, metrics, analytics, and statistical evaluations.

12. The method of claim 11, wherein the normal operational data corresponds to non-recovery data, and the operational data transpiring during a determined recovery period is differentiated and tagged as aberrant or atypical operational data.

13. A system for characterizing an impact of a power quality event on an electrical system, comprising:
at least one processor;
at least one memory device coupled to the at least one processor, the at least one processor and the at least one memory device configured to:
process electrical measurement data from or derived from energy-related signals captured by at least one metering device to identify a power quality event associated with at least one load monitored by the at least one metering device, wherein the at least one metering device and the at least one load are installed at respective locations in the electrical system;
determine if the identified power quality event has an impact on the at least one load or on the electrical system;
in response to determining that the identified power quality event has an impact on the at least one load or on the electrical system, determine a recovery time for the at least one load or the electrical system to recover from the identified power quality event, and tag the recovery time as normal, or atypical, abnormal or event-related, based on the determined recovery time;
determine a mitigation solution for mitigating or eliminating the impact, wherein the mitigation solution is determined using the tagging of the recovery time; and
identify a probable reduction in at least one of the impact, the recovery time, recovery energy, $CO_2$ emissions related to the recovery energy, and event-related costs associated with the mitigation solution based on an expected ride-through characteristic of the mitigation solution.

14. The system of claim 13, wherein the energy-related signals include at least one of:
voltage, current, energy, active power, apparent power, reactive power, harmonic voltages, harmonic currents, total voltage harmonic distortion, total current harmonic distortion, harmonic power, individual phase currents, three-phase currents, phase voltages, and line voltages.

15. The system of claim 13, wherein the at least one processor and the at least one memory device are further configured to:
in response to determining that the identified power quality event has an impact on the at least one load or on the electrical system, compare one or more metrics associated with the electrical measurement data against local utility rate structures to calculate a total energy-related cost of the identified power quality event, and to identify opportunities for reducing the total energy-related cost.

16. The system of claim 13, wherein the at least one processor and the at least one memory device are further configured to:

determine an economic impact of the identified power quality event based, at least in part, on one or more metrics associated with the determined recovery time.

17. The system of claim 13, wherein the at least one metering device includes at least one of an intelligent electronic device (IED) and a virtual meter.

18. The system of claim 13, wherein the at least one processor and the at least one memory device are further configured to:
determine at least one recovery solution for recovering from the identified power quality event;
apply a selected one of the at least one recovery solution; and
track a response characteristic of the electrical system in response to the selected one of the at least one recovery solution being applied.

19. The system of claim 18, wherein the at least one processor and the at least one memory device are further configured to:
evaluate the response characteristic of the electrical system to determine effectiveness of the selected one of the at least one recovery solution from the identified power quality event.

20. The system of claim 18, wherein tracking a response characteristic of the electrical system in response to the selected one of the at least one recovery solution being applied, includes:
tracking the response characteristic of the electrical system with respect to a baseline response of the electrical system in response to the selected one of the at least one recovery solution being applied.

21. The system of claim 20, wherein tracking the response characteristic includes identifying recurring event data.

22. The system of claim 21, wherein the identified recurring event data is used to forecast power quality events in the electrical system.

23. The system of claim 20, wherein tracking the response characteristic of the electrical system with respect to a baseline response of the electrical system includes identifying, tagging and differentiating aberrant or atypical operational data from normal operational data for performing at least one of: calculations, metrics, analytics, and statistical evaluations.

24. The system of claim 23, wherein the normal operational data corresponds to non-recovery data, and the operational data transpiring during a determined recovery period is differentiated and tagged as aberrant or atypical operational data.

25. A method for characterizing an impact of a power quality event on an electrical system, comprising:
processing electrical measurement data from or derived from energy-related signals captured by at least one metering device to identify a power quality event associated with at least one load monitored by the at least one metering device, wherein the at least one metering device and the at least one load are installed at respective locations in the electrical system;
determining if the identified power quality event has an impact on the at least one load or on the electrical system;
in response to determining that the identified power quality event has an impact on the at least one load or on the electrical system, determining a recovery time for the at least one load or the electrical system to recover from the identified power quality event, and tagging the recovery time as normal, or atypical, abnormal or event-related, based on the determined recovery time;
determining a mitigation solution for mitigating or eliminating the impact, wherein the mitigation solution is determined using the tagging of the recovery time; and
identifying a probable reduction in CO2 emissions related to the recovery energy based on an expected ride-through characteristic of the mitigation solution.

26. A system for characterizing an impact of a power quality event on an electrical system, comprising:
at least one processor;
at least one memory device coupled to the at least one processor, the at least one processor and the at least one memory device configured to:
process electrical measurement data from or derived from energy-related signals captured by at least one metering device to identify a power quality event associated with at least one load monitored by the at least one metering device, wherein the at least one metering device and the at least one load are installed at respective locations in the electrical system;
determine if the identified power quality event has an impact on the at least one load or on the electrical system;
in response to determining that the identified power quality event has an impact on the at least one load or on the electrical system, determine a recovery time for the at least one load or the electrical system to recover from the identified power quality event, and tag the recovery time as normal, or atypical, abnormal or event-related, based on the determined recovery time;
determine a mitigation solution for mitigating or eliminating the impact, wherein the mitigation solution is determined using the tagging of the recovery time; and
identify a probable reduction in CO2 emissions related to the recovery energy based on an expected ride-through characteristic of the mitigation solution.

* * * * *